US011075100B2

(12) United States Patent
Woo et al.

(10) Patent No.: US 11,075,100 B2
(45) Date of Patent: Jul. 27, 2021

(54) CONTAINER FOR STORING WAFER

(71) Applicants: PICO & TERA CO., LTD., Suwon (KR); Bum Je Woo, Seongnam (KR)

(72) Inventors: Bum Je Woo, Seongnam (KR); Seok Mun Yoon, Suwon (KR); Jang Heo, Suwon (KR); Young Chul Kim, Yongin (KR)

(73) Assignees: Bum Je Woo, Seongnam (KR); PICO & TERA CO., LTD., Suwon (KR)

( * ) Notice: Subject to any disclaimer, the term of this patent is extended or adjusted under 35 U.S.C. 154(b) by 77 days.

(21) Appl. No.: 16/314,837

(22) PCT Filed: Jun. 26, 2017

(86) PCT No.: PCT/KR2017/006703
§ 371 (c)(1),
(2) Date: Jan. 2, 2019

(87) PCT Pub. No.: WO2018/008879
PCT Pub. Date: Jan. 11, 2018

(65) Prior Publication Data
US 2019/0311929 A1     Oct. 10, 2019

(30) Foreign Application Priority Data
Jul. 6, 2016   (KR) .................... 10-2016-0085649

(51) Int. Cl.
*H01L 21/67*     (2006.01)
*H01L 21/673*    (2006.01)
*H01L 21/02*     (2006.01)

(52) U.S. Cl.
CPC ........ *H01L 21/67393* (2013.01); *H01L 21/02* (2013.01); *H01L 21/67* (2013.01); *H01L 21/673* (2013.01); *H01L 21/6732* (2013.01)

(58) Field of Classification Search
CPC ........... H01L 21/67393; H01L 21/6732; H01L 21/67017; H01L 21/67389; H01L 21/02049; Y10S 414/137–139
See application file for complete search history.

(56) References Cited

U.S. PATENT DOCUMENTS 8,002,895 B2 * 8/2011 Inoue ............... C23C 16/45578
                                                   118/715
9,666,454 B2 * 5/2017 Choi .................. H01L 21/6732
(Continued)

FOREIGN PATENT DOCUMENTS

CN    100341111 C    10/2007
JP    2006-080458 A   3/2006
(Continued)

OTHER PUBLICATIONS

International Search Report for PCT/KR2017/006703 filed on Jun. 26, 2017.

*Primary Examiner* — Mollie Impink

(57) ABSTRACT

The present invention relates to a container for storing a wafer, particularly to a container for storing a wafer in which a plurality of purging areas is vertically partitioned in the interior of a storage chamber, and a purge gas is sprayed into the plurality of purging areas, thereby allowing not only uniform purging of the wafer to be assured but also efficient purging of the wafer without waste of the purge gas to be achieved.

3 Claims, 34 Drawing Sheets

(56) References Cited

U.S. PATENT DOCUMENTS

| | | | |
|---|---|---|---|
| 2006/0196422 A1* | 9/2006 | Hiroki | H01L 21/67126 118/719 |
| 2015/0206780 A1* | 7/2015 | Choi | H01L 21/67017 206/710 |
| 2016/0118282 A1* | 4/2016 | Maraschin | H01L 21/67393 414/222.07 |
| 2017/0213752 A1* | 7/2017 | Ogawa | H01L 21/67386 |

FOREIGN PATENT DOCUMENTS

| | | |
|---|---|---|
| KR | 10-2008-0054354 A | 6/2008 |
| KR | 10-2014-0091909 A | 7/2014 |
| KR | 10-2015-0045083 A | 4/2015 |
| KR | 10-2015-0087154 A | 7/2015 |
| KR | 10-2015-0087703 A | 7/2015 |

* cited by examiner

CONTAINER FOR STORING WAFER

CROSS-REFERENCE TO RELATED APPLICATIONS

The present application is a U.S. National Stage of International Patent Application No. PCT/KR2017/006703 filed Jun. 26, 2017, which claims priority to and the benefit of Korean Patent Application No. 10-2016-0085649 filed in the Korean Intellectual Property Office on Jul. 6, 2016, the entire contents of which are incorporated herein by reference.

TECHNICAL FIELD

The present invention relates generally to a container for storing a wafer. More particularly, the present invention relates to a container for storing a wafer, in which purge gas is supplied to a wafer stored in a storage chamber to remove fumes of the wafer.

BACKGROUND ART

Generally, semiconductor devices are manufactured by selectively and repeatedly performing processes such as a deposition process, a polishing process, a photolithography process, an etching process, an ion implantation process, a cleaning process, an inspection process, a heat treatment process, and the like; and the wafers are transported to a specific locations required in each process in order to be formed as semiconductor devices.

A wafer is a high-precision article that is stored or transported in a wafer storage container such as a front opening unified pod (FOUP) to prevent contamination or damage from external contaminants and shocks.

In this case, process gas used during the processing and fumes as byproducts in the processes, are not removed, but remain on the surfaces of the wafers. As a result, contamination of semiconductor manufacturing equipment during the process may occur, or the reliability of the wafer may be deteriorated due to a poor etch pattern of the wafer, or the like.

Recently, to solve the above problem, purging techniques have been developed to supply purge gas to the wafer accommodated in the container for storing a wafer in order to remove residual fumes on the wafer surface, or in order to prevent oxidation of the wafer.

To achieve purging of a wafer accommodated in a container for storing a wafer, the container for storing a wafer is coupled to a supply device such as a load port capable of supplying purge gas, and supplies purge gas to the wafer accommodated in the container for storing a wafer. Accordingly, the container for storing a wafer is provided with a flow path where purge gas supplied from the supply device flows, and an injection hole where the purge gas is injected.

As described above, a container for storing a wafer capable of supplying purge gas is disclosed in the document of Korean Patent Application Publication No. 2015-0087015 (hereinafter, referred to as 'conventional art').

The wafer cassette of the conventional art includes: a plurality of stacking units configured to support a wafer and inject purge gas into a storage chamber; and an intake hole communicating with an exhaust member to exhaust the purge gas and fumes of the wafer cassette.

Further, each of the plurality of stacking units is provided with a purge gas flow path in which purge gas flows, and a purge gas discharge hole communicating with the purge gas flow path. Accordingly, the purge gas is supplied from a purge gas supply source, then flows into the stacking units through a side gas line communicating with the purge gas flow paths, and is injected into the storage chamber through the purge gas discharge holes.

However, since the wafer cassette of the conventional art is configured such that one side gas line communicates with the purge gas flow paths provided in the plurality of stacking units, it is impossible to individually control the purge gas injected from each of the plurality of stacking units. Accordingly, even in the case where wafers are accommodated in a part of the storage chamber (for example, the case where wafers are stacked in the stacking units disposed at the lower portion of the storage chamber), purge gas is injected also into middle and upper portions where wafers are not accommodated, and thus, unnecessary waste of purge gas may occur.

DISCLOSURE

Technical Problem

Accordingly, the present invention has been made keeping in mind the above problems occurring in the prior art, and it is a first object of the present invention to provide a container for storing a wafer, in which uniform purging of the wafer is ensured and the waste of purge gas is minimized.

Further, it is a second object of the present invention to provide a container for storing a wafer, in which purge gas injected into a plurality of purging areas partitioned in a vertical direction of the storage chamber is individually controlled and injected, whereby independent purging of wafers can be achieved.

Further, it is a third object of the present invention to provide a container for storing a wafer, in which concave portions are provided in a plurality of supports provided in the storage chamber in the vertical direction, whereby when the wafer is put in and taken out from the storage chamber through the front opening, it is possible to prevent a robot arm transporting the wafer from being hindered.

Further, it is a fourth object of the present invention to provide a container for storing a wafer, in which when the wafer is supported on the support, a gap formed between the support and the wafer is minimized, whereby vertical flow of the purge gas injected into the storage chamber is minimized, and thus, individual injection of purge gas into a plurality of purging areas partitioned within the storage chamber can be performed more efficiently.

Further, it is a fifth object of the present invention to provide a container for storing a wafer, in which front exhaust members are provided on opposite sides of the front of the storage chamber, whereby external gas is prevented from entering the storage chamber, and thus, it is possible to achieve purging of wafer in the storage chamber more efficiently.

Technical Solution

According to one aspect of the present invention, a container for storing a wafer, the container includes: a storage chamber configured such that a wafer is stored therein through a front opening; a plurality of injection members configured to inject purge gas into the storage chamber; and an exhaust member configured to exhaust the purge gas and fumes of the storage chamber, wherein the storage chamber is divisible into a plurality of purging areas in a vertical direction, and the injection members injecting the purge gas into the respective purging areas are individually supplied with the purge gas and inject the purge gas into the respective purging areas.

Further, each of the plurality of injection members may be provided with an injection member inner wall surface in contact with the storage chamber, and the injection member inner wall surface may be formed with an injection hole to allow the purge gas to be injected into the storage chamber.

Further, the plurality of injection members may be arranged on top of another in the vertical direction to correspond to the plurality of purging areas divided vertically.

Further, the container may further include: a supply member configured to supply the purge gas to the plurality of injection members, wherein the supply member is provided with a plurality of vertical supply paths extending in vertical directions, and the plurality of vertical supply paths communicates with the plurality of injection members, respectively.

Further, the exhaust member may be provided with an exhaust member inner wall surface in contact with the storage chamber, and the exhaust member inner wall surface may be formed with an exhaust hole to allow the purge gas and the fumes of the storage chamber to be exhausted to the exhaust member.

Further, the exhaust member may be provided with a plurality of exhaust spaces communicating with the exhaust hole, and a plurality of vertical exhaust paths communicating with the plurality of exhaust spaces, respectively, wherein the plurality of exhaust spaces is arranged on top of another in the vertical direction within the exhaust member to correspond to the plurality of purging areas divided vertically.

Advantageous Effects

The container for storing a wafer according to the present invention configured as described above has the following advantageous effects.

Since a sufficient amount of purge gas can be injected even into wafers accommodated at the upper portion of the storage chamber, it is possible to uniformly purge a plurality of wafers accommodated in the storage chamber, and thus, reliability of wafer manufacturing process can be guaranteed.

Further, since purging of the wafer can be achieved by selectively injecting purge gas only into the area of the plurality of purging areas, where wafers are positioned, unnecessary waste of purge gas can be prevented.

MODE FOR INVENTION

Figure 1:
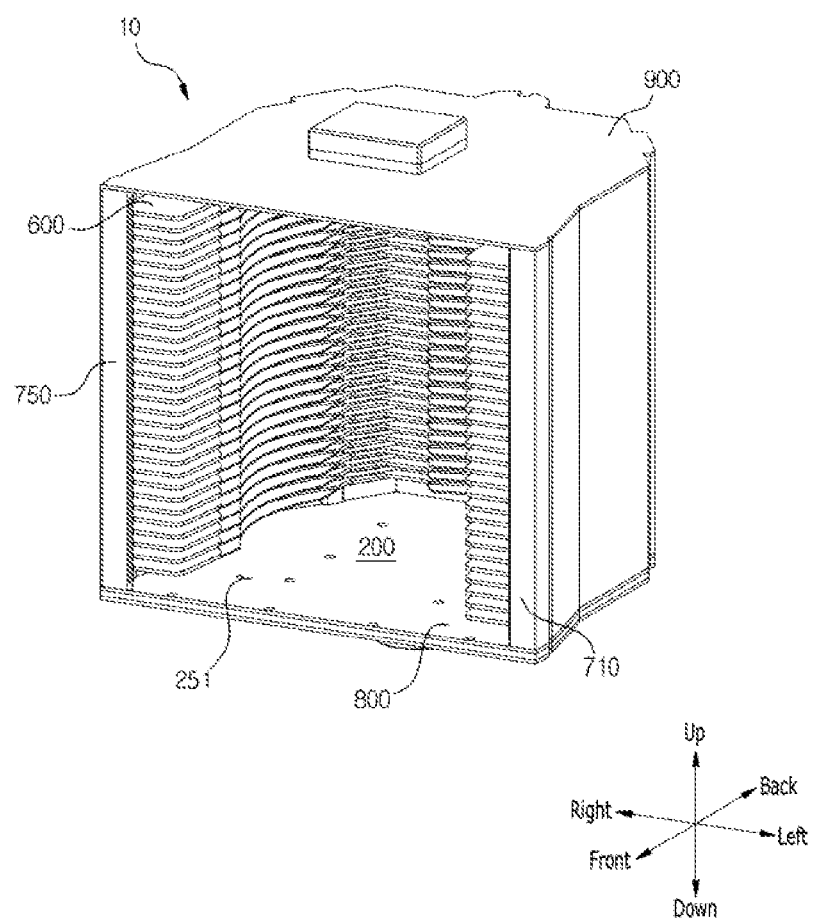
FIG. 1 is a perspective view showing a container for storing a wafer according to a preferred embodiment of the present invention.

'Purge gas' referred to below is a term collectively referring to an inert gas for removing fumes of a wafer, and in particular, may be a nitrogen (N2) gas which is one of the inert gases.

Further, 'purging' is a term collectively referring to the prevention of oxidation of a wafer by injecting purge gas to the wafer to remove residual fumes on the wafer surface.

A container for storing a wafer according to the preferred embodiment of the present invention includes: a storage chamber configured such that a wafer is stored therein through a front opening; a plurality of injection members configured to inject purge gas into the storage chamber; an exhaust member configured to exhaust the purge gas and fumes of the storage chamber; and a supply member configured to supply the purge gas to the plurality of injection members.

The front opening is formed at the front of the storage chamber, and the wafer is put in and taken out from the storage chamber through the front opening.

The storage chamber is provided therein with a support for supporting the wafer, and the wafer is stored in the support by being supported by the support, whereby the wafer stored through the front opening can be easily accommodated therein.

The plurality of injection members injects the purge gas into the storage where the wafer stored, the exhaust member exhausts the purge gas injected into the storage by the plurality of injection members and fumes of the storage chamber, and the supply member supplies the purge gas introduced from outside the container for storing a wafer to the plurality of injection members.

The storage chamber is divisible into a plurality of purging areas in a vertical direction. In this case, the purging areas mean the areas where each of the plurality of injection members is individually supplied with the purge gas and injects the purge gas into the storage chamber, thereby performing purging of the wafer.

The number of purging areas may be varied depending on the use and size of the container for storing a wafer within the scope of achieving the object of the present invention.

Since the transfer of wafers to each process is often performed in a unit of 10 wafers in each wafer manufacturing process, it is preferable that purging of 10 wafers is achieved in one purging area, and the number of wafers stored in the container for storing a wafer is generally 30.

Accordingly, when 30 wafers W are stored in the container for storing a wafer, the purging area within the storage chamber may be, for example, may be divided into three purging areas.

In this case, it is preferable that the container for storing a wafer is provided with three injection members, that is, first to third injection members such that first to third purging areas are formed, and hereinafter, description will be made on the basis thereof.

As described above, when the first to third injection members are provided to be individually supplied with purge gas and to inject the purge gas into the storage chamber, the storage chamber is divisible into the first to third purging areas. In this case, the first injection member injects the purge gas into the first purging area, the second injection member injects the purge gas into the second purging area, and the third injection member injects the purge gas into the third purging area, wherein the first to third purging areas are divided in the vertical direction within the storage chamber.

As such, to achieve the first to third purging areas divided in the vertical direction within the storage chamber when the first to third injection members are individually supplied with the purge gas and inject the purge gas into the storage chamber, each of the first to third injection members may be formed with an injection hole having a vertical position corresponding to each of the first to third purging areas.

For example, when the first to third purging areas are configured such that the first purging area, the second purging area, and the third purging area are formed in the order from bottom to top within the storage chamber (that is, the first purging area is the lower area of the storage chamber, the second purging area is the middle area of the storage chamber, and the third purging are is the upper area of the storage chamber), the injection hole formed in the first injection member may be formed at a position corresponding to the height of the first purging area (the lower area). Accordingly, the first injection member is individually supplied with the purge gas and can inject the purge gas only into the first purging area, which is the lower area of the storage chamber.

Further, the injection hole formed in the second injection member may be formed at a position corresponding to the height of the second purging area (the middle area), and thus, the second injection member is individually supplied with the purge gas and can inject the purge gas only into the second purging area, which is the middle area of the storage chamber.

Further, the injection hole formed in the third injection member may be formed at a position corresponding to the height of the third purging area (the upper area), and thus, the third injection member is individually supplied with the purge gas and can inject the purge gas only into the third purging area, which is the middle area of the storage chamber.

As such, in the case of the container for storing a wafer of the present invention, as the first to third injection members are individually supplied with the purge gas and inject the same into the storage chamber, the first to third purging areas, which are divided in the vertical direction within the storage chamber, are formed.

Accordingly, the purge gas flow flowing into each of the first to third purging areas is individually performed, and thus, unlike the conventional art, the purge gas flowing into the third purging area, which is the upper area of the storage chamber, does not have to flow into the first purging area or the second purging area, so there is no loss of purge gas flow.

Accordingly, in the case of the container for storing a wafer of the present invention, unlike the conventional art, a sufficient amount of purge gas can be injected into the third purging area, which is the upper area of the storage chamber.

Further, as the purge gas supply to the first to third injection members is controlled by individually supplying the purge gas to the first to third injection members, the purge gas injected into the first to third purging areas of the storage chamber can be controlled, and thus, the purge gas can be injected only into the area, where the wafer is stored, of the first to third purging areas. Accordingly, it is possible to prevent the waste of the purge gas occurring when spraying the purge gas in the region where the wafer is not stored in the conventional art, and by removing the fumes of the wafer by injecting purge gas into the wafer in accordance with the waiting time of the wafer stored in the storage chamber, it is possible to minimize the occurrence of wafer defects caused by the failure to remove the fumes of some wafers.

As a configuration different from that in the above, to achieve the first to third purging areas divided in the vertical direction within the storage chamber when the first to third injection members are individually supplied with the purge gas and inject the purge gas into the storage chamber, the first to third injection members may be arranged on top of each other in the vertical direction to correspond to the vertically divided first to third purging areas.

For example, when the first to third purging areas are configured such that the first purging area, the second purging area, and the third purging area are formed in the order from bottom to top within the storage chamber (that is, the first purging area is the lower area of the storage chamber, the second purging area is the middle area of the storage chamber, and the third purging are is the upper area of the storage chamber), the first to third injection members may also be arranged such that the first injection member, the second injection member, and the third injection member are disposed on top of each other in the vertical direction. In this case, each of the first to third injection members may be provided with an injection member inner wall surface in contact with the storage chamber, and the injection member inner wall surface may be formed with an injection hole to allow the purge gas to be injected into the storage chamber.

Accordingly, the first injection member is individually supplied with the purge gas and can inject the purge gas only into the first purging area through the injection hole formed in the injection member inner wall surface provided in the first injection member.

Further, the second injection member is individually supplied with the purge gas and can inject the purge gas only into the second purging area through the injection hole formed in the injection member inner wall surface provided in the second injection member, and the third injection member is individually supplied with the purge gas and can also inject the purge gas only into the third purging area through the injection hole formed in the injection member inner wall surface provided in the third injection member.

As such, when the first to third injection members are arranged on top of each other in the vertical direction to inject purge gas into the first to third purging areas, respectively, each of the first to third injection members may be divided into a plurality of injection members that inject the purge gas in multiple directions into each of the first to third purging areas.

For example, the first injection member that injects the purge gas into the first purging area may include: a 1st-1st injection member injecting the purge gas into the front left of the first purging area; a 1st-2nd injection member injecting the purge gas into the rear left of the first purging area; a 1st-3rd injection member injecting the purge gas into the front right of the first purging area; and a 1st-4th injection member injecting the purge gas into the rear right of the first purging area.

The second injection member that injects the purge gas into the second purging area, as in the first injection member, may also include: a 2nd-1st injection member injecting the purge gas into the front left of the second purging area; a 2nd-2nd injection member injecting the purge gas into the rear left of the second purging area; a 2nd-3rd injection member injecting the purge gas into the front right of the second purging area; and a 2nd-4th injection member injecting the purge gas into the rear right of the second purging area.

The third injection member that injects the purge gas into the third purging area, as in the first injection member, may also include: a 3rd-1st injection member injecting the purge gas into the front left of the third purging area; a 3rd-2nd injection member injecting the purge gas into the rear left of the third purging area; a 3rd-3rd injection member injecting the purge gas into the front right of the third purging area; and a 3rd-4th injection member injecting the purge gas into the rear right of the third purging area.

As such, as each of the first to third injection members is constituted by the 1st-1st to 1st-4th injection members, the 2nd-1st to 2nd-4th injection members, and the 3rd-1st to 3rd-4th injection members, respectively, the purge gas can be injected into each of the first to third purging areas of the storage chamber without dead zones, and thus, it is possible to efficiently remove the fumes of the wafer stored in the storage chamber.

Hereinbelow, as an embodiment of the container for storing a wafer according to the preferred embodiment of the present invention, it will be described on the basis that the plurality of injection members is constituted by the first to third injection members, and each of the first to third injection members is constituted by the 1st-1st to 1st-4th injection members, the 2nd-1st to 2nd-4th injection members, and the 3rd-1st to 3rd-4th injection members, respectively.

In this case, 30 wafers are stored in the storage chamber, and the inside of the storage chamber is divided into the first to third purging areas in the vertical direction by the first to third injection members. Accordingly, 10 wafers are disposed at each of the first to third purging areas, and purging of each 10 wafers can be achieved by the first to third injection members, respectively.

Hereinbelow, reference will be made to a container 10 for storing a wafer according to the preferred embodiment of the present invention with reference to the accompanying drawings.

Figure 2:
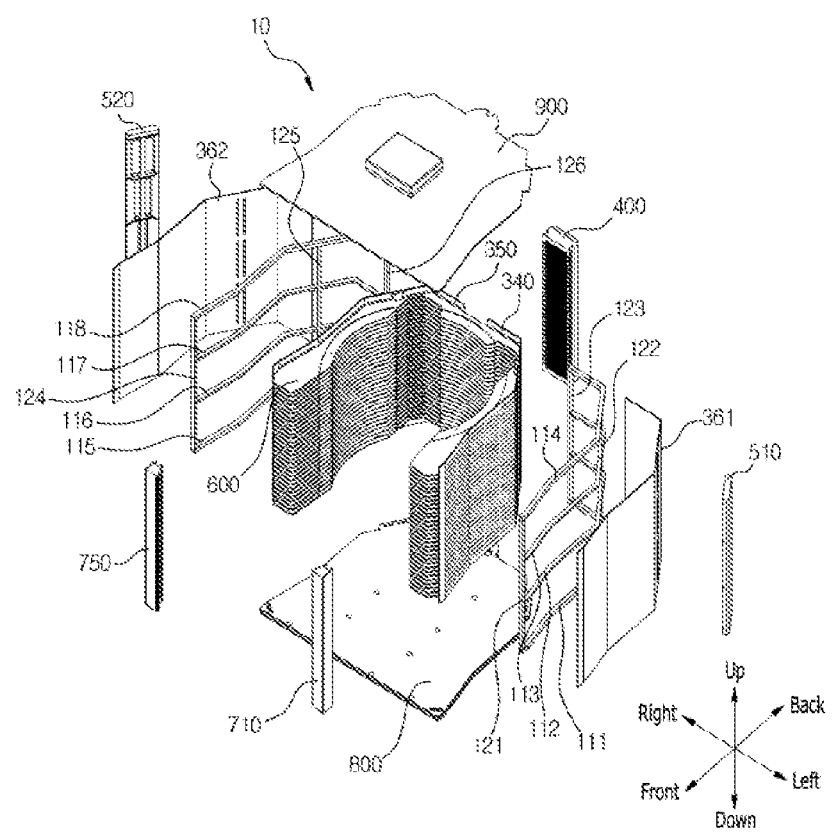
FIG. 2 is an exploded perspective view of FIG. 1.
Figure 3:
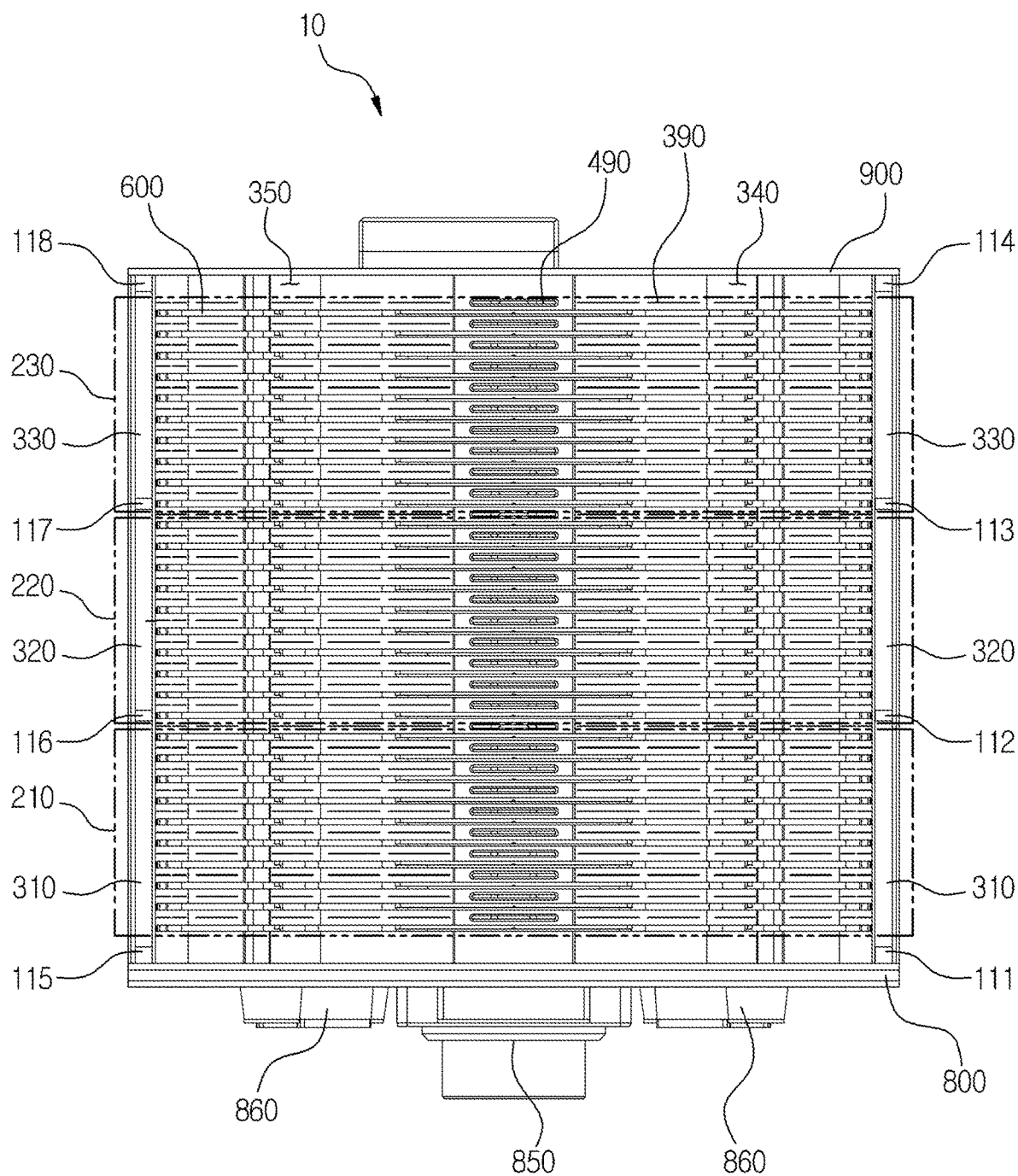
FIG. 3 is a front view of FIG. 1.
Figure 4:
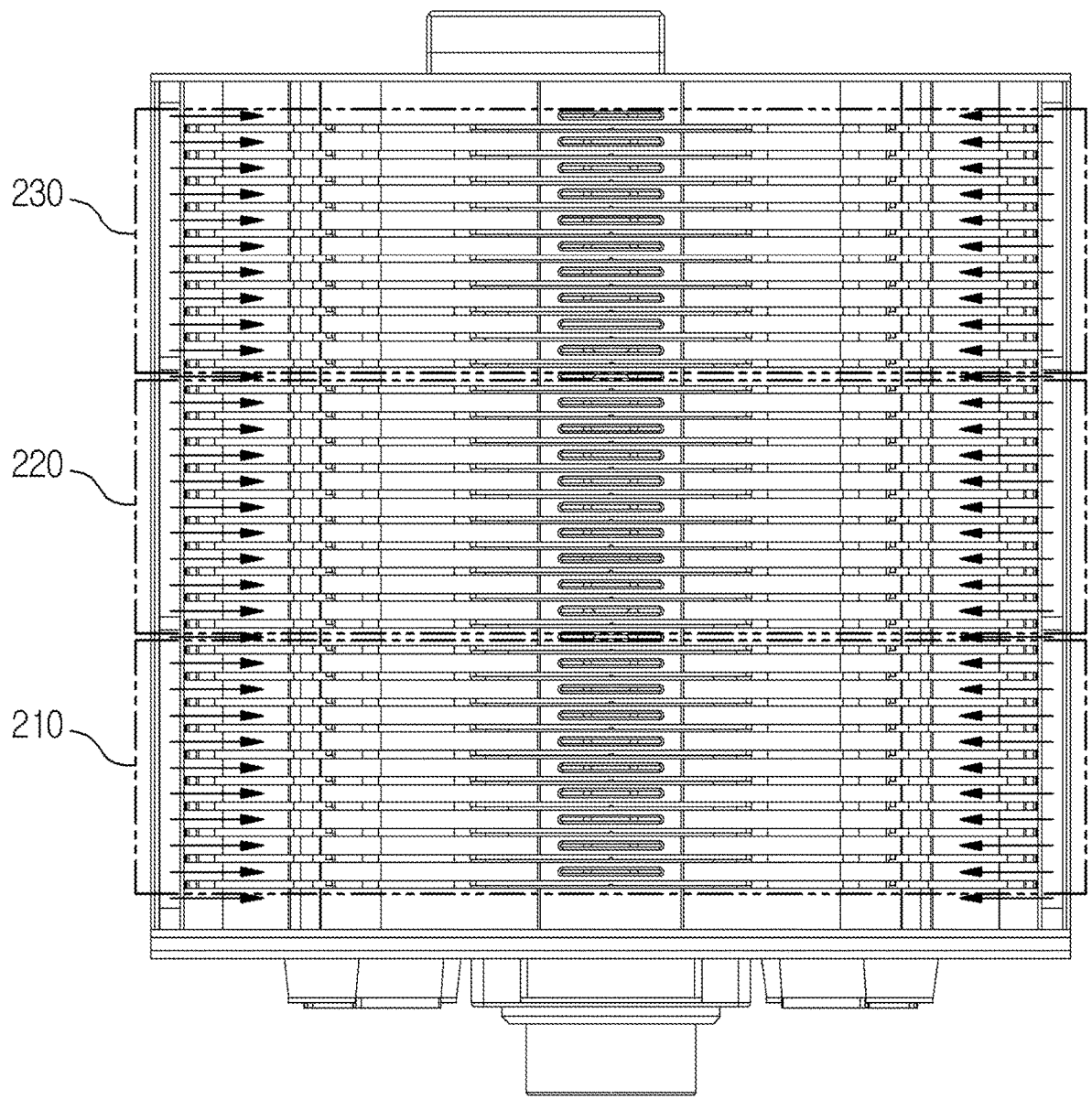
FIG. 4 is a front view showing the flow of purge gas injected into first to third purging areas of FIG. 3.
Figure 5:
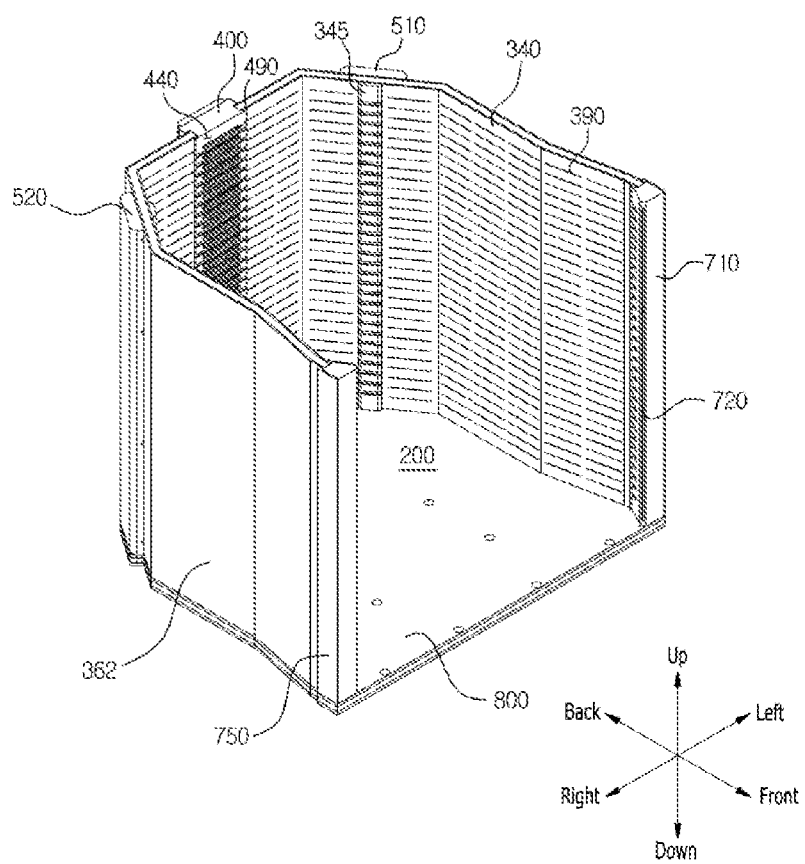
FIG. 5 is a partial perspective view showing a first injection member inner wall surface of FIG. 1.
Figure 6:
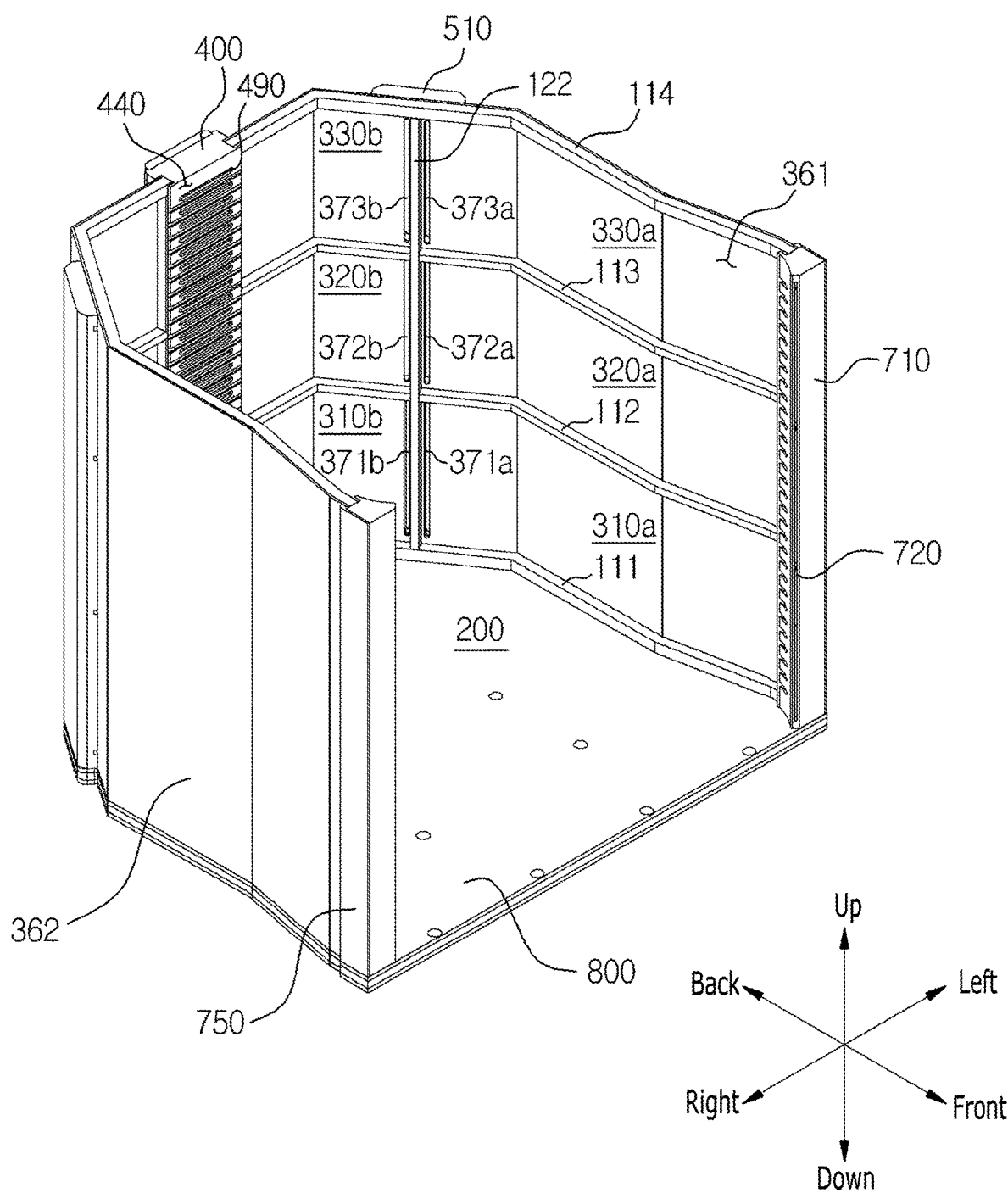
FIG. 6 is a partial perspective view showing 1st-1st to 3rd-2nd injection members of FIG. 1.
Figure 7:
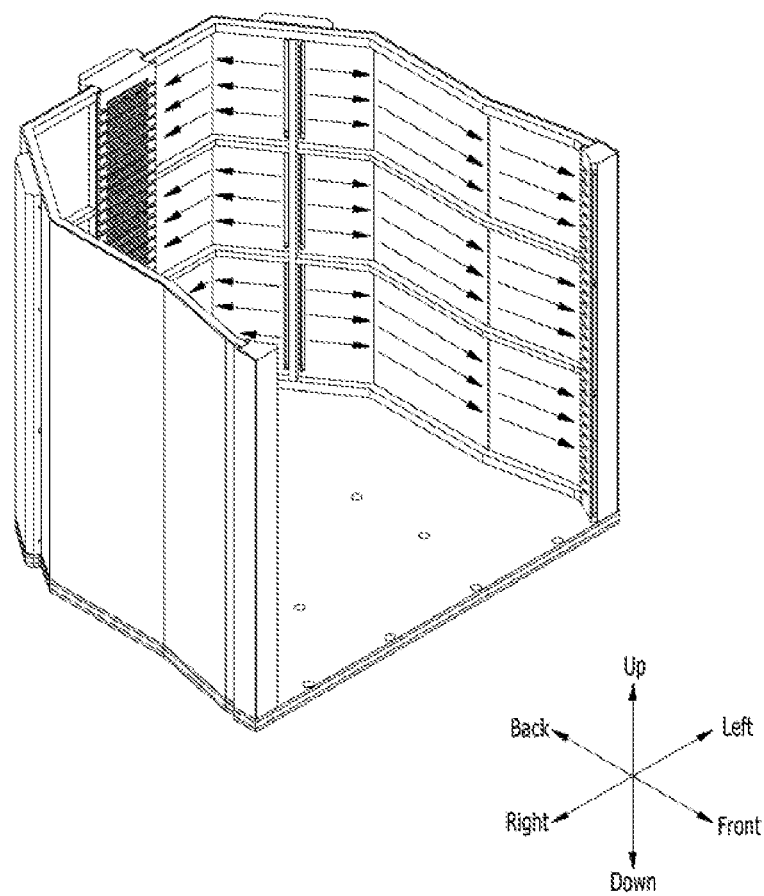
FIG. 7 is a partial perspective view showing the flow of the purge gas of the 1st-1st to 3rd-2nd injection members of FIG. 6.
Figure 8:
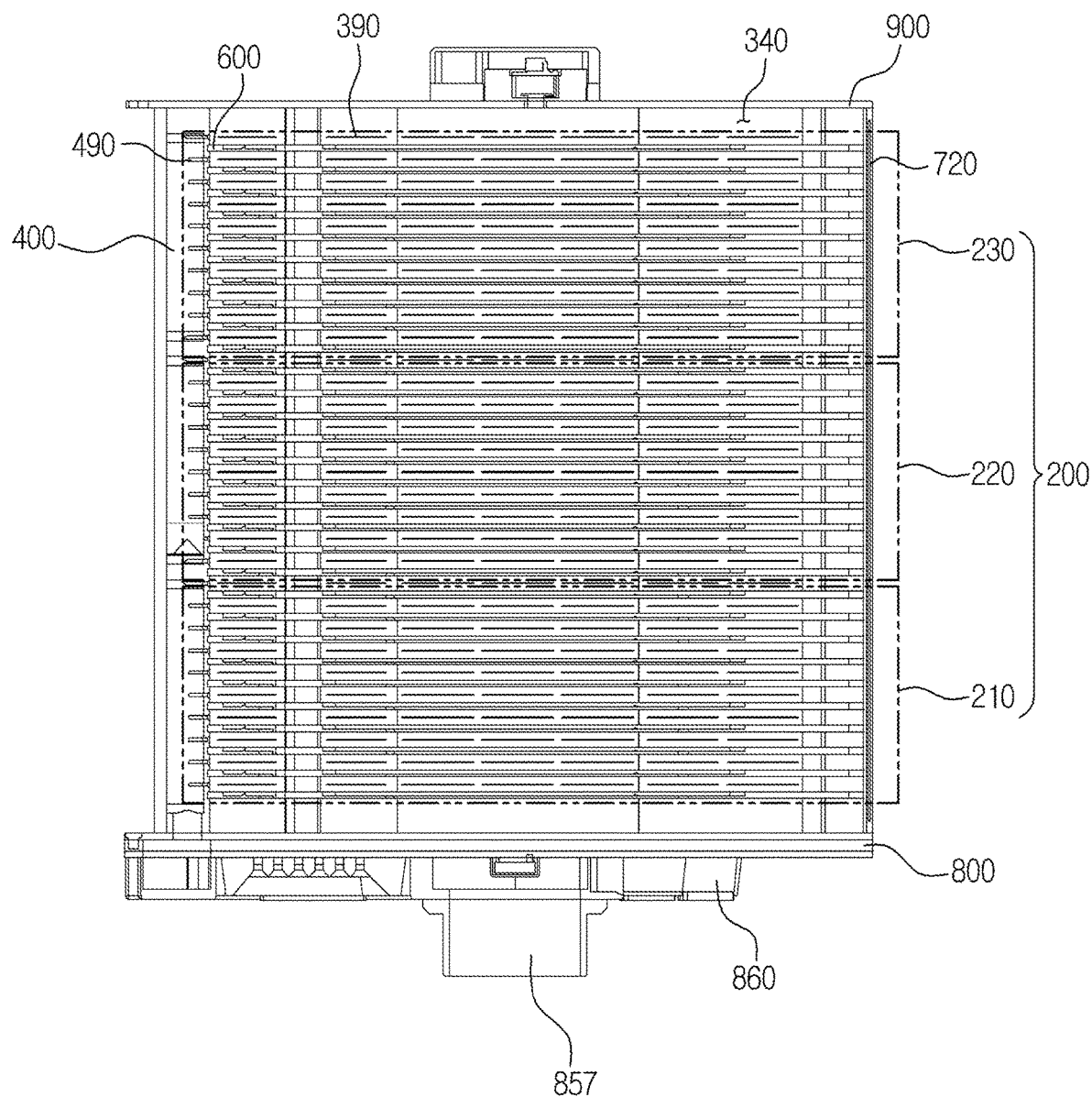
FIG. 8 is a left side sectional view of FIG. 1.
Figure 9:
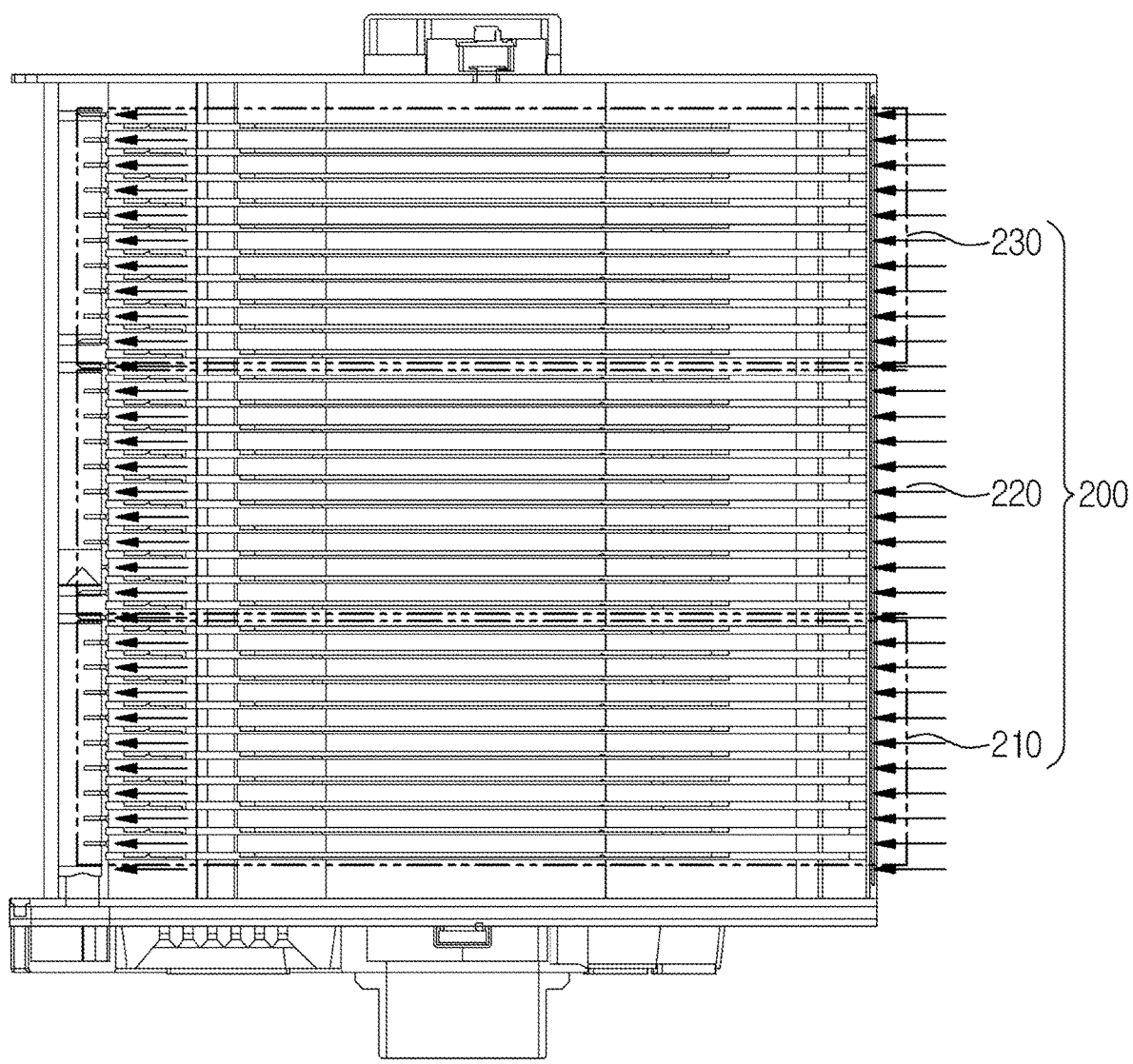
FIG. 9 is a right side sectional view showing the flow of external gas exhausted to a first front exhaust member of FIG. 8 and the flow of purge gas and fumes exhausted to exhaust member.
Figure 10:
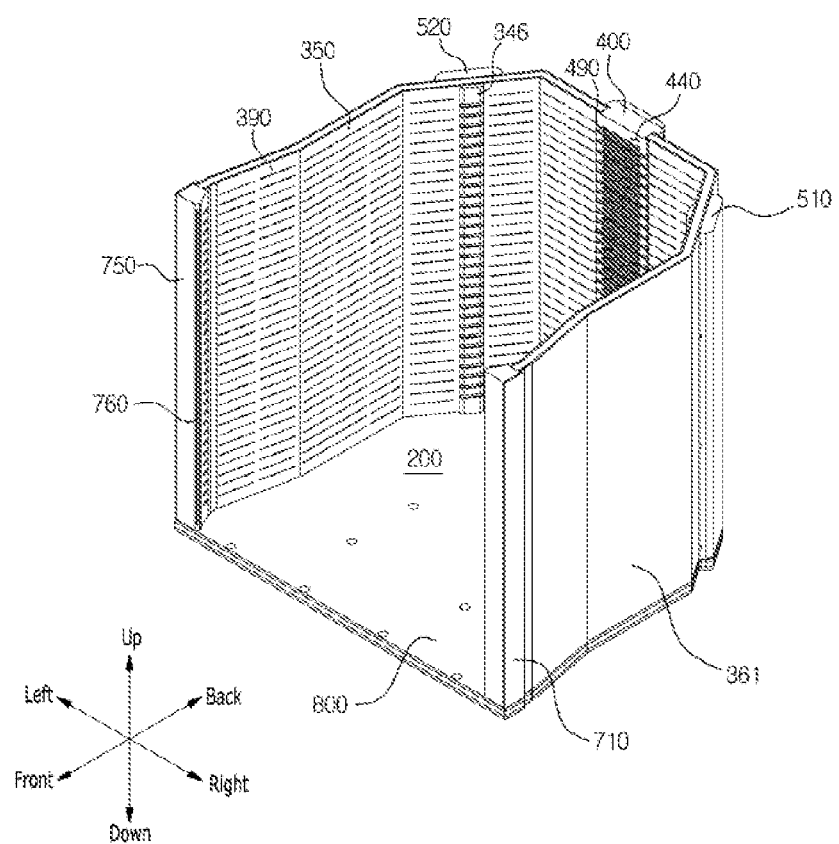
FIG. 10 is a partial perspective view showing a second injection member inner wall surface of FIG. 1.
Figure 11:
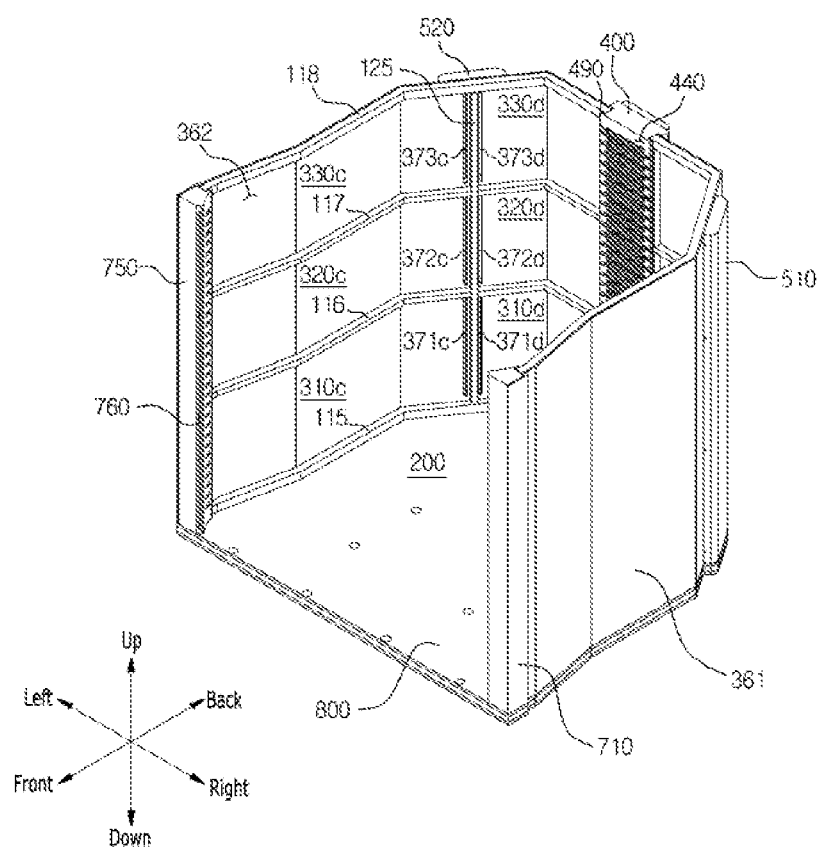
FIG. 11 is a partial perspective view showing 1st-3rd to 3rd-4th injection members of FIG. 1.
Figure 12:
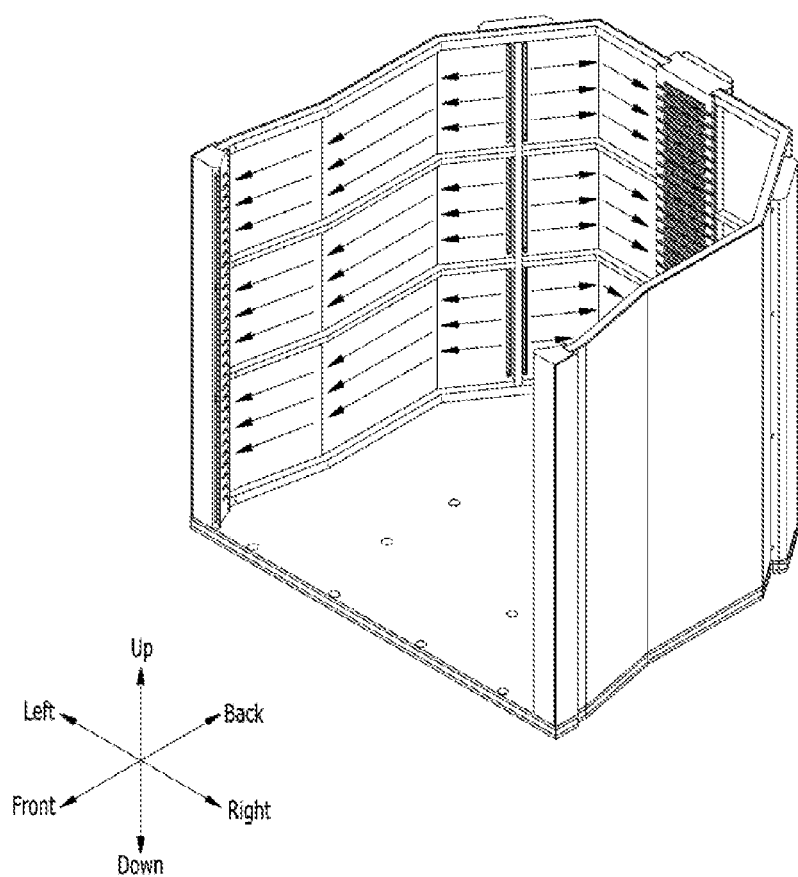
FIG. 12 is a partial perspective view showing the flow of purge gas of the 1st-3rd to 3rd-4th injection members of FIG. 11.
Figure 13:
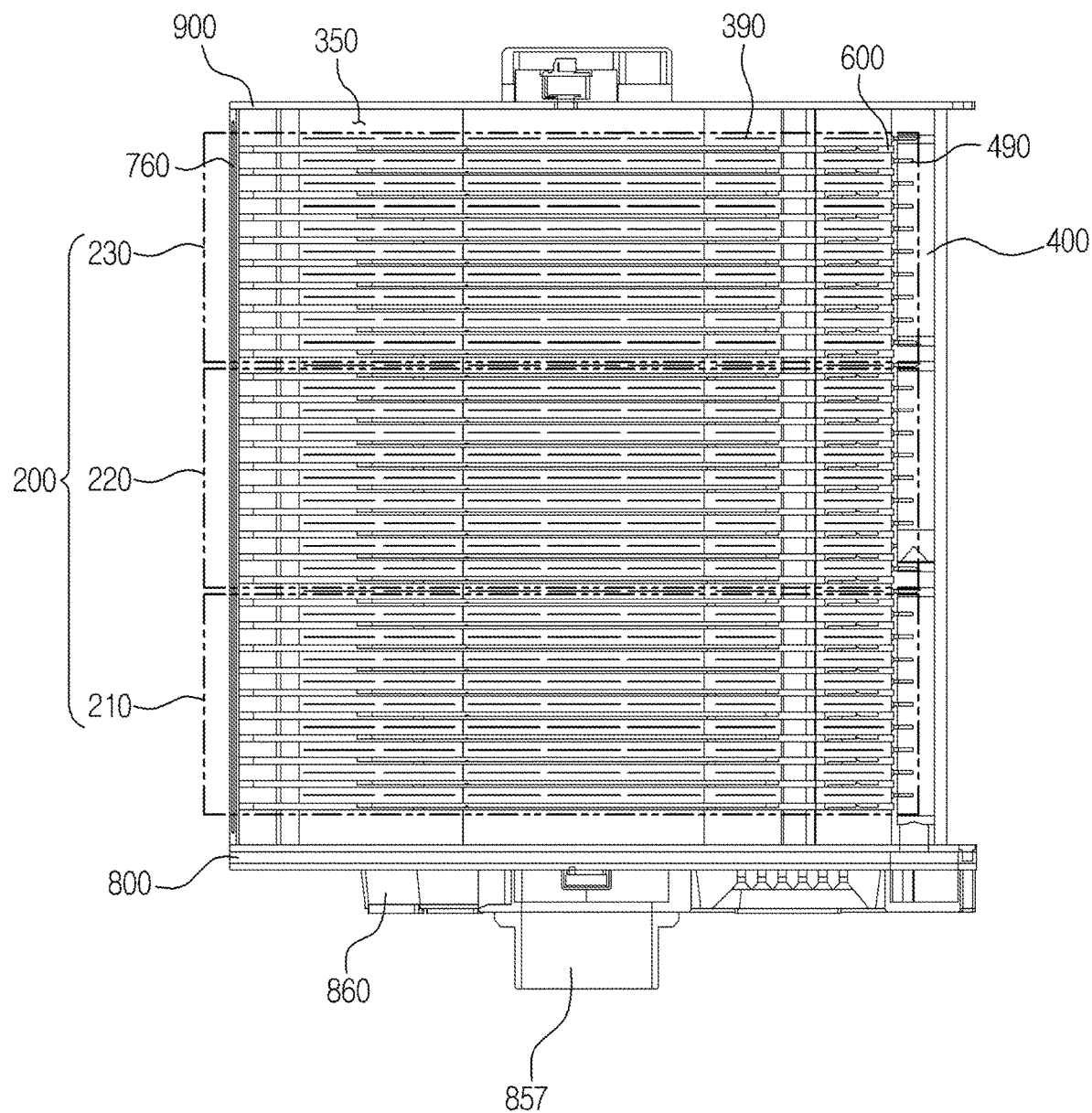
FIG. 13 is a right side sectional view of FIG. 1.
Figure 14:
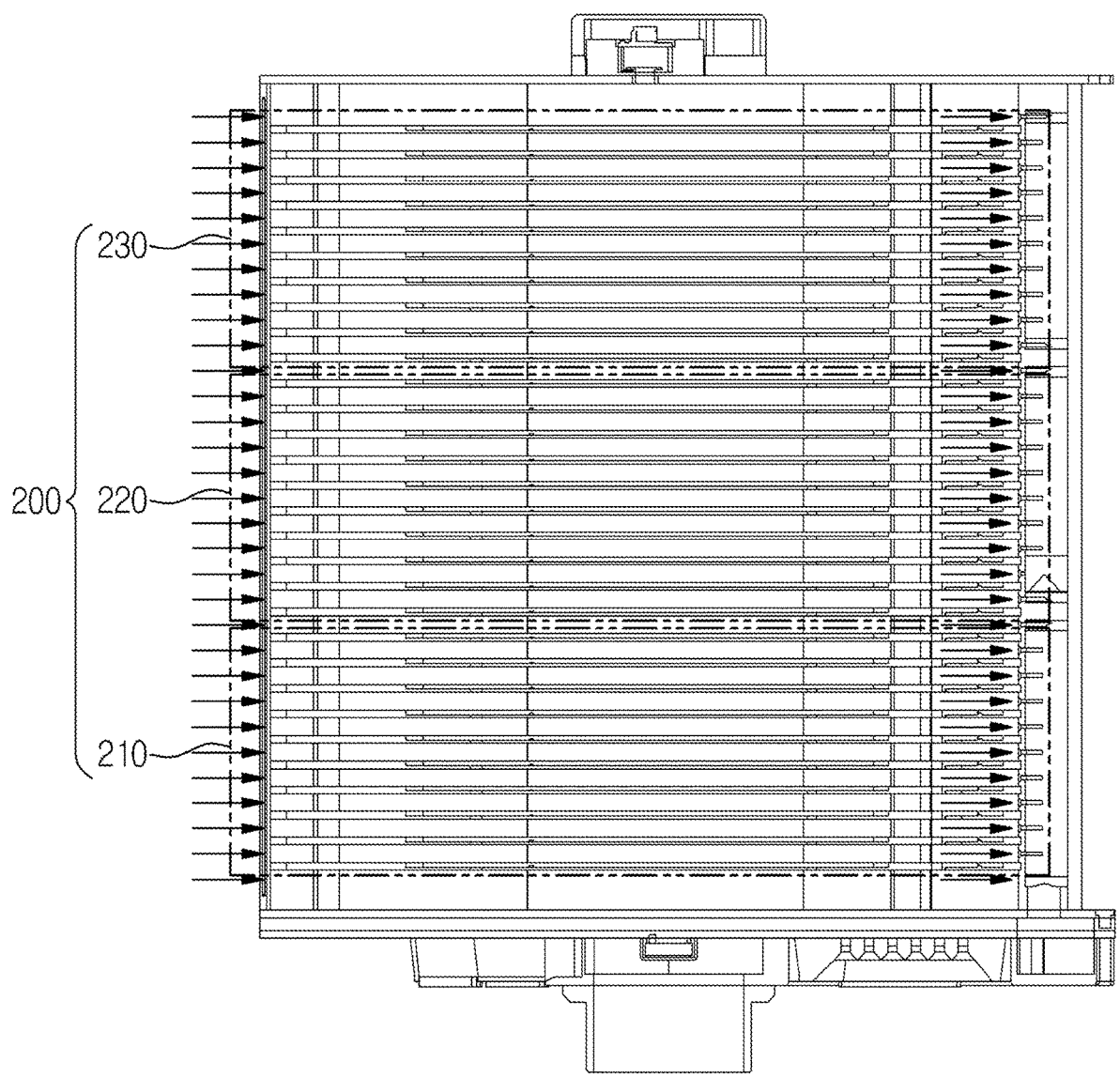
FIG. 14 is a right side sectional view showing the flow of external gas exhausted to a second front exhaust member of FIG. 13 and the flow of purge gas and fumes exhausted to the exhaust member.
Figure 15:
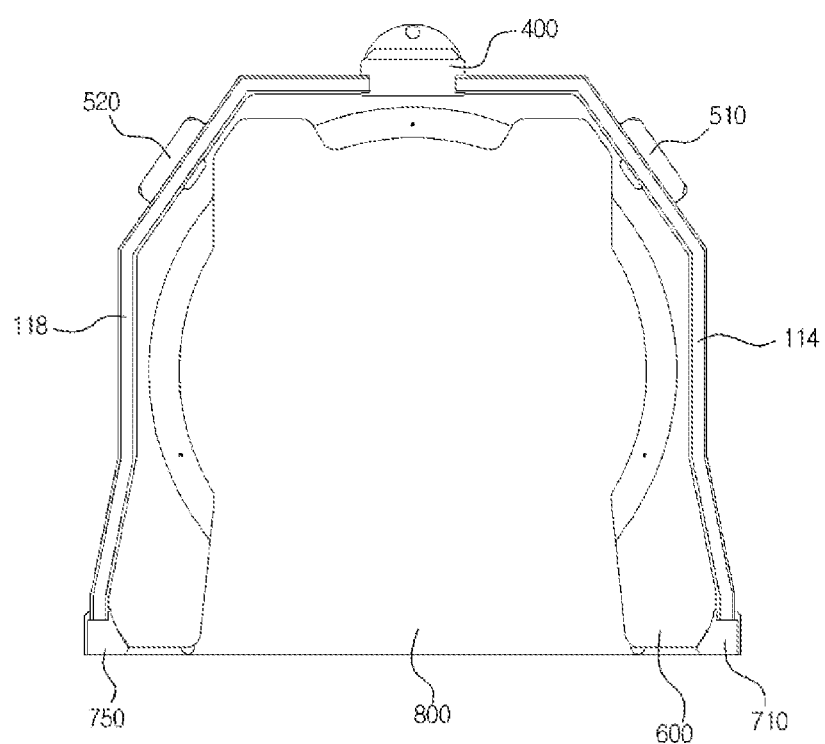
FIG. 15 is a plan sectional view of FIG. 11.
Figure 16:
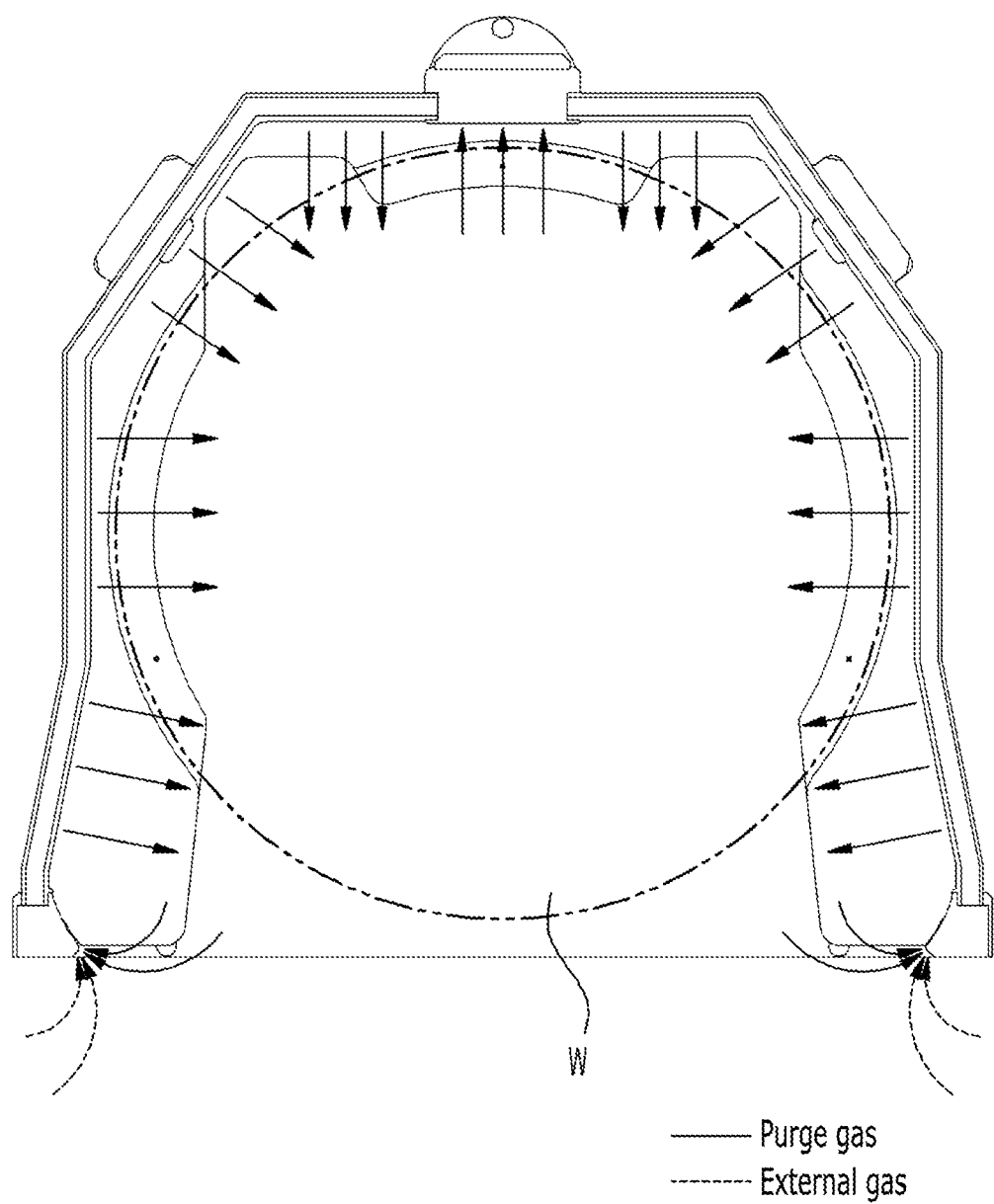
FIG. 16 is a plan sectional view showing the flow of purge gas injected to a wafer supported by a support FIG. 15 and the flow of the purge gas and fumes exhausted to the exhaust member.
Figure 17:
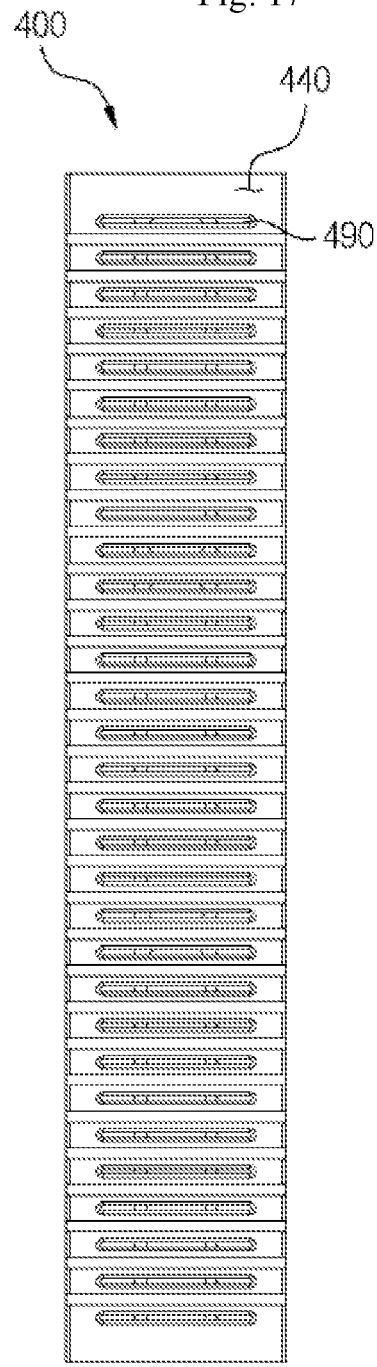
FIG. 17 is a front view showing the exhaust member of FIG. 1.
Figure 18:
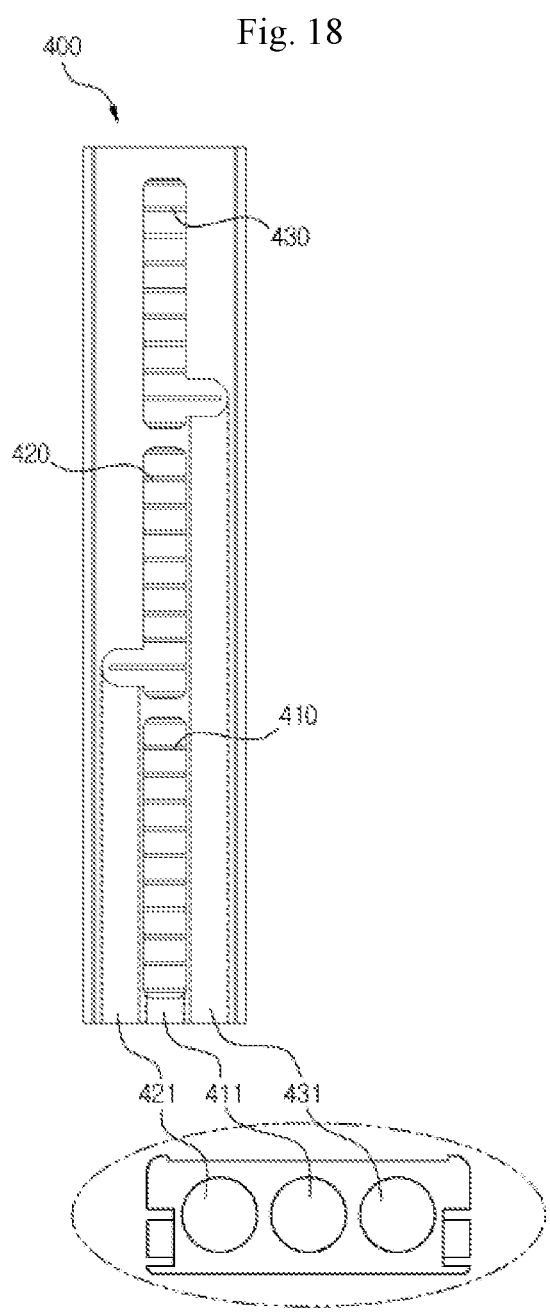
FIG. 18 is a back side sectional view showing the exhaust member of FIG. 17.
Figure 19:
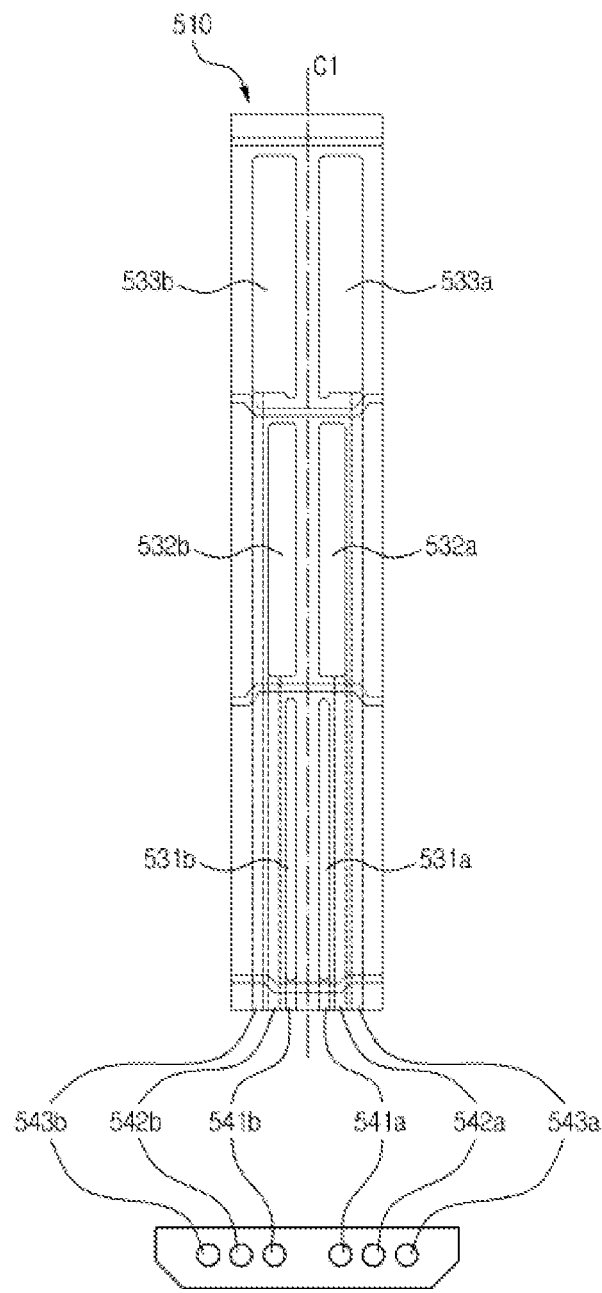
FIG. 19 is a right side view showing a first supply member of FIG. 1.
Figure 20:
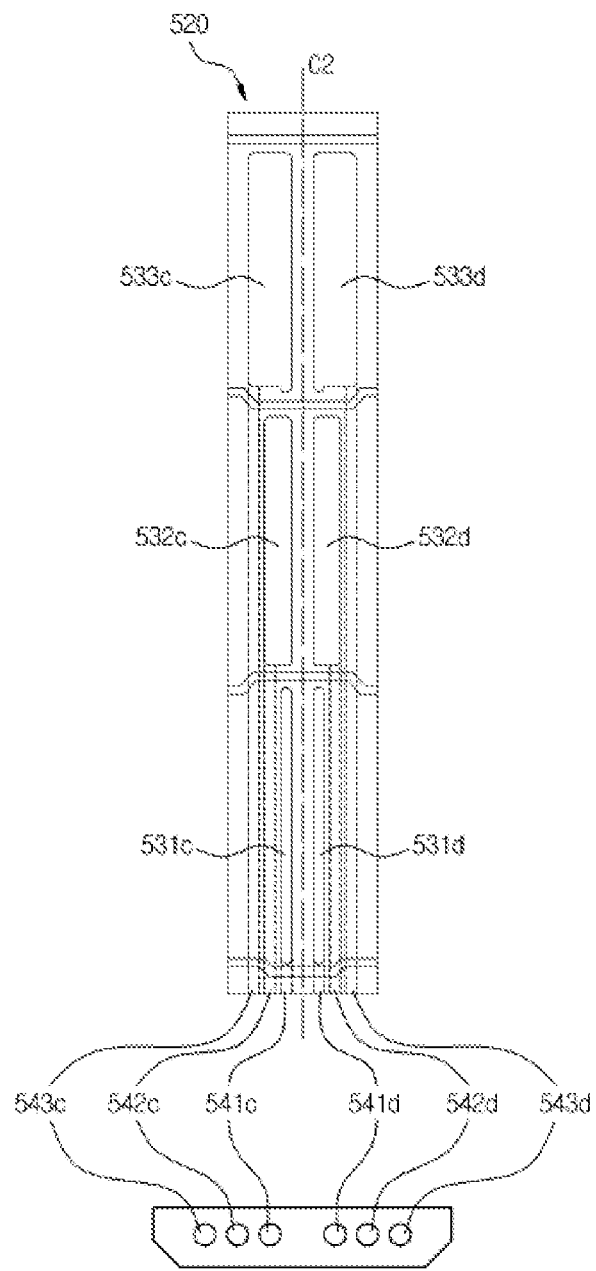
FIG. 20 is a left side view showing a second supply member of FIG. 1.
Figure 21:
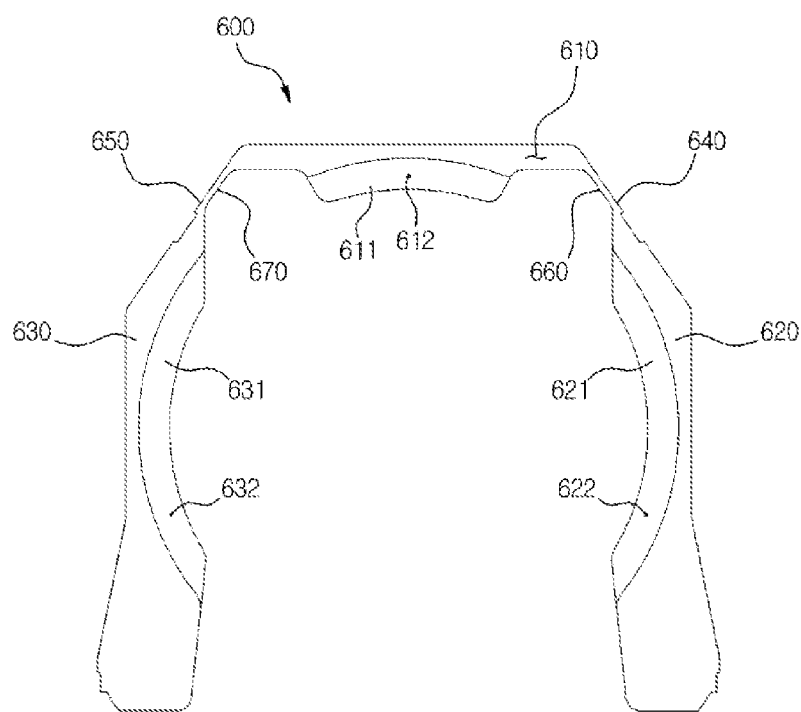
FIG. 21 is a plan view showing the support of FIG. 1.
Figure 22:
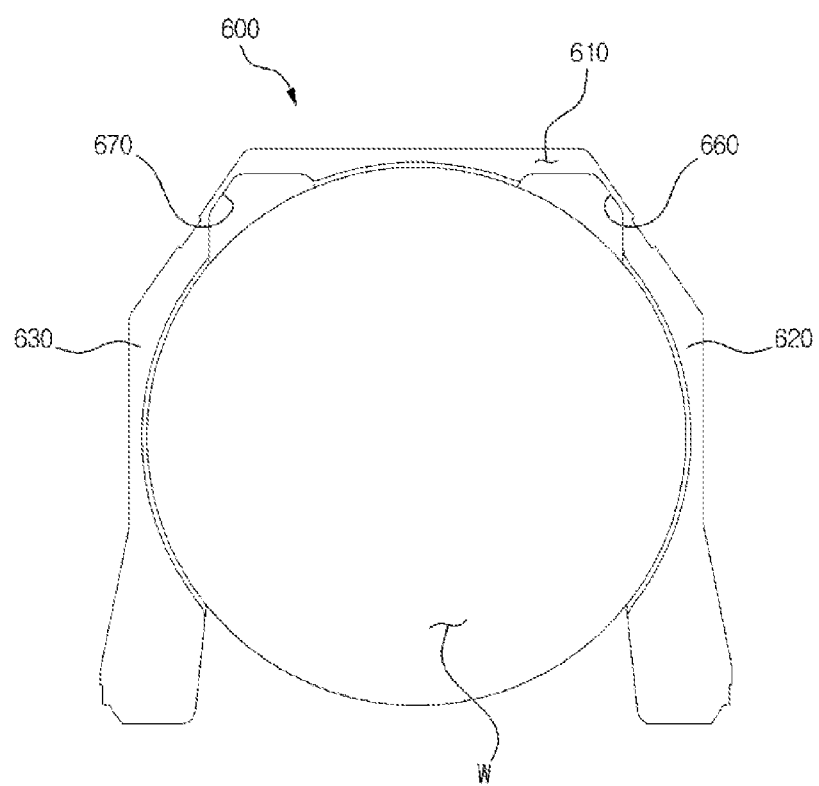
FIG. 22 is a view showing a state where the wafer is supported by the support of FIG. 21.
Figure 23:
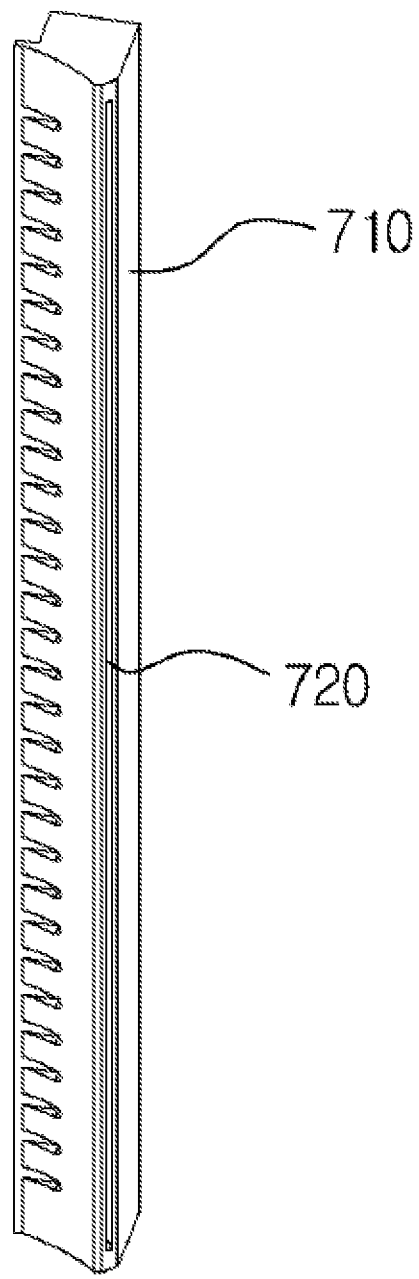
FIG. 23 is a perspective view showing the right side surface of the first front exhaust member of FIG. 1.
Figure 24:
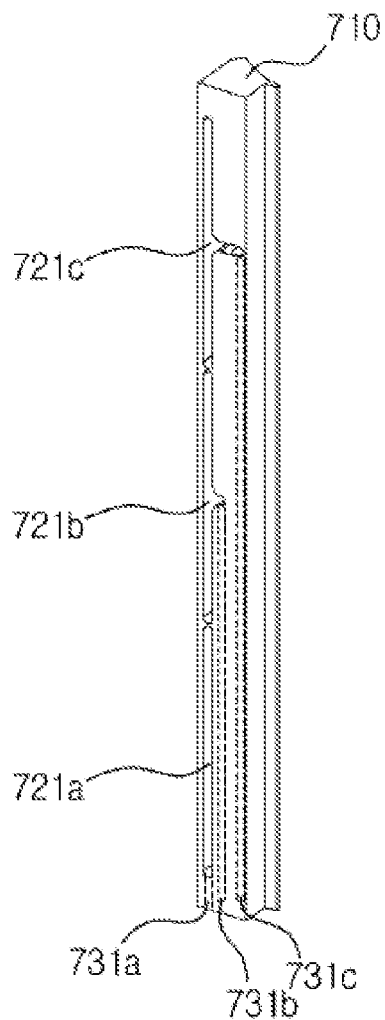
FIG. 24 is a sectional perspective view showing the left side surface of the first front exhaust member of FIG. 23.
Figure 24:
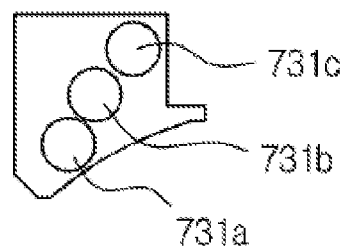
Figure 25:
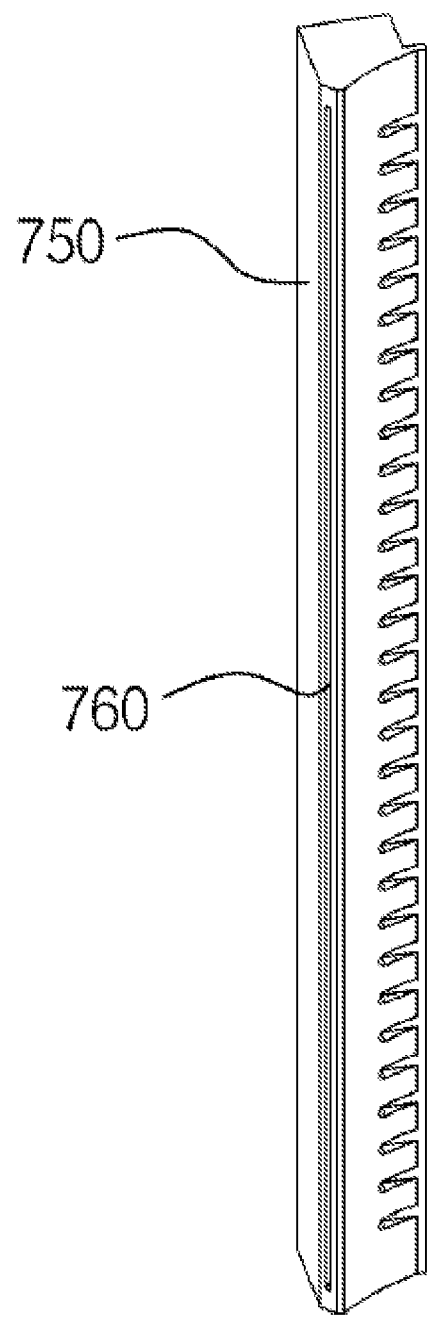
FIG. 25 is a perspective view showing the left side surface of the second front exhaust member of FIG. 1.
Figure 26:
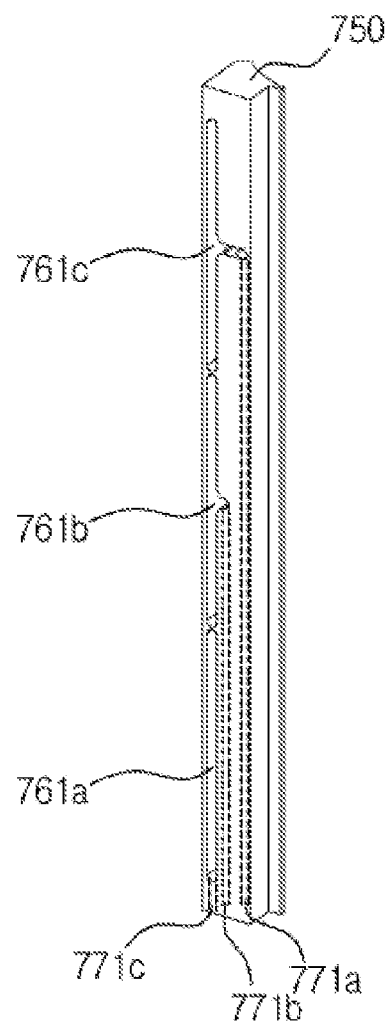
FIG. 26 is a sectional perspective view showing the right side surface of the second front exhaust member of FIG. 25.
Figure 26:
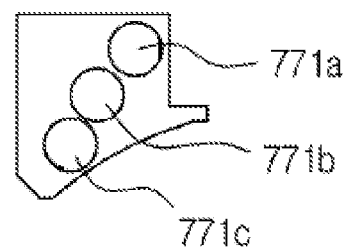
Figure 27:
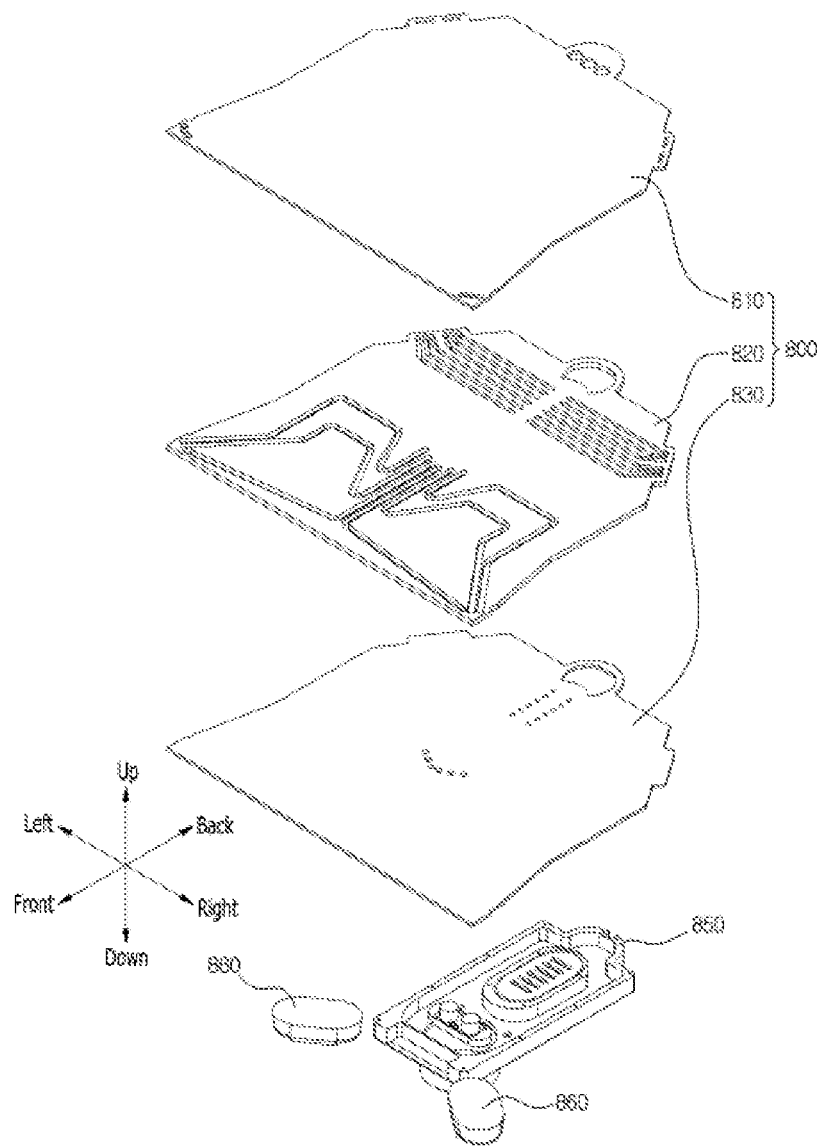
FIG. 27 is an exploded perspective view showing a bottom plate of FIG. 1.
Figure 28:
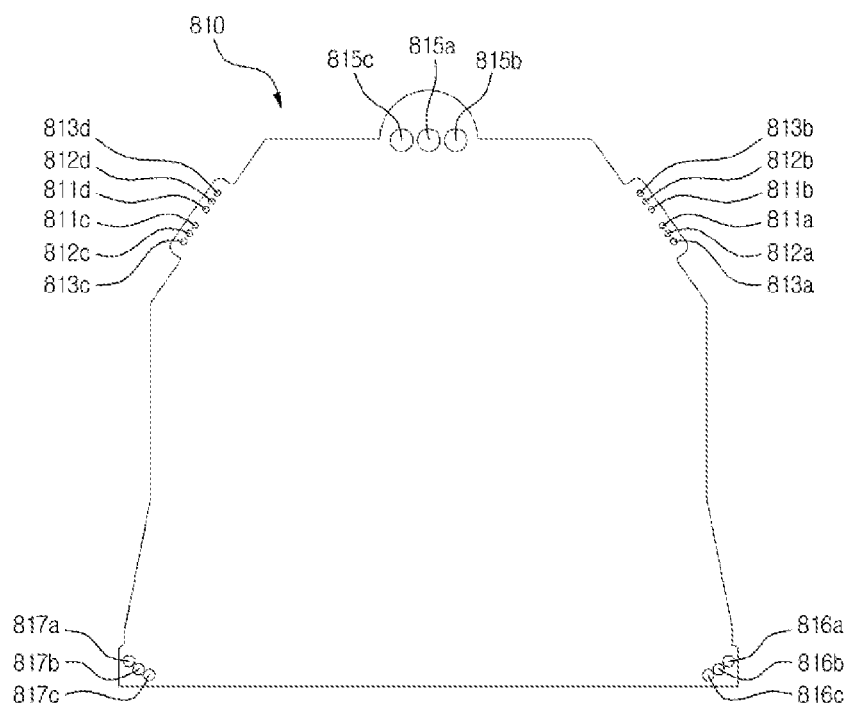
FIG. 28 is a plan view showing the first bottom plate of FIG. 27.
Figure 29:
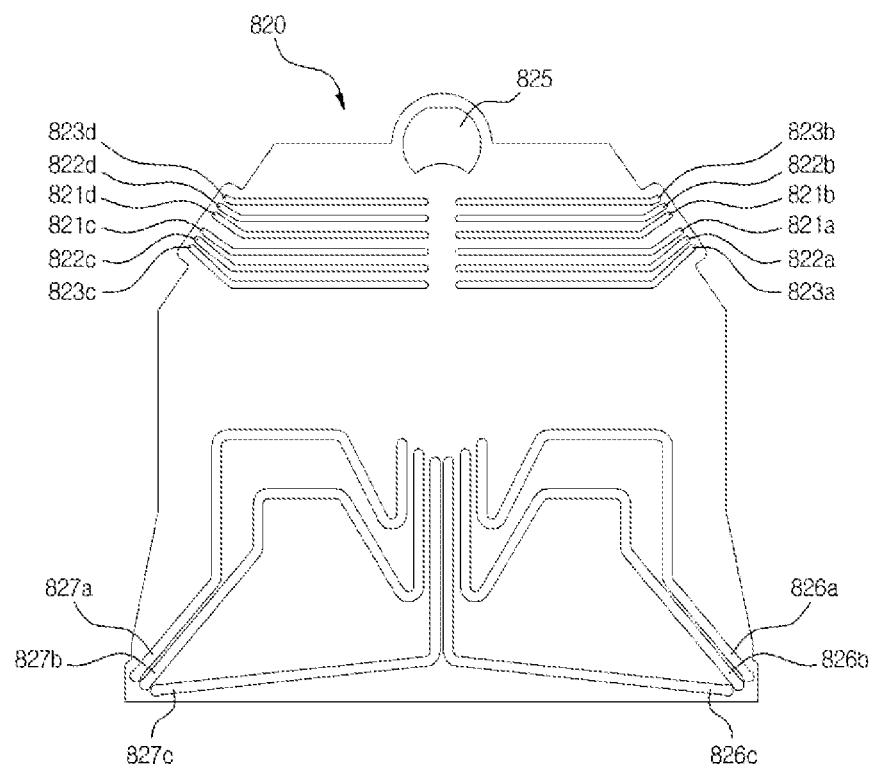
FIG. 29 is a plan view showing a second bottom plate of FIG. 27.
Figure 30:
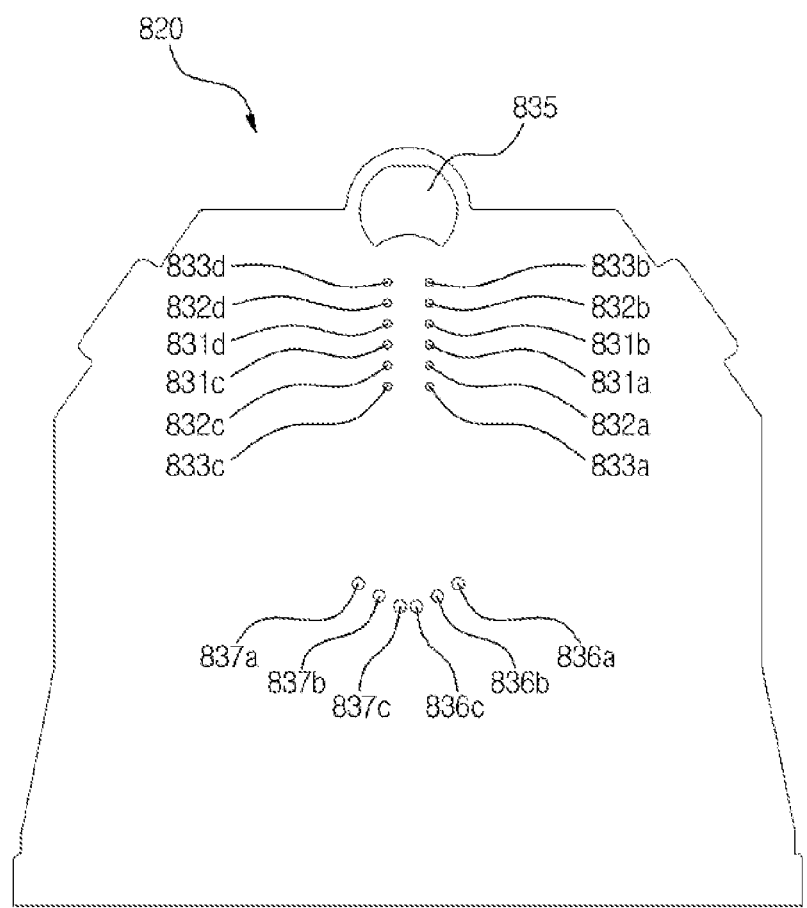
FIG. 30 is a plan view showing a third bottom plate of FIG. 27.
Figure 31:
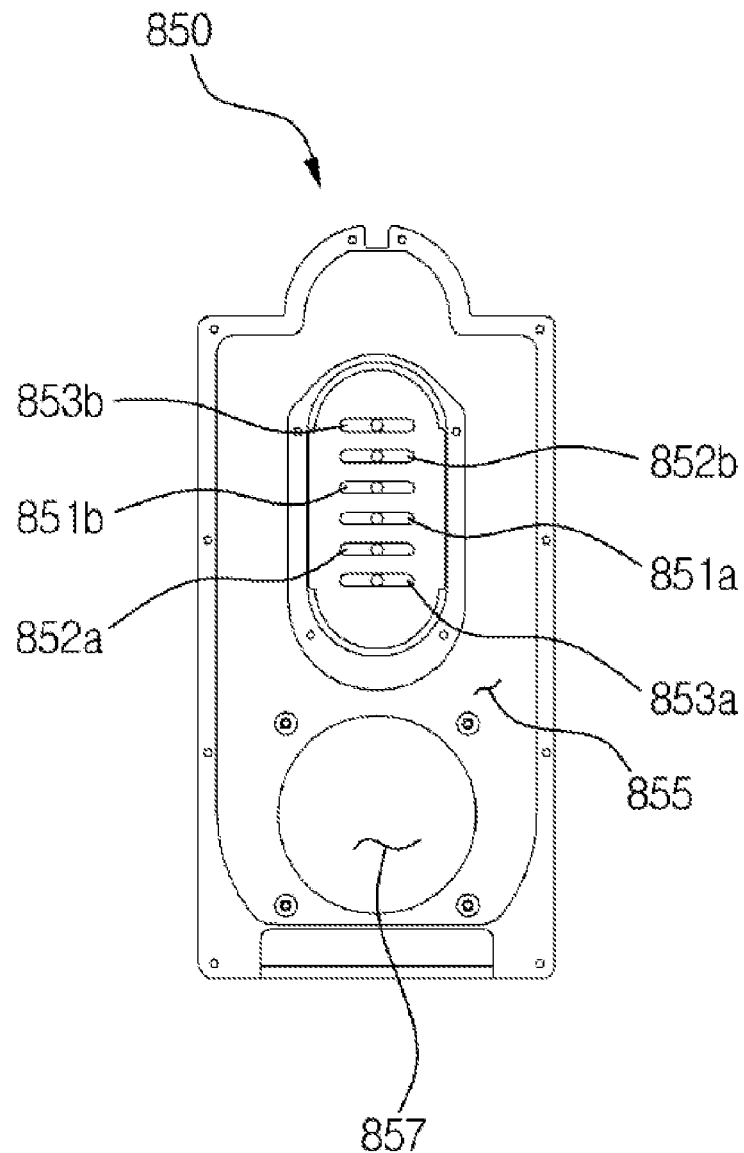
FIG. 31 is a plan view showing a connection portion of FIG. 27.
Figure 32:
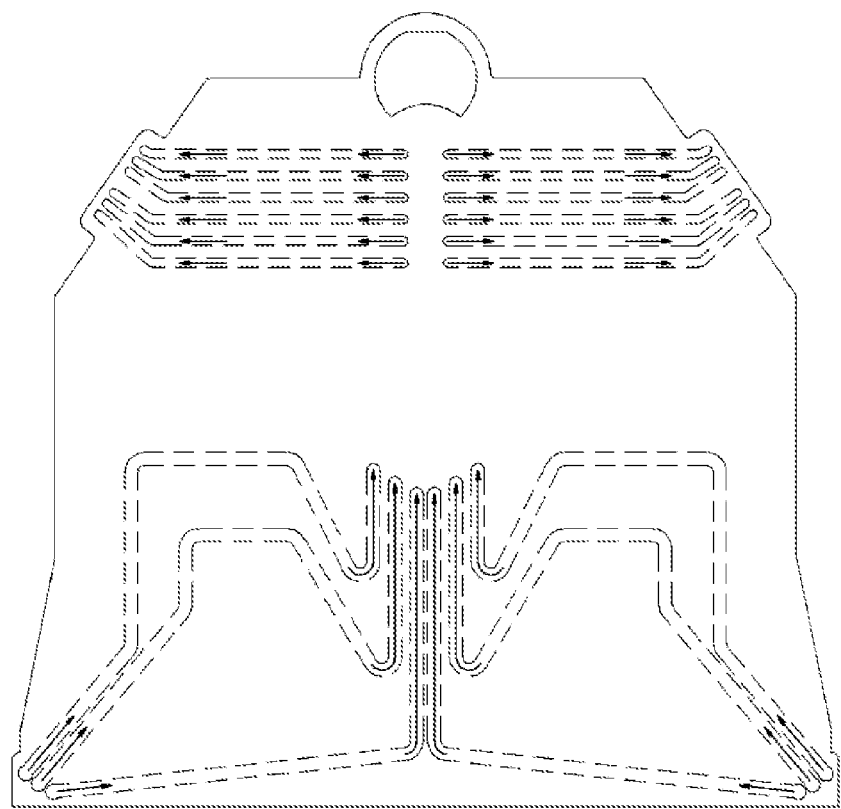
FIG. 32 is a plan view showing the flow of the purge gas within the bottom plate of FIG. 27.
Figure 33:
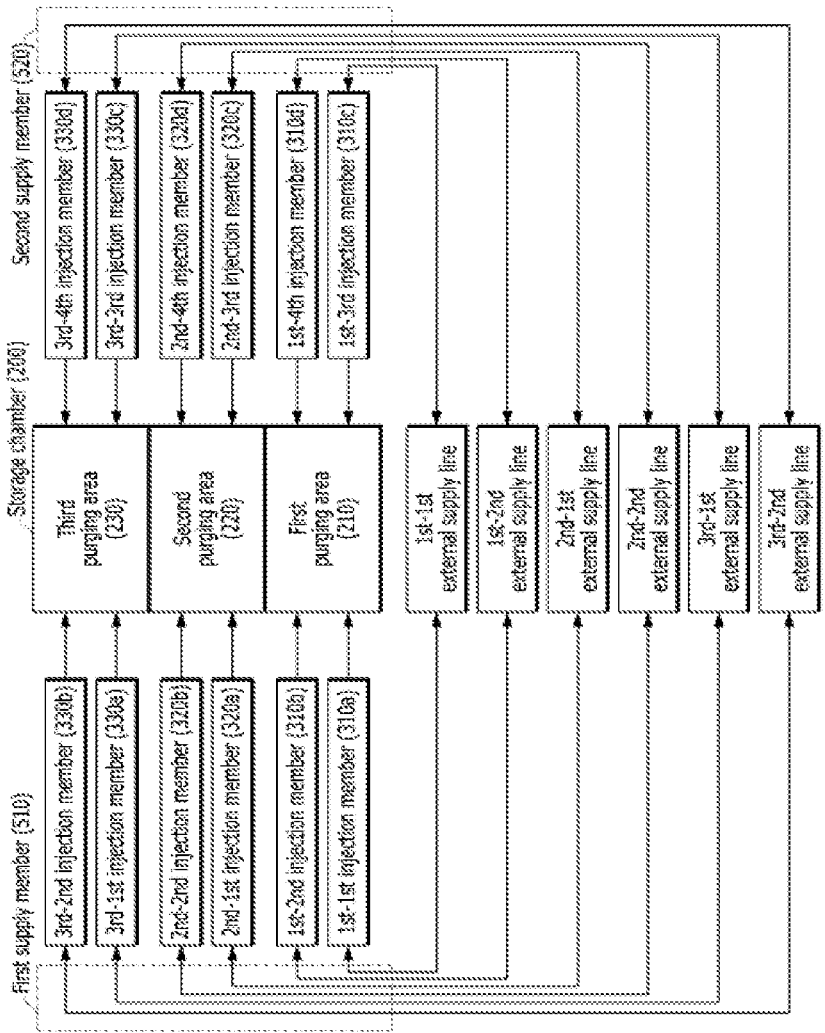
FIG. 33 is a schematic view showing the flow of injection/supply of the purge gas of the container for storing a wafer according to the preferred embodiment of the present invention.
Figure 34:
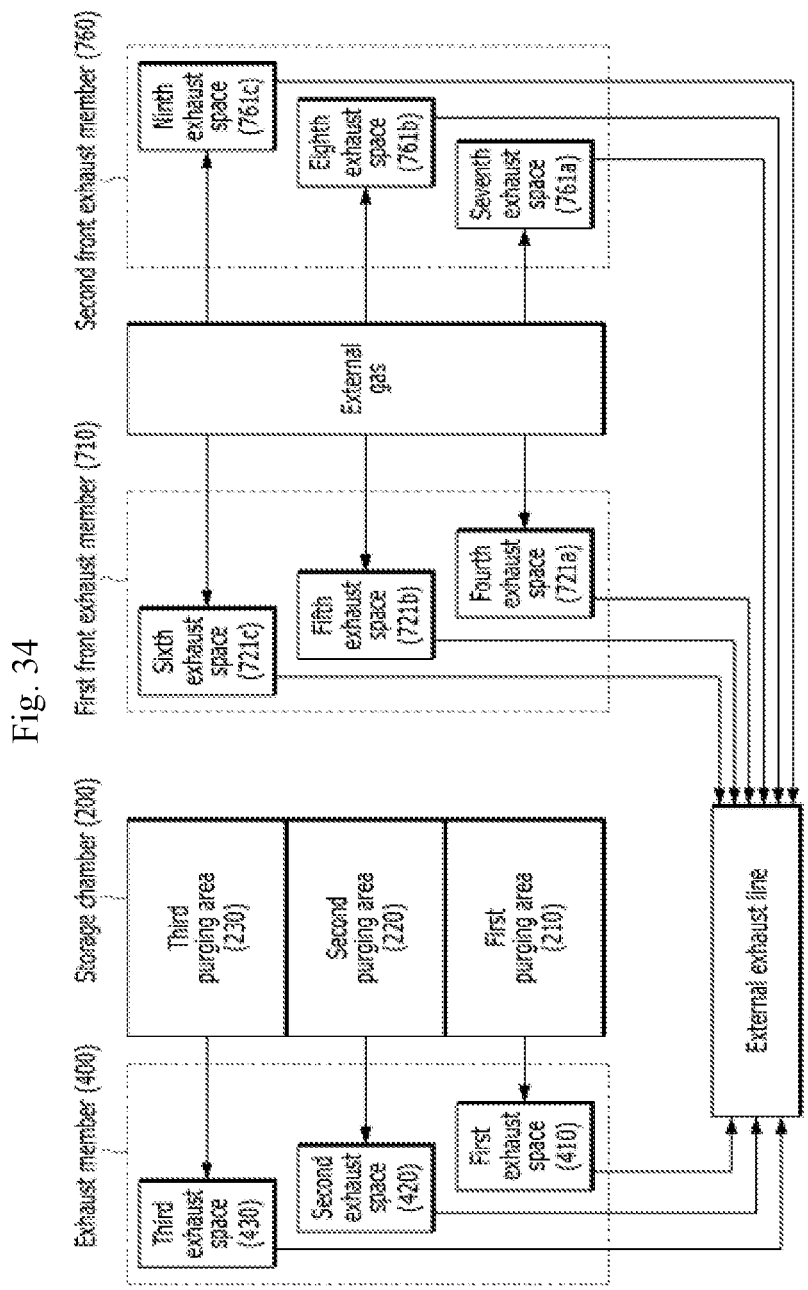
FIG. 34 is a schematic view showing the exhaust flow of the purge gas, the fumes, and the external gas of the container for storing a wafer according to the preferred embodiment of the present invention.

FIG. 1 is a perspective view showing a container for storing a wafer according to a preferred embodiment of the present invention; FIG. 2 is an exploded perspective view of FIG. 1; FIG. 3 is a front view of FIG. 1; FIG. 4 is a front view showing the flow of purge gas injected into first to third purging areas of FIG. 3; FIG. 5 is a partial perspective view showing a first injection member inner wall surface of FIG. 1; FIG. 6 is a partial perspective view showing 1st-1st to 3rd-2nd injection members of FIG. 1; FIG. 7 is a partial perspective view showing the flow of the purge gas of the 1st-1st to 3rd-2nd injection members of FIG. 6; FIG. 8 is a left side sectional view of FIG. 1; FIG. 9 is a right side sectional view showing the flow of external gas exhausted to a first front exhaust member of FIG. 8 and the flow of purge gas and fumes exhausted to exhaust member; FIG. 10 is a partial perspective view showing a second injection member inner wall surface of FIG. 1; FIG. 11 is a partial perspective view showing 1st-3rd to 3rd-4th injection members of FIG. 1; FIG. 12 is a partial perspective view showing the flow of purge gas of the 1st-3rd to 3rd-4th injection members of FIG. 11; FIG. 13 is a right side sectional view of FIG. 1; FIG. 14 is a right side sectional view showing the flow of external gas exhausted to a second front exhaust member of FIG. 13 and the flow of purge gas and fumes exhausted to the exhaust member; FIG. 15 is a plan sectional view of FIG. 11; FIG. 16 is a plan sectional view showing the flow of purge gas injected to a wafer supported by a support FIG. 15 and the flow of the purge gas and fumes exhausted to the exhaust member; FIG. 17 is a front view showing the exhaust member of FIG. 1; FIG. 18 is a back side sectional view showing the exhaust member of FIG. 17; FIG. 19 is a right side view showing a first supply member of FIG. 1; FIG. 20 is a left side view showing a second supply member of FIG. 1; FIG. 21 is a plan view showing the support of FIG. 1; FIG. 22 is a view showing a state where the wafer is supported by the support of FIG. 21; FIG. 23 is a perspective view showing the right side surface of the first front exhaust member of FIG. 1; FIG. 24 is a sectional perspective view showing the left side surface of the first front exhaust member of FIG. 23; FIG. 25 is a perspective view showing the left side surface of the second front exhaust member of FIG. 1; FIG. 26 is a sectional perspective view showing the right side surface of the second front exhaust member of FIG. 25; FIG. 27 is an exploded perspective view showing a bottom plate of FIG. 1; FIG. 28 is a plan view showing the first bottom plate of FIG. 27; FIG. 29 is a plan view showing a second bottom plate of FIG. 27; FIG. 30 is a plan view showing a third bottom plate of FIG. 27; FIG. 31 is a plan view showing a connection portion of FIG. 27; FIG. 32 is a plan view showing the flow of the purge gas within the bottom plate of FIG. 27; FIG. 33 is a schematic view showing the flow of injection/supply of the purge gas of the container for storing a wafer according to the preferred embodiment of the present invention; and FIG. 34 is a schematic view showing the exhaust flow of the purge gas, the fumes, and the external gas of the container for storing a wafer according to the preferred embodiment of the present invention.

The container 10 for storing a wafer according to the preferred embodiment of the present invention, as shown in FIGS. 1 to 3, includes: a storage chamber 200 configured such that a wafer W is stored therein through a front opening 251; first to third injection members 310, 320, and 330 configured to inject purge gas into the storage chamber 200; first to eighth horizontal members 111 to 118 and first to sixth vertical members 121 to 126 forming frames of the first to third injection members 310, 320, and 330; an exhaust member 400 configured to exhaust the purge gas and fumes of the storage chamber 200; a supply member configured to supply the purge gas to the first to third injection members 310, 320, and 330; a support 600 provided inside the storage chamber 200 to support the wafer W; first and second front exhaust members 710 and 750 disposed on the left and right sides of the front of the storage chamber 200; a bottom plate 800 constituting a bottom surface of the container 10 for storing a wafer; a connection member 850 provided at a location below the bottom plate 800; and a top plate 900 constituting a top surface of the container 10 for storing a wafer.

Storage Chamber 200

Hereinbelow, reference will be made to the storage chamber 200.

As shown in FIGS. 1 to 3, the storage chamber 200 serves to store the wafer W therein, and is defined as an internal space surrounded by the first to third injection members 310, 320, and 330, and the exhaust member 400.

At the front of the storage chamber 200, the front opening 251 is formed, and the wafer W is put in and taken out from the front opening 251.

The top surface of the storage chamber 200 is constituted by the top plate 900, the bottom surface of the storage chamber 200 is constituted by the bottom plate 800, and the circumferential surface of the storage chamber 200 is constituted by first and second injection member inner wall surfaces 340 and 350 and an exhaust member inner wall surface 440.

Accordingly, the storage chamber 200 is blocked by the top surface, the bottom surface, the top and bottom plates 800 of the circumferential surface, the first and second injection member inner wall surfaces 340 and 350, and the exhaust member inner wall surface 440 excluding the front opening 251.

Further, the first and second injection member inner wall surfaces 340 and 350 constituting the circumferential surface of the storage chamber 200, and the exhaust member inner wall surface 440 are formed with injection holes 390 and an exhaust hole 490, respectively, whereby the purge gas can be injected into the storage chamber 200 through the injection holes 490, and the purge gas injected into the storage chamber 200 and the fumes of the wafer W can be exhausted through the exhaust hole 490.

The storage chamber 200 is provided therein with the support 600 for supporting the wafer W, whereby the wafer W can be easily stored in the storage chamber 200 by being supported by the support 600.

In this case, the support 600, as shown in FIGS. 5 and 10, may be easily provided in the first and second injection member inner wall surfaces 340 and 350 by first and second support coupling parts 345 and 355 respectively provided in the left rear and the right rear of the storage chamber 200.

Further, the support 600 may provided in plural in the vertical direction according to the number of wafers W accommodated in the storage chamber 200. Accordingly, in the storage chamber 200, 30 supports 200 are provided to support the 30 wafers W, respectively, and the details of the support 600 will be described hereinafter.

As shown in FIGS. 3 and 4, the inside of the storage chamber 200 is divided into first to third purging areas 210, 220, and 230 in the vertical direction, and in this case, the first purging area 210, the second purging area 220, and the third purging area 230 are formed in the order from bottom to top.

The first to third purging areas 210, 220, and 230 are virtual areas that are divided within the storage chamber 200, in which the wafer W is purged by the purge gas injected from the first to third injection members 310, 320, and 330, respectively.

Accordingly, wafers W that are stored in the storage chamber 200 and are disposed at the first purging area 210 are purged by the purge gas injected from the first injection member 310, wafers W that are disposed at the second purging area 220 are purged by the purge gas injected from the second injection member 320, and wafers W that are disposed at the third purging area 230 are purged by the purge gas injected from the third injection member 330.

Further, the purge gas supplied to the first injection member 310, the purge gas supplied to the second injection member 320, and the purge gas supplied to the third injection member 330 are individually supplied, and the detailed description thereof will be made hereinafter.

First to Third Injection Members 310, 320, and 330

Hereinbelow, reference will be made to the first to third injection members 310, 320, and 330.

As shown in FIGS. 3 and 4, the first to third injection members 310, 320, and 330 are disposed to surround the storage chamber 200, and are arranged such that the first injection member 310, the second injection member 320, and the third injection member 330 are disposed on top of each other in the vertical direction in the order from bottom to top, so as to respectively correspond to the first to third purging areas 210, 220, and 230 vertically divided within the storage chamber 200.

In other words, the first injection member 310 is disposed above the bottom plate 800, the second injection member 320 is disposed above the first injection member 310, and the third injection member 330 is disposed above the second injection member 320 and under the top plate 900. In other words, the first to third injection members 310, 320, and 330 are arranged into three layers in the vertical direction between the bottom plate 800 and the top plate 900. Accordingly, the partition of the first to third purging areas 210, 220, and 230 can be facilitated by the purge gas injected from the first to third injection members 310, 320, and 330, respectively.

As shown in FIGS. 6 and 11, the first to third injection members 310, 320, and 330 may include 1st-1st to 1st-4th injection members 310a to 310d, 2nd-1st to 2nd-4th injection members 320a to 320d, and 3rd-1st to 3rd-4th injection members 330a to 330d, respectively. In this case, the 1st-1st to 1st-4th injection members 310a to 310d inject the purge gas into the first purging area 210, the 2nd-1st to 2nd-4th injection members 320a to 320d inject the purge gas into the second purging area 220, and the 3rd-1st to 3rd-4th injection members 330a to 330d inject the purge gas into the third purging area 230.

Further, the 1st-1st and 1st-2nd injection members 310a and 310b, the 2nd-1st and 2nd-2nd injection members 320a and 320b, the 3rd-1st and 3rd-2nd injection members 330a and 330b, the 1st-3rd and 1st-4th injection members 310c and 310d, the 2nd-3rd and 2nd-4th injection members 320c and 320d, and the 3rd-3rd and 3rd-4th injection members 330c and 330d are individually supplied with the purge gas by the 1st-1st to 3rd-2nd external supply lines (not shown), and the detailed description thereof will be made hereinafter.

As described above, the first injection member 310, the second injection member 320, and the third injection member 330 are arranged on top of each other in the vertical direction, and are distinguished vertically from each other.

In other words, the 1st-1st and 1st-2nd injection members 310a and 310b, the 2nd-1st and 2nd-2nd injection members 320a and 320b, and the 3rd-1st and 3rd-2nd injection members 330a and 330b, which are disposed on the left and rear left sides of the storage chamber 200, are distinguished vertically from each other, and this vertical distinction is as follows.

Between the 1st-1st and 1st-2nd injection members 310a and 310b and the 2nd-1st and 2nd-2nd injection members 320a and 320b, a second horizontal member 112 is provided, such that the 1st-1st and 1st-2nd injection members 310a and 310b and the 2nd-1st and 2nd-2nd injection members 320a and 320b are distinguished vertically from each other.

Between the 2nd-1st and 2nd-2nd injection members 320a and 320b and the 3rd-1st and 3rd-2nd injection members 330a and 330b, a third horizontal member 113 is provided, such that the 2nd-1st and 2nd-2nd injection members 320a and 320b and the 3rd-1st and 3rd-2nd injection members 330a and 330b are distinguished vertically from each other.

Further, the 1st-3rd and 1st-4th injection members 310c and 310d, the 2nd-3rd and 2nd-4th injection members 320c and 320d, and the 3rd-3rd and 3rd-4th injection members 330c and 330d, which are disposed on the right and rear right sides of the storage chamber 200, are distinguished vertically from each other, and this vertical distinction is as follows.

Between the 1st-3rd and 1st-4th injection members 310c and 310d and the 2nd-3rd and 2nd-4th injection members 320c and 320d, a sixth horizontal member 116 is provided, such that the 1st-3rd and 1st-4th injection members 310c and 310d and the 2nd-3rd and 2nd-4th injection members 320c and 320d are distinguished vertically from each other.

Further, between the 2nd-3rd and 2nd-4th injection members 320c and 320d and the 3rd-3rd and 3rd-4th injection members 330c and 330d, a seventh horizontal member 117 is provided, such that the 2nd-3rd and 2nd-4th injection members 320c and 320d and the 3rd-3rd and 3rd-4th injection members 330c and 330d are distinguished vertically from each other.

Further, between each of the 1st-1st injection member 310a and the 1st-2nd injection member 310b, the 2nd-1st injection member 320a and the 2nd-2nd injection member 320b, and the 3rd-1st injection member 330a and the 3rd-2nd injection member 330b, which are disposed on the left and rear left sides of the storage chamber 200, a second vertical member 122 is provided. Accordingly, the 1st-1st injection member 310a and the 1st-2nd injection member 310b are distinguished horizontally from each other, the 2nd-1st injection member 320a and the 2nd-2nd injection member 320b are distinguished horizontally from each other, and the 3rd-1st injection member 330a and the 3rd-2nd injection member 330b are distinguished horizontally from each other.

Further, between each of the 1st-3rd injection member 310c and the 1st-4th injection member 310d, the 2nd-3rd injection member 320c and the 2nd-4th injection member 320d, and the 3rd-3rd injection member 330c and the 3rd-4th injection member 330d, which are disposed on the right and rear right sides of the storage chamber 200, a fifth vertical member 125 is provided. Accordingly, the 1st-3rd injection member 310c and the 1st-4th injection member 310d are distinguished horizontally from each other, the 2nd-3rd injection member 320c and the 2nd-4th injection member 320d are distinguished horizontally from each other, and the 3rd-3rd injection member 330c and the 3rd-4th injection member 330d are distinguished horizontally from each other.

The inner surfaces of the 1st-1st and 1st-2nd injection members 310a and 310b, the 2nd-1st and 2nd-2nd injection members 320a and 320b, and the 3rd-1st and 3rd-2nd injection members 330a and 330b are constituted by a first injection member inner wall surface 340; and the outer surfaces of the 1st-1st and 1st-2nd injection members 310a and 310b, the 2nd-1st and 2nd-2nd injection members 320a and 320b, and the 3rd-1st and 3rd-2nd injection members 330a and 330b are constituted by a first injection member outer wall surface 361.

In this case, the first injection member inner wall surface 340 is provided between the storage chamber 200, and the 1st-1st and 1st-2nd injection members 310a and 310b, the 2nd-1st and 2nd-2nd injection members 320a and 320b, and the 3rd-1st and 3rd-2nd injection members 330a and 330b.

Accordingly, the first injection member inner wall surface 340 constitutes the inner surfaces of the 1st-1st and 1st-2nd injection members 310a and 310b, the 2nd-1st and 2nd-2nd injection members 320a and 320b, and the 3rd-1st and 3rd-2nd injection members 330a and 330b, and constitutes the outer surface (or the circumferential surface) of the storage chamber 200, simultaneously. In other words, the 1st-1st and 1st-2nd injection members 310a and 310b, the 2nd-1st and 2nd-2nd injection members 320a and 320b, and the 3rd-1st and 3rd-2nd injection members 330a and 330b are in contact with the left and rear left sides of the storage chamber 200 by the first injection member inner wall surface 340.

The first injection member outer wall surface 361 is provided spaced from the first injection member inner wall surface 340 in a direction opposite to the storage chamber 200, and a gap is provided between the first injection member inner wall surface 340 and the first injection member outer wall surface 361.

Accordingly, each of the 1st-1st and 1st-2nd injection members 310a and 310b, the 2nd-1st and 2nd-2nd injection members 320a and 320b, and the 3rd-1st and 3rd-2nd injection members 330a and 330b is defined by the gap between the first injection member inner wall surface 340 and the first injection member outer wall surface 361.

The inner surfaces of the 1st-3rd and 1st-4th injection members 310c and 310d, the 2nd-3rd and 2nd-4th injection members 320c and 320d, and the 3rd-3rd and 3rd-4th injection members 330c and 330d are constituted by a second injection member inner wall surface 350; and the outer surfaces of the 1st-3rd and 1st-4th injection members 310c and 310d, the 2nd-3rd and 2nd-4th injection members 320c and 320d, and the 3rd-3rd and 3rd-4th injection members 330c and 330d are constituted by a second injection member outer wall surface 362.

In this case, the second injection member inner wall surface 350 is provided between the storage chamber 200, and the 1st-3rd and 1st-4th injection members 310c and 310d, the 2nd-3rd and 2nd-4th injection members 320c and 320d, and the 3rd-3rd and 3rd-4th injection members 330c and 330d.

Accordingly, the second injection member inner wall surface 350 constitutes the inner surfaces of the 1st-3rd and 1st-4th injection members 310c and 310d, the 2nd-3rd and 2nd-4th injection members 320c and 320d, and the 3rd-3rd and 3rd-4th injection members 330c and 330d, and constitutes the outer surface (or the circumferential surface) of the storage chamber 200, simultaneously. In other words, the 1st-3rd and 1st-4th injection members 310c and 310d, the 2nd-3rd and 2nd-4th injection members 320c and 320d, and the 3rd-3rd and 3rd-4th injection members 330c and 330d are in contact with the right and rear right sides of the storage chamber 200 by the second injection member inner wall surface 350.

The second injection member outer wall surface 362 is provided spaced from the second injection member inner wall surface 350 in the direction opposite to the storage chamber 200, and a gap is provided between the second injection member inner wall surface 350 and the second injection member outer wall surface 362.

Accordingly, each of the 1st-3rd and 1st-4th injection members 310c and 310d, the 2nd-3rd and 2nd-4th injection members 320c and 320d, and the 3rd-3rd and 3rd-4th injection members 330c and 330d is defined by the gap between the second injection member inner wall surface 350 and the second injection member outer wall surface 362.

The above described 1st-1st to 3rd-4th injection members 310a to 330d may be provided with a heater (not shown) for controlling the temperature and humidity inside the storage chamber 200.

The heater may be configured such that 1st-1st to 3rd-4th heaters are provided to correspond to the 1st-1st to 3rd-4th injection members 310a to 330d.

The 1st-1st to 3rd-4th heaters may be disposed on the outer surfaces of the first and second injection member outer wall surfaces 361 and 362 to be provided in the outer sides of the 1st-1st to 3rd-4th injection members 310a to 330d.

In this case, to prevent the 1st-1st to 3rd-4th heaters from being exposed to the outside, it is preferable to provide a cover (not shown) at a position spaced outwardly from the first and second injection member outer wall surfaces 361 and 362. Accordingly, the outermost circumferential surface of the container 10 for storing a wafer is constituted by the cover, and the 1st-1st to 3rd-4th heaters are disposed between the first and second injection member outer wall surfaces 361 and 362, and the cover.

It is preferable that the 1st-1st to 3rd-4th heaters are individually controlled, and thus, it is possible to operate only a heater of the 1st-1st to 3rd-4th injection members 310a to 330d to correspond to an injection member injecting the purge gas into the first to third purging areas 210, 220, and 230.

For example, when the 2nd-2nd injection member 320b injects the purge gas into the second purging area 220, the 2nd-2nd heater is operated, thereby heating the purge gas injected into the 2nd-2nd injection member 320b and the second purging area 220 of the storage chamber 200. Accordingly, the purging of the wafer W accommodated in the second purging area 220 can be easily performed, and the humidity inside the second purging area 220 is lowered, and thus, oxidation of the wafer W can be prevented.

As such, individual control of the 1st-1st to 3rd-4th heaters may be performed in conjunction with individual control of the 1st-1st to 3rd-4th injection members 310a to 330d. Accordingly, the temperature and humidity control can be achieved by the heater only in the desired purging area of the first to third purging areas 210, 220, and 230, thereby preventing oxidation of the wafer W with minimal energy (electricity, etc.).

Injection Hole 390

Hereinbelow, reference will be made to the injection holes 390 formed in the first injection member inner wall surface 340 and the second injection member inner wall surface 350.

As shown in FIGS. 3, 5, 8, 10 and 13, the first injection member inner wall surface 340 and the second injection member inner wall surface 350 are formed with a plurality of injection holes 390.

In this case, a plurality of injection holes 390 may be formed in the form of a matrix having rows and columns, and as described above, since the container 10 for storing a wafer according to the preferred embodiment of the present invention is configured to store 30 wafers W and purge the same, it is preferable that the plurality of injection holes 390 has 30 rows.

Further, it is preferable that the plurality of injection holes 390 is disposed above the 30 supports 600, respectively. In other words, as the plurality of injection holes 390 is formed in the first and second injection member inner wall surfaces 340 and 350 such that the plurality of injection holes 390 is disposed at positions above and under the supports 600, the purge gas can be easily injected above the 30 wafers W supported by the 30 supports 600, respectively.

Of the injection holes 390 formed in the first injection member inner wall surface 340, the injection holes 390 disposed at positions corresponding to the height of the first purging area 210 communicate the 1st-1st and 1st-2nd injection members 310a and 310b and the left and rear left sides of the first purging area 210 with each other. Accordingly, the purge gas supplied into the 1st-1st and 1st-2nd injection members 310a and 310b can be injected into the left and rear left sides of the first purging area 210 through the injection holes.

Of the injection holes 390 formed in the first injection member inner wall surface 340, the injection holes 390 disposed at positions corresponding to the height of the second purging area 220 communicate the 2nd-1st and 2nd-2nd injection members 320a and 320b and the left and rear left sides of the second purging area 220 with each other. Accordingly, the purge gas supplied into the 2nd-1st and 2nd-2nd injection members 320a and 320b can be injected into the left and rear left sides of the first purging area 210 through the injection holes.

Of the injection holes 390 formed in the first injection member inner wall surface 340, the injection holes 390 disposed at positions corresponding to the height of the third purging area 230 communicate the 3rd-1st and 3rd-2nd injection members 330a and 330b and the left and rear left sides of third purging area 230 with each other. Accordingly, the purge gas supplied into the 3rd-1st and 3rd-2nd injection members 330a and 330b can be injected into the left and rear left sides of the first purging area 210 through the injection holes.

Of the injection holes 390 formed in the second injection member inner wall surface 350, the injection holes 390 disposed at positions corresponding to the height of the first purging area 210 communicate the 1st-3rd and 1st-4th injection members 310c and 310d and the right and rear right sides of the first purging area 210 with each other. Accordingly, the purge gas supplied into the 1st-3rd and 1st-4th injection members 310c and 310d can be injected into the right and rear right sides of the first purging area 210 through the injection holes.

Of the injection holes 390 formed in the second injection member inner wall surface 350, the injection holes 390 disposed at positions corresponding to the height of the second purging area 220 communicate the 2nd-3rd and 2nd-4th injection members 320c and 320d and the right and rear right sides of the second purging area 220 with each other. Accordingly, the purge gas supplied into the 2nd-3rd and 2nd-4th injection members 320c and 320d can be injected into the right and rear right sides of the first purging area 210 through the injection holes.

Of the injection holes 390 formed in the second injection member inner wall surface 350, the injection holes 390 disposed at positions corresponding to the height of the third purging area 230 communicate the 3rd-3rd and 3rd-4th injection members 330c and 330d and the right and rear right sides of the third purging area 230 with each other. Accordingly, the purge gas supplied into the 3rd-3rd and 3rd-4th injection members 330c and 330d can be injected into the right and rear right sides of the first purging area 210 through the injection holes.

As such, the 1st-1st to 3rd-4th injection members 310a to 330d inject the purge gas into the first to third purging areas 210, 220, and 230, that is, into the storage chamber 200 through the injection holes formed in the first injection member inner wall surface 340 and the second injection member inner wall surface 350.

In this case, as the predetermined purge gas is supplied into and stored in each of the 1st-1st to 3rd-2nd injection members 310a to 330b, the internal pressure of the purge gas stored in each of the injection members is increased, and by this internal pressure, the purge gas is injected into the first to third purging areas 210, 220, and 230 through the injection holes 390.

As such, as the purge gas is injected from the injection holes 390 of the first injection member inner wall surface 340 and the second injection member inner wall surface 350 constituting the circumferential surface of the storage chamber 200, dead zones can be minimized compared to the conventional art.

To be more specific, in the case of the conventional art, separate injection members provided with injection holes are provided on opposite side surfaces of the storage chamber to inject purge gas, but in the case of the container 10 for storing a wafer according to the preferred embodiment of the present invention, the injection holes 390 are directly formed in the first and second injection member inner wall surfaces 340 and 350 to inject purge gas. Accordingly, by simply forming the injection holes 390 in the first and second injection member inner wall surfaces 340 and 350, the direction of the purge gas injected into the first to third purging areas 210, 220, and 230 can be easily adjusted, and thus, it is possible to easily form an optimal array of the injection holes 390, which minimizes the occurrence of dead zones.

Further, as the injection holes 390 are formed in the first and second injection member inner wall surfaces 340 and 350, it is possible to easily add the number of injection holes 390, and when the number of injection holes 390 is increased and accordingly a plurality of injection holes 390 is closely arranged, it is possible to achieve a kind of surface injection effect, in which it seems like that the purge gas is injected from the entire first and second injection member inner wall surfaces 340 and 350 that are the circumferential surface of the storage chamber 200. Accordingly, unlike the conventional art, a uniform injection pressure can be ensured, whereby it is possible to prevent the purge gas from being injected intensively only in a part of the wafer W.

Further, when the injection holes 390 are contaminated and clogged by the fumes as the container 10 for storing a wafer is used for a long time, the problems caused by clogging of the injection holes 390 can be solved by replacing the first and second injection member inner wall surfaces 340 and 350, and thus, easy maintenance of the container 10 for storing a wafer can be achieved.

Further, unlike the above described embodiment, the injection holes 390 may have rows more than 30 in the first and second injection member inner wall surfaces 340 and 350 in the vertical direction. In other words, two or more injection holes 390 may be formed between neighboring supports 600 in the vertical direction instead one injection hole 390 formed therebetween. Accordingly, at one purging area, more than 10 injection holes 390 may be formed, and thus, the purging of the wafer W may be more easily achieved.

Further, the injection holes 390 may be formed to have various shapes such as a rectangular slit shape, a slit shape having an arc at an end, an annular hole shape, a polygonal hole shape, or the like.

1st-1st to 3rd-2nd Supply Holes 371a to 373b and 1st-3rd to 3rd-4th Supply Holes 371c to 373d Hereinbelow, reference will be made to 1st-1st to 3rd-2nd supply holes 371a to 373b formed in the first injection member outer wall surface 361, and 1st-3rd to 3rd-4th supply holes 371c to 373d formed in the second injection member outer wall surface 362.

As shown in FIGS. 6 and 7, the 1st-1st to 3rd-2nd supply holes 371a to 373b are formed in the first injection member outer wall surface 361.

The 1st-1st supply hole 371a communicates the inside of the 1st-1st injection member 310a and a 1st-1st supply space 531a of the first supply member 510 with each other, and thus, the purge gas of the 1st-1st supply space 531a can flow to the inside of the 1st-1st injection member 310a.

The 1st-2nd supply hole 371b communicates the inside of the 1st-2nd injection member 310b and a 1st-2nd supply space 531b of the first supply member 510 with each other, and thus, the purge gas of the 1st-2nd supply space 531b can flow to the inside of the 1st-2nd injection member 310b.

The 2nd-1st supply hole 372a communicates the inside of the 2nd-1st injection member 320a and a 2nd-1st supply space 532a of the first supply member 510 with each other, and thus, the purge gas of the 2nd-1st supply space 532a can flow to the inside of the 2nd-1st injection member 320a.

The 2nd-2nd supply hole 372b communicates the inside of the 2nd-1st injection member 320a and a 2nd-1st supply space 532a of the first supply member 510 with each other, and thus, the purge gas of the 2nd-1st supply space 532a can flow to the inside of the 2nd-1st injection member 320a.

The 3rd-1st supply hole 373a communicates the inside of the 3rd-1st injection member 330a and a 3rd-1st supply space 533a of the first supply member 510 with each other, and thus, the purge gas of the 3rd-1st supply space 533a can flow to the inside of the 3rd-1st injection member 330a.

The 3rd-2nd supply hole 373b communicates the inside of the 3rd-2nd injection member 330b and a 3rd-2nd supply space 533b of the first supply member 510 with each other, and thus, the purge gas of the 3rd-2nd supply space 533b can flow to the inside of the 3rd-2nd injection member 330b.

As shown in FIGS. 11 and 12, the 1st-3rd to 3rd-4th supply holes 371c to 373d are formed in the second injection member outer wall surface 362.

The 1st-3rd supply hole 371c communicates the inside of the 1st-3rd injection member 310c and a 1st-3rd supply space 531c of the second supply member 520 with each other, and thus, the purge gas of the 1st-3rd supply space 531c can flow to the inside of the 1st-3rd injection member 310c.

The 1st-4th supply hole 371d communicates the inside of the 1st-4th injection member 310d and a 1st-4th supply space 531d of the second supply member 520 with each other, and thus, the purge gas of the 1st-4th supply space 531d can flow to the inside of the 1st-4th injection member 310d.

The 2nd-3rd supply hole 372c communicates the inside of the 2nd-3rd injection member 320c and a 2nd-3rd supply space 532c of the second supply member 520 with each other, and thus, the purge gas of the 2nd-3rd supply space 532c can flow to the inside of the 2nd-3rd injection member 320c.

The 2nd-4th supply hole 372d communicates the inside of the 2nd-4th injection member 320d and a 2nd-4th supply space 532d of the second supply member 520 with each other, and thus, the purge gas of the 2nd-4th supply space 532d can flow to the inside of the 2nd-4th injection member 320d.

The 3rd-3rd supply hole 373c communicates the inside of the 3rd-3rd injection member 330c and a 3rd-3rd supply space 533c of the second supply member 520 with each other, and thus, the purge gas of the 3rd-3rd supply space 533c can flow to the inside of the 3rd-3rd injection member 330c.

The 3rd-4th supply hole 373d communicates the inside of the 3rd-4th injection member 330d and a 3rd-4th supply space 533d of the second supply member 520 with each other, and thus, the purge gas of the 3rd-4th supply space 533d can flow to the inside of the 3rd-4th injection member 330d.

The above described 1st-1st to 3rd-4th supply holes 371a to 373d are preferably formed in a slit shape having a vertical length longer than a horizontal length.

Further, it is preferable that the 1st-1st to 3rd-4th supply holes 371a to 373d have horizontal lengths shorter than horizontal lengths of the 1st-1st to 3rd-4th supply spaces 531a to 533d of the first and second supply members communicating with the 1st-1st to 3rd-4th supply holes 371a to 373d, respectively.

When the purge gas flows from the 1st-1st to 3rd-4th supply spaces 531a to 533d to the 1st-1st to 3rd-4th supply holes 371a to 373d, the purge gas flows from the 1st-1st to 3rd-4th supply spaces 531a to 533d having larger widths, to the 1st-1st to 3rd-4th supply holes 371a to 373d having small widths, whereby the injection pressure of the purge gas can be instantaneously increased.

As such, when the injection pressure of the purge gas is instantaneously increased, the purge gas can easily flow to into the entire interior of the 1st-1st to 3rd-4th injection members 310a to 330d, and as a result, the purge gas injected from the 1st-1st to 3rd-4th injection members 310a to 330d can be more easily injected into the entire of the first to third purging areas 210, 220, and 230.

First to Eighth Horizontal Members 111 to 118 and First to Sixth Vertical Members 121 to 126

Hereinbelow, reference will be made to the first to eighth horizontal members 111 to 118 and the first to sixth vertical members 121 to 126.

As shown in FIGS. 2 and 6, the first to fourth horizontal members 111 to 114 and the first to third vertical members 121 to 123 are disposed on the left side of the storage chamber 200.

The first to fourth horizontal members 111 to 114 are connected by the first to third vertical members 121 to 123, and due to this connection structure, the first to fourth horizontal members 111 to 114 and the first to third vertical members 121 to 123 form the framework, that is, the frame of the 1st-1st to 3rd-2nd injection members 310a to 330b.

In this case, each of the first to fourth horizontal members 111 to 114 and the first to third vertical members 121 to 123 may have a predetermined width, and the width is equal to the width of the gap between the first injection member inner wall surface 340 and the first injection member outer wall surface 361. Accordingly, the width of the internal space of the 1st-1st to 3rd-2nd injection members 310a to 330b may be defined by the width.

As shown in FIGS. 2 and 10, the fifth to eighth horizontal members 115 to 118 and the fourth to sixth vertical members 124 to 126 are disposed on the right side of the storage chamber 200.

The fifth to eighth horizontal members 115 to 118 are connected by the fourth to sixth vertical members 124 to 126, and due to this connection structure, the fifth to eighth horizontal members 115 to 118 and the fourth to sixth vertical members 124 to 126 form the framework, that is, the frame of the 1st-3rd to 3rd-4th injection members 310c to 330d.

In this case, each of the fifth to eighth horizontal members 115 to 118 and the fourth to sixth vertical members 124 to 126 may have a predetermined width, and the width is equal to the width of the gap between the second injection member inner wall surface 350 and the second injection member outer wall surface 362. Accordingly, the width of the internal space of the 1st-3rd to 3rd-4th injection members 310c to 330d may be defined by the width.

Exhaust Member 400

Hereinbelow, reference will be made to the exhaust member 400.

As shown in FIGS. 2 to 14, the exhaust member 400 is disposed between the 1st-2nd to 3rd-2nd injection members 310b, 320b, and 330b, and the 1st-4th to 3rd-4th injection members 310d, 320d, and 330d. Accordingly, the exhaust member functions to exhaust the purge gas injected into the storage chamber 200 by the first to third injection members 310, 320, and 330, and the fumes of the wafer W toward the back of the storage chamber 200.

As shown in FIGS. 5, 6, 10, 11, and 17, the inner surface of the exhaust member 400 is constituted by the exhaust member inner wall surface 440.

In this case, the exhaust member inner wall surface 440 is provided between the storage chamber 200 and the exhaust member 400.

Accordingly, the exhaust member inner wall surface 440 constitutes the inner surface of the exhaust member 400 and constitutes the outer surface (or the circumferential surface)

of the storage chamber 200, simultaneously. In other words, the exhaust member 400 is contact with the back of the storage chamber 200 of the exhaust member inner wall surface 440.

The exhaust member inner wall surface 440 is formed with a plurality of exhaust holes 490, and as described above, since the container 10 for storing a wafer according to the preferred embodiment of the present invention accommodates 30 wafers W and purges the same, it is preferable that the exhaust member inner wall surface 440 is formed with 30 exhaust holes 490.

In this case, the 30 exhaust holes 490 are arranged in the vertical direction, and each of the exhaust holes 490 is preferably positioned to have the same height as the row of injection holes 390 described above. In other words, as in the injection holes 390, it is preferable that the exhaust holes 490 are disposed above the 30 supports 600, respectively.

As shown in FIGS. 17 and 18, the exhaust member 400 may include: first to third exhaust spaces 410, 420, and 430 communicating with the exhaust holes 490; and first to third vertical exhaust paths 411, 421, and 431 communicating with the first to third exhaust spaces 410, 420, and 430, respectively.

The first to third exhaust spaces 410, 420, and 430 are arranged such that the first exhaust space 410, the second exhaust space 420, and the third exhaust space 430 are disposed on top of each other in the order from bottom to top inside the exhaust member 400, so as to respectively correspond to the first to third purging areas 210, 220, and 230 vertically divided within the storage chamber 200.

Accordingly, the purge gas injected into the first purging area 210 and the fumes of the wafer W are exhausted through the exhaust holes 490 communicating with the first exhaust space 410, the purge gas injected into the second purging area 220 and the fumes of the wafer W are exhausted through the exhaust holes 490 communicating with the second exhaust space 420, and the purge gas injected into the third purging area 230 and the fumes of the wafer W are exhausted through the exhaust holes 490 communicating with the third exhaust space 430.

In this case, the number of the exhaust holes 490 communicating with the first exhaust space 410 is 10, the number of the exhaust holes 490 communicating with the second exhaust space 420 is 10, and the number of the exhaust holes 490 communicating with the third exhaust space 430 is 10.

Accordingly, the fumes of the 10 wafer W accommodated in the first purging area 210 can be exhausted to the first exhaust space 410 along with the purge gas, the fumes of the 10 wafer W accommodated in the second purging area 220 can be exhausted to the second exhaust space 420 along with the purge gas, and the fumes of the 10 wafer W accommodated in the third purging area 230 can be exhausted to the third exhaust space 430 along with the purge gas.

The first vertical exhaust path 411 vertically extends within the exhaust member 400, and is configured such that a first end thereof communicates with the first exhaust space 410, and a second end thereof communicates with a first exhaust communication hole 815a of a first bottom plate 810 to be described later. Accordingly, the first vertical exhaust path 411 serves as a path for flowing the purge gas exhausted to the first exhaust space 410 to the first exhaust communication hole 815a.

The second vertical exhaust path 421 vertically extends within the exhaust member 400, and is configured such that a first end thereof communicates with the second exhaust space 420, and a second end thereof communicates with a second exhaust communication hole 815b of the first bottom plate 810 to be described later. Accordingly, the second vertical exhaust path 421 serves as a path for flowing the purge gas exhausted to the second exhaust space 420 to the second exhaust communication hole 815b.

The third vertical exhaust path 431 vertically extends within the exhaust member 400, and is configured such that a first end thereof communicates with the third exhaust space 430, and a second end thereof communicates with a third exhaust communication hole 815c of the first bottom plate 810 to be described later. Accordingly, the third vertical exhaust path 431 serves as a path for flowing the purge gas exhausted to the third exhaust space 430 to the third exhaust communication hole 815c.

As such, as the exhaust holes 490 are formed in the exhaust member inner wall surface 440 of the exhaust member 400 constituting the circumferential surface of the storage chamber 200 such that the purge gas and the fumes of the wafer W are exhausted through the exhaust holes 490, maintenance of the container 10 for storing a wafer is easy. In other words, when the exhaust holes 490 are contaminated and clogged by the fumes, the problems caused by clogging of the exhaust holes 490 can be easily solved only by replacing the exhaust member inner wall surface 440.

Further, unlike the above described embodiment, more than 30 exhaust holes 490 may be formed in the exhaust member inner wall surface 440 in the vertical direction. In other words, two or more exhaust holes 490 may be formed between neighboring supports 600 in the vertical direction instead one exhaust hole 490 formed therebetween. Accordingly, at one purging area, more than 10 exhaust holes 490 may be formed, and thus, the exhaust of the fumes generated after the purging of the wafer W can be achieved more easily.

Further, the exhaust holes 490 may be formed to have various shapes such as a rectangular slit shape, a slit shape having an arc at an end, an annular hole shape, a polygonal hole shape, or the like.

Supply Member

Hereinbelow, reference will be made to the supply member.

As shown in FIGS. 2, 5, 6, 10, 11, and 15, the supply member may include: the first supply member 510 provided on the outer side of the 1st-1st to 3rd-2nd injection members 310a to 330b and disposed on the left side based on the storage chamber 200; and the second supply member 520 provided on the outer side of the 1st-3rd to 3rd-4th injection members 310c to 330d and disposed on the right side based on the storage chamber 200.

The first supply member 510 serves to supply the purge gas introduced through the bottom plate 800 to the 1st-1st to 3rd-2nd injection members 310a to 330b, and the second supply member 520 serves to supply the purge gas introduced through the bottom plate 800 to the 1st-3rd to 3rd-4th injection members 310c to 330d.

As shown in FIG. 19, the first supply member 510 is provided with 1st-1st to 3rd-2nd supply spaces 531a to 533b respectively communicating with the 1st-1st to 3rd-2nd supply holes 371a to 373b, and 1st-1st to 3rd-2nd vertical supply paths 541a to 543b respectively communicating with the 1st-1st to 3rd-2nd supply spaces 531a to 533b.

The 1st-1st to 3rd-2nd supply spaces 531a to 533b are the spaces where the purge gas is stored and is supplied to the 1st-1st to 3rd-2nd injection members 310a to 330b through the 1st-1st to 3rd-2nd supply holes 371a to 373b, and are formed by opening the right side surface of the first supply member 510.

The 1st-1st to 3rd-1st supply spaces 531a, 532a, and 533a are formed on the front side with respect to the center line (C1 in FIG. 19) of the first supply member 510, and the 1st-2nd to 3rd-2nd supply spaces 531b, 532b, and 533b are formed on the rear side with respect to the center line (C1 in FIG. 19) of the first supply member 510. In other words, the 1st-1st to 3rd-1st supply spaces 531a, 532a, and 533a, and the 1st-2nd to 3rd-2nd supply spaces 531b, 532b, and 533b are disposed symmetrically with respect to the center line (C1 in FIG. 19) of the first supply member 510.

In order for the 1st-1st to 3rd-2nd supply spaces 531a to 533b to correspond to the 1st-1st to 3rd-2nd supply holes 371a to 373b respectively, the 1st-1st supply space 531a and the 1st-2nd supply space 531b, the 2nd-1st supply space 532a and the 2nd-2nd supply space 532b, and the 3rd-1st supply space 533a and the 3rd-2nd supply space 533b are sequentially arranged in the order from the bottom to the top of the first supply member 510.

Further, the size of the supply space is gradually increased in the order of the 1st-1st supply space 531a and the 1st-2nd supply space 531b, the 2nd-1st supply space 532a and the 2nd-2nd supply space 532b, and the 3rd-1st supply space 533a and the 3rd-2nd supply space 533b.

As such, as the size of the supply space is gradually increased toward the upper portion of the first supply member 510, the flow rate of the purge gas flowing into the 3rd-1st supply space 533a and the 3rd-2nd supply space 533b is increased, and thus, a sufficient amount of purge gas can be supplied to the 3rd-1st injection member 330a and the 3rd-2nd injection member 330b.

Accordingly, the 3rd-1st injection member 330a and the 3rd-2nd injection member 330b can inject a sufficient amount of purge gas into the third purging area 230, and it is possible to easily achieve the purging of the wafer W at the third purging area 230 formed at the upper portion of the storage chamber 200.

The 1st-1st to 3rd-2nd vertical supply paths 541a to 543b vertically extend within the first supply member 510, the first ends thereof communicate with the 1st-1st to 3rd-2nd supply spaces 531a to 533b, respectively, and the second ends thereof communicate with 1st-1st to 3rd-2nd supply communication holes 811a to 813b formed in the first bottom plate 810, respectively. Accordingly, the 1st-1st to 3rd-2nd vertical supply paths 541a to 543b serve as paths for flowing the purge gas introduced from the 1st-1st to 3rd-2nd supply communication holes 811a to 813b to the 1st-1st to 3rd-2nd supply spaces 531a to 533b.

In this case, each second end of the 1st-1st to 3rd-2nd vertical supply paths 541a to 543b may be formed in a hole shape opened on the lower surface of the first supply member, thereby easily communicating with the 1st-1st to 3rd-2nd supply communication holes 811a to 813b.

As shown in FIG. 20, the second supply member 520 is provided with 1st-3rd to 3rd-4th supply spaces 531c to 533d respectively communicating with the 1st-3rd to 3rd-4th supply holes 371c to 373d, and 1st-3rd to 3rd-4th vertical supply paths 541c to 543d respectively communicating with the 1st-3rd to 3rd-4th supply spaces 531c to 533d.

The 1st-3rd to 3rd-4th supply spaces 531c to 533d are the spaces where the purge gas is stored and is supplied to the 1st-3rd to 3rd-4th injection members 310c to 330d through the 1st-3rd to 3rd-4th supply holes 371c to 373d, and are formed by opening the left side surface of the second supply member 520.

The 1st-3rd to 3rd-3rd supply spaces 531c, 532c, and 533c are formed on the front side with respect to the center line (C2 in FIG. 20) of the second supply member 520, and the 1st-4th to 3rd-4th supply spaces 531d, 532d, and 533d are formed on the rear side with respect to the center line (C2 in FIG. 20) of the second supply member 520. In other words, the 1st-3rd to 3rd-3rd supply spaces 531c, 532c, and 533c, and the 1st-4th to 3rd-4th supply spaces 531d, 532d, and 533d are disposed symmetrically with respect to the center line (C2 in FIG. 20) of the second supply member 520.

In order for the 1st-3rd to 3rd-4th supply spaces 531c to 533d to correspond to the 1st-3rd to 3rd-4th supply holes 371c to 373d respectively, the 1st-3rd supply space 531c and the 1st-4th supply space 531d, the 2nd-3rd supply space 532c and the 2nd-4th supply space 532d, and the 3rd-3rd supply space 533c and the 3rd-4th supply space 533d are sequentially arranged in the order from the bottom to the top of the second supply member 520.

Further, the size of the supply space is gradually increased in the order of the 1st-3rd supply space 531c and the 1st-4th supply space 531d, the 2nd-3rd supply space 532c and the 2nd-4th supply space 532d, and the 3rd-3rd supply space 533c and the 3rd-4th supply space 533d.

As such, as the size of the supply space is gradually increased toward the upper portion of the second supply member 520, the flow rate of the purge gas flowing into the 3rd-3rd supply space 533c and the 3rd-4th supply space 533d is increased, and thus, a sufficient amount of purge gas can be supplied to the 3rd-3rd injection member 330c and the 3rd-4th injection member 330d.

Accordingly, the 3rd-3rd injection member 330c and the 3rd-4th injection member 330d can inject a sufficient amount of purge gas into the third purging area 230, and it is possible to easily achieve the purging of the wafer W at the third purging area 230 formed at the upper portion of the storage chamber 200.

The 1st-3rd to 3rd-4th vertical supply paths 541c to 543d vertically extend within the second supply member 520, the first ends thereof communicate with the 1st-3rd to 3rd-4th supply spaces 531c to 533d, respectively, and the second ends thereof communicate with 1st-3rd to 3rd-4th supply communication holes 811c to 813d formed in the first bottom plate 810. Accordingly, the 1st-3rd to 3rd-4th vertical supply paths 541c to 543d serve as paths for flowing the purge gas introduced from the 1st-3rd to 3rd-4th supply communication holes 811c to 813d to the 1st-3rd to 3rd-4th supply spaces 531c to 533d.

In this case, each second end of the 1st-3rd to 3rd-4th vertical supply paths 541c to 543d may be formed in a hole shape opened on the lower surface of the second supply member 520, thereby easily communicating with the 1st-3rd to 3rd-4th supply communication holes 811c to 813d.

Due to the above described configuration of the first supply member 510 and the second supply member 520, it is possible to easily supply the purge gas introduced from the bottom plate 800 to the 1st-1st to 3rd-4th injection members 310a to 330d.

As described above, the container 10 for storing a wafer according to the preferred embodiment of the present invention is configured such that the first supply member 510 is disposed on the outer side of the 1st-1st to 3rd-2nd injection members 310a to 330b and supplies the purge gas into the 1st-1st to 3rd-2nd injection members 310a to 330b, and the second supply member 520 is disposed on the outer side of the 1st-3rd to 3rd-4th injection members 310c to 330d and supplies the purge gas into the 1st-3rd to 3rd-4th injection members 310c to 330d.

Accordingly, with only two supply members, the supply of purge gas into 12 injection members can be achieved, and thus, the compact structure of the container 10 for storing a wafer can be achieved.

Support 600

Hereinbelow, reference will be made to the support 600.

As shown in FIGS. 1 to 3, the support 600 serves to support the wafer W stored in the storage chamber 200, and may be provided in plural in the vertical direction within the storage chamber 200. In this case, as the container 10 for storing a wafer according to the preferred embodiment of the present invention purges 30 wafers W, 30 supports 600 are provided.

As shown in FIGS. 21 and 22, the support 600 includes: a rear support part 610; a left support part 620 extending from the left side of the rear support part 610 in the forward direction; and a right support part 630 extending from the right side of the rear support part 610 in the forward direction.

The rear support part 610 functions to support the rear side of the wafer W, and the rear support part 610 is provided with a rear arc portion 611.

The rear arc portion 611 is stepped downwardly from the upper surface of the rear support part 610, and has an arc shape.

In this case, the rear arc portion 611 has an arc shape having a curvature equal to the curvature of the wafer W, and thus, when the rear arc portion 611, a left arc portion 621, and a right arc portion 631 are connected by an imaginary line, a circular shape same as the wafer W is formed.

The rear arc portion 611 is provided with a rear protrusion 612, and the rear protrusion 612 functions to support the rear lower surface of the wafer W.

The left support part 620 is formed by extending from the left side of the rear support part 610 in the forward direction, and functions to support the left side of the wafer W. Further, the left support part 620 is provided with the left arc portion 621.

The left arc portion 621 is stepped downwardly from the upper surface of the left support part 620, and has an arc shape.

In this case, the left arc portion 621 has an arc shape having a curvature equal to the curvature of the wafer W, and thus, when the rear arc portion 611, the left arc portion 621, and the right arc portion 631 are connected by an imaginary line, a circular shape same as the wafer W is formed.

The left arc portion 621 is provided with a left protrusion 622, and the rear protrusion 612 functions to support the right lower surface of the wafer W.

The right support part 630 is formed by extending from the left side of the right support part 630 in the forward direction, and functions to support the right side of the wafer W. Further, the right support part 630 is provided with the right arc portion 631.

The right arc portion 631 is stepped downwardly from the upper surface of the right support part 630, and has an arc shape.

In this case, the right arc portion 631 has an arc shape having a curvature equal to the curvature of the wafer W, and thus, when the rear arc portion 611, the left arc portion 621, and the right arc portion 631 are connected by an imaginary line, a circular shape same as the wafer W is formed.

The right arc portion 631 is provided with a right protrusion 632, and the rear protrusion 612 functions to support the left lower surface of the wafer W.

As such, as the rear protrusion 612, the left protrusion 622, and the right protrusion 632 support rear, left, and right lower surfaces of the wafer W, respectively, the wafer W is supported at three points. Thus, the contact area of the wafer W can be minimized by supporting the wafer W at three points by the three protrusions, thereby preventing the wafer W from being damaged due to the contact of the wafer W.

A left inclined portion 640 may be formed on an outer surface of a portion where the rear support part 610 and the left support part 620 extend.

The left inclined portion 640 is formed to be gradually inclined outwardly from the rear toward the front.

A right inclined portion 650 may be formed on an outer surface of a portion where the rear support part 610 and the right support part 630 extend.

The right inclined portion 650 is also formed to be gradually inclined outwardly from the rear toward the front.

The left and right inclined portions 640 and 650 relate to the compact structure of the container 10 for storing a wafer.

In other words, the left and right sides of the container 10 for storing a wafer are formed with inclined portions similar to the left and right inclined portions 640 and 650, and the left and right inclined portions 640 and 650 are formed in the support 600 to correspond thereto.

These inclined portions function to minimize the area of the container 10 for storing a wafer, which results in a compact structure of the container 10 for storing a wafer.

A left concave portion 660 is formed on an inner surface of a portion where the rear support part 610 and the left support part 620 extend, and a right concave portion 670 is formed on an inner surface of a portion where the rear support part 610 and the right support part 630 extend.

The left concave portion 660 is formed concavely in the backward direction between the rear arc portion 611 and the left arc portion 621.

The right concave portion 670 is formed concavely in the backward direction between the rear arc portion 611 and the right arc portion 631.

These left and right concave portions 660 and 670 function to prevent robot arm fingers (not shown) from coming into contact with the support 600, that is, the inner surface of the rear support part 610 when the wafer W is accommodated in the storage chamber 200 by a robot arm (not shown), and thus, the wafer W can be easily put in and taken out from the storage chamber 200 through the front opening 251 and be supported on the support 600.

Due to the configuration and shape of the support 600 described above, as shown in FIG. 22, when the wafer W is supported on the support 600, the vertical flow of the purge gas inside the storage chamber 200 can be minimized.

To be more specific, when the wafer W is supported at three points by the rear protrusion 612, the left protrusion 622 and the right protrusion 632 formed in the rear arc portion 611, the left arc portion 621, and the right arc portion 631, respectively, the area except the left and right concave portions 660 and 670 of the support 600 is closed by the wafer W. Accordingly, the support 600, by which the wafer W is supported, serves as a kind of partition in the vertical direction within the storage chamber 200, and thus, the vertical flow of the purge gas can be restricted.

Further, even though the areas where the left and right concave portions 660 and 670 are formed on the support 600 are not closed by the wafer W, the purge gas is injected horizontally into the region where the left and right concave portions 660 and 670 are positioned, so the vertical flow of the purge gas can be restricted by the purge gas injected horizontally.

To be more specific, the injection holes 390 of the 1st-2nd injection member 310$b$, the 2nd-2nd injection member 320$b$, and the 3rd-2nd injection member 330b inject the purge gas in the direction where the left concave portion 660 is positioned. Further, the injection holes 390 of the 1st-4th injection member 310d, the 2nd-4th injection member 320d, and the 3rd-4th injection member 330d inject the purge gas in the direction where the right concave portion 670 is positioned.

As such, the injection holes 390 of the first to third injection members 310, 320, and 330 inject the purge gas in the direction where the left and right concave portions 660 are positioned, and in this case, the injected purge gas is injected in the horizontal direction. Accordingly, the purge gas is injected forming a horizontal layer, and flows.

By the flowing purge gas forming a horizontal layer, it is possible to prevent the purge gas from vertically flowing through the left and right concave portions 660 and 670, thereby allowing the support 600 to restrict the vertical flow of the purge gas.

The restriction of the vertical flow of the purge gas by the support 600 allows achieving the individual control of the first to third injection members 310, 320, and 330 described later, more efficiently.

Further, to prevent the robot arm fingers from coming into contact with the support 600, the above described support 600 is described based on the fact that the left and right concave portions 660 and 670 are formed, but depending on the shape of robot arm fingers, the support 600 may be formed without the left and right concave portions 660 and 670. Accordingly, when the wafer W is supported on the support 600, the inner space of the support 600 (the space opened to support the wafer W) is closed by the wafer W, and the above described restriction of the vertical flow of the purge gas can be more effectively achieved.

First Front Exhaust Member 710 and Second Front Exhaust Member 750

Hereinbelow, reference will be made to a first front exhaust member 710 and a second front exhaust member 750.

As shown in FIGS. 1, 2, 5, 6, 10, and 11, first and second front exhaust members 710 and 750 are disposed on opposite sides of the front of the storage chamber 200, respectively, and exhaust external gas, thereby functioning to block external gas from entering the storage chamber 200.

In this case, the external gas refers to all gases, including the outside air.

The first front exhaust member 710 is provided at the front of the 1st-1st to 3rd-1st injection members 310a, 320a, and 330a to be disposed on the front left side of the storage chamber 200.

As shown in FIGS. 23 and 24, the first front exhaust member 710 includes: a first exhaust slit 720; fourth to sixth exhaust spaces 721a, 721b, and 721c communicating with the first exhaust slit 720; and fourth to sixth vertical exhaust paths 731a, 731b, and 731c communicating with the fourth to sixth exhaust spaces 721a, 721b, and 721c, respectively.

The first exhaust slit 720 is formed by opening the right side surface of the first front exhaust member 710. In this case, the first exhaust slit 720 is formed in a slit shape having a vertical length longer than a horizontal length.

The fourth to sixth exhaust spaces 721a, 721b, and 721c communicate with the first exhaust slit 720, and are formed inside the first front exhaust member 710 to correspond to the first to third purging areas 210, 220, and 230. Accordingly, the fourth exhaust space 721a, the fifth exhaust space 721b, and the sixth exhaust space 721c are sequentially arranged in the order from the bottom to the top of the first front exhaust member 710, and the height of each of the fourth to sixth exhaust spaces 721a, 721b, and 721c is equal to the height of each of the first to third purging areas 210, 220, and 230.

The fourth to sixth vertical exhaust paths 731a, 731b, and 731c are formed by vertically extending within the first front exhaust member 710, wherein first ends thereof communicate with the fourth to sixth exhaust spaces 721a, 721b, and 721c, respectively, and second ends thereof communicate with fourth to sixth exhaust communication holes 816a, 816b, and 816c of the first bottom plate 810, respectively. Accordingly, the fourth to sixth vertical exhaust paths 731a, 731b, and 731c serve as paths for flowing the external gas exhausted through the fourth to sixth exhaust spaces 721a, 721b, and 721c to the fourth to sixth exhaust communication holes 816a, 816b, and 816c.

In this case, each of the second ends of the fourth to sixth vertical exhaust paths 731a, 731b, and 731c may be formed in a hole shape opened on the lower surface of the first front exhaust member 710, thereby easily communicating with the fourth to sixth exhaust communication holes 816a, 816b, and 816c.

As shown in FIGS. 25 and 26, the second front exhaust member 750 includes: a the second exhaust slit 760; seventh to ninth exhaust spaces 761a, 761b, and 761c communicating with the second exhaust slit 720; and seventh to ninth vertical exhaust paths 771a, 771b, and 771c communicating with the seventh to ninth exhaust spaces 721a, 721b, and 721c, respectively.

The second exhaust slit 760 is formed by opening the left side surface of the second front exhaust member 750. In this case, the second exhaust slit 760 is formed in a slit shape having a vertical length longer than a horizontal length.

The seventh to ninth exhaust spaces 761a, 761b, and 761c communicate with the second exhaust slit 760, and are formed inside the second front exhaust member 750 to correspond to the first to third purging areas 210, 220, and 230. Accordingly, the seventh exhaust space 761a, the eighth exhaust space 761b, and the ninth exhaust space 761c are sequentially arranged in the order from the bottom to the top of the second front exhaust member 750, and the height of each of the seventh to ninth exhaust spaces 761a, 761b, and 761c is equal to the height of each of the first to third purging areas 210, 220, and 230.

The seventh to ninth vertical exhaust paths 771a, 771b, and 771c are formed by vertically extending within the second front exhaust member 750, wherein first ends thereof communicate with the seventh to ninth exhaust spaces 761a, 761b, and 761c, respectively, and second ends thereof communicate with seventh to ninth exhaust communication holes 817a, 817b, and 817c of the first bottom plate 810. Accordingly, the seventh to ninth vertical exhaust paths 771a, 771b, and 771c serve as paths for flowing the external gas exhausted through the seventh to ninth exhaust spaces 761a, 761b, and 761c to the seventh to ninth exhaust communication holes 817a, 817b, and 817c.

In this case, each of the second ends of the seventh to ninth vertical exhaust paths 771a, 771b, and 771c may be formed in a hole shape opened on the lower surface of the second front exhaust member 750, thereby easily communicating with the seventh to ninth exhaust communication holes 817a, 817b, and 817c.

By the above configuration, as shown in FIGS. 9, 14, and 16, the first front exhaust member 710 and the second front exhaust member 750 can exhaust the external gas through the first exhaust slit 720 and the second exhaust slit 760.

Accordingly, it is possible to prevent external gas from entering the storage chamber 200 through the front opening 251, thereby preventing turbulence from occurring when the external gas is mixed with the purge gas injected into the storage chamber 200.

Further, as described above, the first exhaust slit 720 is formed through the right side surface of the first front exhaust member 710 so as to be open from the front of the storage chamber 200 to the right, and the second exhaust slit 760 is formed through the left side surface of the second front exhaust member 750 so as to be open from the front of the storage chamber 200 to the right.

Accordingly, external gas can be easily exhausted in the left and right directions by the first and second front exhaust members 710 and 750, and thus, it is possible to prevent external gas from entering the storage chamber 200 more efficiently.

Further, the first and second front exhaust members 710 and 750 can exhaust the purge gas in the first to third purging areas 210, 220, and 230, as well as the external gas.

In other words, as shown in FIG. 16, of the purge gas injected from the 1st-1st to 3rd-1st injection members 310a, 320a, and 330a, and the 1st-2nd to 3rd-2nd injection members 310b, 320b, and 330b, the purge gas injected in the forward direction can be exhausted by the first and second front exhaust members 710 and 750.

As such, as the first and second front exhaust members 710 and 750 exhaust some of the purge gas injected in the forward direction of the purge gas injected from the 1st-1st to 3rd-1st injection members 310a, 320a, and 330a, and the 1st-2nd to 3rd-2nd injection members 310b, 320b, and 330b, the flow of the purge gas supplied from the first and second supply members 510 and 520 to the 1st-1st to 3rd-1st injection members 310a, 320a, and 330a, and the 1st-2nd to 3rd-2nd injection members 310b, 320b, and 330b is facilitated.

In other words, the flow of the purge gas supplied from the first and second supply members 510 and 520 to the 1st-1st to 3rd-1st injection members 310a, 320a, and 330a, and the 1st-2nd to 3rd-2nd injection members 310b, 320b, and 330b may be relatively weak due to the sizes of the 1st-1st to 3rd-1st injection members 310a, 320a, and 330a, and the 1st-2nd to 3rd-2nd injection members 310b, 320b, and 330b. However, as described above, as the first and second front exhaust members 710 and 750 exhaust the purge gas injected from the 1st-1st to 3rd-1st injection members 310a, 320a, and 330a, and the 1st-2nd to 3rd-2nd injection members 310b, 320b, and 330b, the flow can be smoother.

Accordingly, by the organic connection between the first and second front exhaust members 710 and 750 and the first and second supply members 510 and 520, even if the first and second supply members 510 and 520 are disposed rearward, the flow of the purge gas supplied from the first and second supply members 510 and 520 to the 1st-1st to 3rd-1st injection members 310a, 320a, and 330a, and the 1st-2nd to 3rd-2nd injection members 310b, 320b, and 330b can be smooth.

Further, according to the suction forces of the first and second front exhaust members 710 and 750, the flow of purge gas flowing in the storage chamber 200 can be controlled, and thus, it is possible to prevent the occurrence of dead zones where the fumes of the wafer W are not removed.

In other words, when the suction forces of the first and second front exhaust members 710 and 750 are increased, the purge gas flows from the inside of the storage chamber 200 to the outside of the storage chamber 200, that is, from the rear to the front, and thus, the purge gas can easily flow in the entire area of the wafer W. Accordingly, the removal of fumes of the entire area of the wafer W can be achieved more easily.

In the above, it is described that the fourth to sixth exhaust spaces 721a, 721b, and 721c communicate with one exhaust slit, that is, the first exhaust slit 720, but three slits may be formed to correspond to the heights of the fourth to sixth exhaust spaces 721a, 721b, and 721c, respectively. Accordingly, in this case, the first front exhaust member 710 may more easily achieve selective exhaust of external gases at heights respectively corresponding to the first to third purging areas 210, 220, and 230.

Of course, three slits may be formed to correspond to the heights of the seventh to ninth exhaust spaces 761a, 761b, and 761c, respectively. Accordingly, in this case, the second front exhaust member 750 may more easily achieve selective exhaust of external gases at heights respectively corresponding to the first to third purging areas 210, 220, and 230.

Bottom Plate 800

Hereinbelow, reference will be made to the bottom plate 800.

As shown in FIGS. 1 to 3, as the bottom plate 800 constitutes the bottom surface of the container 10 for storing a wafer, thereby closing the lower portion of the storage chamber 200, and functions to introduce the purge gas supplied from the outside to the container 10 for storing a wafer.

Further, as shown in FIG. 27, the bottom plate 800 may be formed by coupling first to third bottom plates 810, 820, and 830 of the same shape.

In this case, the second bottom plate 820 is coupled to the lower portion of the first bottom plate 810, and the third bottom plate 830 is coupled to the lower portion of the second bottom plate 820.

Further, the lower portion of the third bottom plate 830 is provided with a connection member 850 where an external supply line (not shown) and an external exhaust line (not shown) are connected, and a stand member 860.

In this case, the stand member 860 is provided on the lower surface of the bottom plate 800, that is, front left and front right sides of the lower surface of the third bottom plate 830, and functions to keep the container 10 for storing a wafer in a stable position when placed on a load port, etc.

First Bottom Plate 810

Hereinbelow, reference will be made to the first bottom plate 810.

As shown in FIG. 28, the first bottom plate 810 constitutes the bottom surface of the storage chamber 200, and is provided with 1st-1st to 3rd-4th supply communication holes 811a to 813d, and first to ninth exhaust communication holes 815a, 815b, 815c, 816a, 816b, 816c, 817a, 817b, and 817c formed through the upper and lower surfaces of the first bottom plate 810.

The 1st-1st to 3rd-1st supply communication holes 811a, 812a, and 813a and the 1st-2nd to 3rd-2nd supply communication holes 811b, 812b, and 813b are formed on the rear left side of the first bottom plate 810 so as to correspond to the first supply member 510 disposed on the upper surface of the first bottom plate 810.

The first ends of the 1st-1st to 3rd-1st supply communication holes 811a, 812a, and 813a and the 1st-2nd to 3rd-2nd supply communication holes 811b, 812b, and 813b respectively communicate with the 1st-1st to 3rd-1st supply communication holes 811a, 812a, and 813a and the 1st-2nd to 3rd-2nd supply communication holes 811b, 812b, and 813b of the first supply member 510, and the second ends thereof respectively communicate with the 1st-1st to 3rd-1st supply flow paths 821*a*, 822*a*, and 823*a* and the 1st-2nd to 3rd-2nd supply flow paths 821*b*, 822*b*, and 823*b* of the second bottom plate 820.

The 1st-3rd to 3rd-3rd supply communication holes 811*c*, 812*c*, and 813*c*, and the 1st-4th to 3rd-4th supply communication holes 811*d*, 812*d*, and 813*d* are formed on the rear right side of the first bottom plate 810 so as to correspond to the second supply member 520 disposed on the upper surface of the first bottom plate 810.

The first ends of the 1st-3rd to 3rd-3rd supply communication holes 811*c*, 812*c*, and 813*c* and the 1st-4th to 3rd-4th supply communication holes 811*d*, 812*d*, and 813*d* respectively communicate with the 1st-3rd to 3rd-3rd supply communication holes 811*c*, 812*c*, and 813*c* and the 1st-4th to 3rd-4th supply communication holes 811*d*, 812*d*, and 813*d* of the second supply member 520, and the second ends thereof respectively communicate with 1st-3rd to 3rd-3rd supply flow paths 821*c*, 822*c*, and 823*c* and 1st-4th to 3rd-4th supply flow paths 821*d*, 822*d*, and 823*d* of the second bottom plate 820.

The first to third exhaust communication holes 815*a*, 815*b*, and 815*c* are formed at the rear of the first bottom plate 810 so as to correspond to the exhaust member 400 disposed on the upper surface of the first bottom plate 810.

The first ends of the first to third exhaust communication holes 815*a*, 815*b*, and 815*c* respectively communicate with the first to third vertical exhaust paths 411, 421, and 431 of the exhaust member 400, and the second ends thereof communicate with a first rear discharge hole 825 of the second bottom plate 820.

The fourth to sixth exhaust communication holes 816*a*, 816*b*, and 816*c* are formed on the front left side of the first bottom plate 810 so as to correspond to the first front exhaust member 710 disposed on the upper surface of the first bottom plate 810.

The first ends of the fourth to sixth exhaust communication holes 816*a*, 816*b*, and 816*c* respectively communicate with the fourth to sixth vertical exhaust paths 731*a*, 731*b*, and 731*c* of the first front exhaust member 710, and the second ends thereof respectively communicate with the fourth to sixth exhaust flow paths 826*a*, 826*b*, and 826*c* of the second bottom plate 820.

The seventh to ninth exhaust communication holes 817*a*, 817*b*, and 817*c* are formed on the front right side of the first bottom plate 810 so as to correspond to the second front exhaust member 750 disposed on the upper surface of the first bottom plate 810.

The first ends of the seventh to ninth exhaust communication holes 817*a*, 817*b*, and 817*c* respectively communicate with the seventh to ninth vertical exhaust paths 771*a*, 771*b*, and 771*c* of the second front exhaust member 750, and the second ends thereof respectively communicate with the seventh to ninth exhaust flow paths 827*a*, 827*b*, and 827*c* of the second bottom plate 820.

Second Bottom Plate 820

Hereinbelow, reference will be made to the second bottom plate 820.

As shown in FIG. 29, the second bottom plate 820 is coupled to the lower portion of the first bottom plate 810, and is provided with 1st-1st to 3rd-4th supply flow paths 821*a* to 823*d*, the first rear discharge hole 825, and fourth to ninth exhaust flow paths 826*a*, 826*b*, 826*c*, 827*a*, 827*b*, and 827*c* formed through the upper and lower surfaces of the second bottom plate 820.

The 1st-1st to 3rd-2nd supply flow paths 821*a* to 823*b* are formed to extend from the rear left side of the second bottom plate 820 toward the rear center.

The first ends of the 1st-1st to 3rd-2nd supply flow paths 821*a* to 823*b* respectively communicate with the 1st-1st to 3rd-2nd supply communication holes 811*a* to 813*b* of the first bottom plate 810, and the second ends thereof respectively communicate with 1st-1st to 3rd-2nd inlet holes 831*a* to 833*b* of the third bottom plate 830.

The 1st-3rd to 3rd-4th supply flow paths 821*c* to 823*d* are formed to extend from the rear right side of the second bottom plate 820 toward the rear center.

The first ends of the 1st-3rd to 3rd-4th supply flow paths 821*c* to 823*d* respectively communicate with the 1st-3rd to 3rd-4th supply communication holes 811*c* to 813*d* of the first bottom plate 810, and the second ends thereof respectively communicate with 1st-3rd to 3rd-4th inlet holes 831*c* to 833*d* of the third bottom plate 830.

It is preferable that the lengths of the 1st-1st to 3rd-4th supply flow paths 821*a* to 823*d* are configured such that the 2nd-1st to 2nd-4th supply flow paths 822*a* to 822*d* are shorter than the 1st-1st to 1st-4th supply flow paths 821*a* to 821*d*, and the 3rd-1st to 3rd-4th supply flow paths 823*a* to 823*d* are shorter than the 2nd-1st to 2nd-4th supply flow paths 822*a* to 822*d*.

As such, as the length of the supply flow path for supplying purge gas to the third injection member 330 is formed to be shorter than the length of the supply flow path for supplying purge gas to the first injection member 310 and the second injection member 320, a sufficient amount of purge gas can be injected into the third purging area 230 formed at the upper portion of the storage chamber 200.

As such, by adjusting the length of supply flow path, a sufficient amount of purge gas can be supplied to the injection member disposed at the upper portion, and thus, a uniform amount of purge gas can be injected into each of the first to third purging areas 210, 220, and 230.

The first rear discharge hole 825 is formed at the rear of the second bottom plate 820.

The first rear discharge hole 825 is configured such that an upper portion thereof communicates with the first to third exhaust communication holes 815*a*, 815*b*, and 815*c* of the first bottom plate 810, and a lower portion thereof communicates with a second rear exhaust hole 490 of the third bottom plate 830.

The fourth to sixth exhaust flow paths 826*a*, 826*b*, and 826*c* are formed to extend from the front left side of the second bottom plate 820 toward the front center.

The first ends of the fourth to sixth exhaust flow paths 826*a*, 826*b*, and 826*c* respectively communicate with the fourth to sixth exhaust communication holes 816*a*, 816*b*, and 816*c* of the first bottom plate 810, and the second ends thereof respectively communicate with fourth to sixth discharge holes 836*a*, 836*b*, and 836*c* of the third bottom plate 830.

The seventh to ninth exhaust flow paths 827*a*, 827*b*, and 827*c* are formed to extend from the front right side of the second bottom plate 820 toward the front center.

The first ends of the seventh to ninth exhaust flow paths 827*a*, 827*b*, and 827*c* respectively communicate with the seventh to ninth exhaust communication holes 817*a*, 817*b*, and 817*c* of the first bottom plate 810, and the second ends thereof respectively communicate with seventh to ninth discharge holes 837*a*, 837*b*, and 837*c* of the third bottom plate 830.

It is preferable that the lengths of the fourth to ninth exhaust flow paths 826*a*, 826*b*, 826*c*, 827*a*, 827*b*, and 827*c* are configured such that the fifth exhaust flow path 826*b* and the eighth exhaust flow path 827*b* are formed to be shorter than the fourth exhaust flow path 826*a* and the seventh exhaust flow path 827a, and the sixth exhaust flow path 826c and the ninth exhaust flow path 827c are formed to be shorter than the fifth exhaust flow path 826b and the eighth exhaust flow path 827b.

As such, as the length of the exhaust flow path for exhausting external gas through the sixth exhaust space 721c of the first front exhaust member 710 and the ninth exhaust space 761c of the second front exhaust member 750 is formed to be shorter than the length of the exhaust flow path for exhausting external gas through the fourth exhaust space 721a, fifth exhaust space 721b of the first front exhaust member 710 and the seventh exhaust space 761a, eighth exhaust space 761b of the second front exhaust member 750, the exhaust resistances of the first and second front exhaust members 710 and 750 can be made equal to each other.

To be more specific, based on the first front exhaust member 710, when the length of the flow path is defined as "fourth vertical exhaust path 731a+fourth exhaust flow path 826a=fifth vertical exhaust path 731b+the fifth exhaust flow path 826b=sixth vertical exhaust path 731c+the sixth exhaust flow path 826c", the exhaust resistances of the fourth to sixth exhaust spaces 721a, 721b, and 721c of the first front exhaust member 710 can be formed to be equal to each other, whereby it is possible to achieve uniform exhaust to the fourth to sixth exhaust spaces 721a, 721b, and 721c.

Further, based on the second front exhaust member 750, when the length of the flow path is defined as "seventh vertical exhaust path 771a+the seventh exhaust flow path 827a=eighth vertical exhaust path 771b+the eighth exhaust flow path 827b=ninth vertical exhaust path 771c+the ninth exhaust flow path 827c", the exhaust resistances of the seventh to ninth exhaust spaces 761a, 761b, and 761c of the second front exhaust member 750 can be formed to be equal to each other, whereby it is possible to achieve uniform exhaust to the seventh to ninth exhaust spaces 761a, 761b, and 761c.

Third Bottom Plate 830

Hereinbelow, reference will be made to the third bottom plate 830.

As shown in FIG. 30, the third bottom plate 830 is coupled to the lower portion of the second bottom plate 820, and is provided with 1st-1st to 3rd-4th inlet holes 831a to 833d, a second rear discharge hole 835, and fourth to ninth discharge holes 836a, 836b, 836c, 837a, 837b, and 837c formed through the upper and lower surfaces of the third bottom plate 830.

The 1st-1st to 3rd-1st inlet holes 831a, 832a, and 833a and the 1st-2nd to 3rd-2nd inlet holes 831b, 832b, and 833b are formed at the rear center of the third bottom plate 830 to be arranged in the front-to-back direction.

The 1st-3rd to 3rd-3rd inlet holes 831c, 832c, and 833c and the 1st-4th to 3rd-4th inlet holes 831d, 832d, and 833d are arranged at the rear center of the third bottom plate 830 in the front-to-back direction to be symmetrical with the 1st-1st to 3rd-1st inlet holes 831a, 832a, and 833a and the 1st-2nd to 3rd-2nd inlet holes 831b, 832b, and 833b with respect to the center line of the third bottom plate 830.

The upper portions of the 1st-1st to 3rd-4th inlet holes 831a to 833d respectively communicate with the 1st-1st to 3rd-4th supply flow paths 821a to 823d of the second bottom plate 820.

The 1st-1st and 1st-3rd inlet holes 831a and 831c communicate with a 1st-1st main inlet hole 851a of the connection member 850, the 2nd-1st and 2nd-3rd inlet holes 832a and 832c communicate with a 2nd-1st main inlet hole 852a of the connection member 850, and the 3rd-1st and 3rd-3rd inlet holes 833a and 833c communicate with a 3rd-1st main inlet hole 853a of the connection member 850.

The 1st-2nd and 1st-4th inlet holes 831b and 831d communicate with a 1st-2nd main inlet hole 851b of the connection member 850, the 2nd-2nd and 2nd-4th inlet holes 832b and 832d communicate with a 2nd-2nd main inlet hole 852b of the connection member 850, and the 3rd-2nd and 3rd-4th inlet holes 833b and 833d communicate with a 3rd-2nd main inlet hole 853b of the connection member 850.

The second rear discharge hole 835 is formed at the rear of the third bottom plate 830 through the upper and lower surfaces of the second bottom plate 820 so as to communicate with the first rear discharge hole 825 of the second bottom plate 820.

The second rear discharge hole 835 is configured such that a first end thereof communicates with the first rear discharge hole 825, and a second end thereof communicates with an integrated exhaust path 855 of the connection member 850.

The fourth to ninth discharge holes 836a, 836b, 836c, 837a, 837b, and 837c are formed through the upper and lower surfaces of the second bottom plate 820 at the center of the second bottom plate 820 so as to be positioned ahead of the 1st-1st to 3rd-4th inlet holes 831a to 833d.

The first ends of the fourth to ninth discharge holes 836a, 836b, 836c, 837a, 837b, and 837c respectively communicate with the fourth to ninth exhaust flow paths 826a, 826b, 826c, 827a, 827b, and 827c of the second bottom plate 820, and the second ends thereof communicate with the integrated exhaust path 855 of the connection member 850.

As described above, as the first to third bottom plates 810, 820, and 830 are respectively provided with supply/exhaust communication holes, supply/exhaust flow paths, and the like, even if the flow path inside the bottom plate 800 has a complicated shape, it can be easily formed.

Further, when the container 10 for storing a wafer is connected with an external supply/exhaust line by being coupled to a load port or the like, by appropriately forming the above supply/exhaust communication holes, supply/exhaust flow paths, and the like of the first to third bottom plates 810, 820, and 830, it is possible to simplify the supply lines that supply purge gas and the exhaust lines that exhaust the purge gas and the fumes.

Connection Member 850

Hereinbelow, reference will be made to the connection member 850.

As shown in FIG. 27, the connection member 850 is provided at the lower portion of the bottom plate 800, that is, the lower portion of the third bottom plate 830.

The connection member 850 functions to connect 1st-1st to 3rd-2nd external supply lines (not shown) and an external exhaust line (not shown) to the container 10 for storing a wafer.

As shown in FIG. 31, the connection member 850 is formed with 1st-1st to 3rd-2nd main inlet holes 851a to 853b, the integrated exhaust path 855, and a main exhaust hole 490.

The 1st-1st main inlet hole 851a communicates with the 1st-1st and 1st-3rd inlet holes 831a and 831c of the third bottom plate 830, the 2nd-1st main inlet hole 852a communicates with the 2nd-1st and 2nd-3rd inlet holes 832a and 832c of the third bottom plate 830, and the 3rd-1st main inlet hole 853a communicates with the 3rd-1st and 3rd-3rd inlet holes 833a and 833c of the third bottom plate 830.

The 1st-2nd main inlet hole 851b communicates with the 1st-2nd and 1st-4th inlet holes 831b and 831d of the third bottom plate 830, the 2nd-2nd main inlet hole 852b communicates with the 2nd-2nd and 2nd-4th inlet holes 832b and 832*d* of the third bottom plate 830, and the 3rd-2nd main inlet hole 853*b* communicates with the 3rd-2nd and 3rd-4th inlet holes 833*b* and 833*d* of the third bottom plate 830.

The 1st-1st to 3rd-2nd main inlet holes 851*a* to 853*b* are connected with the 1st-1st to 3rd-2nd external supply lines, respectively.

Accordingly, as the 1st-1st to 3rd-2nd external supply lines, that is, six external supply lines are controlled individually, six injection members communicating with the 1st-1st to 3rd-2nd main inlet holes 851*a* to 853*b* can individually inject the purge gas into the first to third purging areas 210, 220, and 230, which will be described in detail hereinafter.

The integrated exhaust path 855 functions as a path for communicating the second rear discharge hole 835 and the fourth to ninth discharge holes 836*a*, 836*b*, 836*c*, 837*a*, 837*b*, and 837*c* of the second bottom plate 820, and the main exhaust hole 490 with each other.

The external exhaust line is connected to the main exhaust hole 490, whereby, the purge gas, the fumes of the wafer W, external gas, and the like exhausted to the integrated exhaust path 855 can be easily discharged outside the container 10 for storing a wafer.

Top Plate 900

As shown in FIGS. 1 to 3, the top plate 900 constitutes the top surface of the container 10 for storing a wafer, and functions to block the upper portion of the storage chamber 200.

In this case, the lower surface of the top plate 900 is coupled to the upper surface of the fourth horizontal member 114, the upper surface of the eighth horizontal member 118, and the upper surface of the exhaust member 400.

The overall shape of the top plate 900 has the same shape as the overall shape of the bottom plate 800.

The top plate 900 may be provided with a wafer detection sensor (not shown) on the lower surface thereof.

The wafer detection sensor can detect whether the wafer W is accommodated and whether the wafer W is supported on any support 600 of the plurality of supports 600.

Purge Gas Supply/Injection Flow of Container 10 for Storing Wafer

Hereinbelow, reference will be made to the purge gas supply/injection flow of the container 10 for storing a wafer according to the preferred embodiment of the present invention.

As shown in FIG. 33, the purge gas supply/injection flow of the container 10 for storing a wafer according to the preferred embodiment of the present invention is performed by the 1st-1st to 3rd-2nd external supply lines connected to the 1st-1st to 3rd-2nd main inlet holes 851*a* to 853*b*.

The 1st-1st external supply line supplies purge gas to the 1st-1st injection member 310*a* and the 1st-3rd injection member 310*c*; and the 1st-2nd external supply line supplies purge gas to the 1st-2nd injection member 310*b* and the 1st-4th injection member 310*d*. Accordingly, by the 1st-1st external supply line and the 1st-2nd external supply line, purge gas is supplied to each of the 1st-1st to 1st-4th injection members 310*a* to 310*d*, and the supplied purge gas is injected from the 1st-1st to 1st-4th injection members 310*a* to 310*d* into the storage chamber 200, whereby the first purging area 210 is partitioned within the storage chamber 200.

The 2nd-1st external supply line supplies purge gas to the 2nd-1st injection member 320*a* and the 2nd-3rd injection member 320*c*; and the 2nd-2nd external supply line supplies purge gas to the 2nd-2nd injection member 320*b* and the 2nd-4th injection member 320*d*. Accordingly, by the 2nd-1st external supply line and the 2nd-2nd external supply line, purge gas is supplied to each of the 2nd-1st to 2nd-4th injection members 320*a* to 320*d*, and the supplied purge gas is injected from the 2nd-1st to 2nd-4th injection members 320*a* to 320*d* into the storage chamber 200, whereby the second purging area 220 is partitioned within the storage chamber 200.

The 3rd-1st external supply line supplies purge gas to the 3rd-1st injection member 330*a* and the 3rd-3rd injection member 330*c*; and the 3rd-2nd external supply line supplies purge gas to the 3rd-2nd injection member 330*b* and the 3rd-4th injection member 330*d*. Accordingly, by the 3rd-1st external supply line and the 3rd-2nd external supply line, purge gas is supplied to each of the 3rd-1st to 3rd-4th injection members 330*a* to 330*d*, and the supplied purge gas is injected from the 3rd-1st to 3rd-4th injection members 330*a* to 330*d* into the storage chamber 200, whereby the third purging area 230 is partitioned within the storage chamber 200.

Hereinbelow, reference will be made in detail to the purge gas supply/injection flow into the first to third purging areas 210, 220, and 230 individually performed by the 1st-1st to 3rd-2nd external supply lines.

Purge Gas Supply/Injection Flow by 1st-1st External Supply Line and 1st-2nd External Supply Line Hereinbelow, description will be made to the purge gas supply/injection flow into the first purging area 210 performed by the 1st-1st external supply line and the 1st-2nd external supply line, with reference to FIGS. 4, 7, 12, 16, 32, and 33.

When purge gas is supplied from the 1st-1st external supply line, the purge gas diverges and flows to the 1st-1st supply flow path 821*a* and the 1st-3rd supply flow path 821*c* by the 1st-1st main inlet hole 851*a* of the connection member 850.

The purge gas flowed to the 1st-1st supply flow path 821*a* flows to the 1st-1st supply communication hole 811*a*, and flows to the 1st-1st vertical supply path 541*a* to the first supply member 510. The purge gas flowed to the 1st-1st vertical supply path 541*a* is supplied to the inside of the 1st-1st injection member 310*a* through the 1st-1st supply space 531*a* and the 1st-1st supply hole 371*a*. The purge gas supplied to the inside of the 1st-1st injection member 310*a* is injected to the left of the first purging area 210 through the injection holes 390.

The purge gas flowed to the 1st-3rd supply flow path 821*c* flows to the 1st-3rd supply communication hole 811*c*, and flows to the 1st-3rd vertical supply path 541*c* of the second supply member 520. The purge gas flowed to the 1st-3rd vertical supply path 541*c* is supplied to the inside of the 1st-3rd injection member 310*c* through the 1st-3rd supply space 531*c* and the 1st-3rd supply hole 371*c*. The purge gas supplied to the inside of the 1st-3rd injection member 310*c* is injected to the right of the first purging area 210 through the injection holes 390.

When purge gas is supplied from the 1st-2nd external supply line, the purge gas diverges and flows to the 1st-2nd supply flow path 821*b* and the 1st-4th supply flow path 821*d* by the 1st-2nd main inlet hole 851*b* of the connection member 850.

The purge gas flowed to the 1st-2nd supply flow path 821*b* flows to the 1st-2nd supply communication hole 811*b*, and flows to the 1st-2nd vertical supply path 541*b* of the first supply member 510. The purge gas flowed to the 1st-2nd vertical supply path 541*b* is supplied to the inside of the 1st-2nd injection member 310*b* through the 1st-2nd supply space 531*b* and the 1st-2nd supply hole 371*b*. The purge gas supplied to the inside of the 1st-2nd injection member 310*b* is injected to the rear left of the first purging area 210 through the injection holes 390.

The purge gas flowed to the 1st-4th supply flow path 821*d* flows to the 1st-4th supply communication hole 811*d*, and flows to the 1st-4th vertical supply path 541*d* of the second supply member 520. The purge gas flowed to the 1st-4th vertical supply path 541*d* is supplied to the inside of the 1st-4th injection member 310*d* through the 1st-4th supply space 531*d* and the 1st-4th supply hole 371*d*. The purge gas supplied to the inside of the 1st-4th injection member 310*d* is injected to the rear right of the first purging area 210 through the injection holes 390.

Purge Gas Supply/Injection Flow by 2nd-1st External Supply Line and 2nd-2nd External Supply Line Hereinbelow, description will be made to the purge gas supply/injection flow into the second purging area 220 performed by the 2nd-1st external supply line and the 2nd-2nd external supply line, with reference to FIGS. 4, 7, 12, 16, 32, and 33.

When purge gas is supplied from the 2nd-1st external supply line, the purge gas diverges and flows to the 2nd-1st supply flow path 822*a* and the 2nd-3rd supply flow path 822*c* by the 2nd-1st main inlet hole 852*a* of the connection member 850.

The purge gas flowed to the 2nd-1st supply flow path 822*a* flows to the 2nd-1st supply communication hole 812*a*, and flows to the 2nd-1st vertical supply path 542*a* of the first supply member 510. The purge gas flowed to the 2nd-1st vertical supply path 542*a* is supplied to the inside of the 2nd-1st injection member 320*a* through the 2nd-1st supply space 532*a* and the 2nd-1st supply hole 372*a*. The purge gas supplied to the inside of the 2nd-1st injection member 320*a* is injected to the right of the second purging area 220 through the injection holes 390.

The purge gas flowed to the 2nd-3rd supply flow path 822*c* flows to the 2nd-3rd supply communication hole 812*c*, and flows to the 2nd-3rd vertical supply path 542*c* of the second supply member 520. The purge gas flowed to the 2nd-3rd vertical supply path 542*c* is supplied to the inside of the 2nd-3rd injection member 320*c* through the 2nd-3rd supply space 532*c* and the 2nd-3rd supply hole 372*c*. The purge gas supplied to the inside of the 2nd-3rd injection member 320*c* is injected to the right of the second purging area 220 through the injection holes 390.

When purge gas is supplied from the 2nd-2nd external supply line, the purge gas diverges and flows to the 2nd-2nd supply flow path 822*b* and the 2nd-4th supply flow path 822*d* by the 2nd-2nd main inlet hole 852*b* of the connection member 850.

The purge gas flowed to the 2nd-2nd supply flow path 822*b* flows to the 2nd-2nd supply communication hole 812*b*, and flows to the 2nd-2nd vertical supply path 542*b* of the first supply member 510. The purge gas flowed to the 2nd-2nd vertical supply path 542*b* is supplied to the inside of the 2nd-2nd injection member 320*b* through the 2nd-2nd supply space 532*b* and the 2nd-2nd supply hole 372*b*. The purge gas supplied to the inside of the 2nd-2nd injection member 320*b* is injected to the rear left of the second purging area 220 through the injection holes 390.

The purge gas flowed to the 2nd-4th supply flow path 822*d* flows to the 2nd-4th supply communication hole 812*d*, and flows to the 2nd-4th vertical supply path 542*d* of the second supply member 520. The purge gas flowed to the 2nd-4th vertical supply path 542*d* is supplied to the inside of the 2nd-4th injection member 320*d* through the 2nd-4th supply space 532*d* and the 2nd-4th supply hole 372*d*. The purge gas supplied to the inside of the 2nd-4th injection member 320*d* is injected to the rear right of the second purging area 220 through the injection holes 390.

Purge Gas Supply/Injection Flow by 3rd-1st External Supply Line and 3rd-2nd External Supply Line Hereinbelow, description will be made to the purge gas supply/injection flow into the third purging area 230 performed by the 3rd-1st external supply line and the 3rd-2nd external supply line, with reference to FIGS. 4, 7, 12, 16, 32, and 33.

When purge gas is supplied from the 3rd-1st external supply line, the purge gas diverges and flows to the 3rd-1st supply flow path 823*a* and the 3rd-3rd supply flow path 823*c* by the 3rd-1st main inlet hole 853*a* to the connection member 850.

The purge gas flowed to the 3rd-1st supply flow path 823*a* flows to the 3rd-1st supply communication hole 813*a*, and flows to the 3rd-1st vertical supply path 543*a* of the first supply member 510. The purge gas flowed to the 3rd-1st vertical supply path 543*a* is supplied to the inside of the 3rd-1st injection member 330*a* through the 3rd-1st supply space 533*a* and the 3rd-1st supply hole 373*a*. The purge gas supplied to the inside of the 3rd-1st injection member 330*a* is injected to the right of the third purging area 230 through the injection holes 390.

The purge gas flowed to the 3rd-3rd supply flow path 823*c* flows to the 3rd-3rd supply communication hole 813*c*, and flows to the 3rd-3rd vertical supply path 543*c* of the second supply member 520. The purge gas flowed to the 3rd-3rd vertical supply path 543*c* is supplied to the inside of the 3rd-3rd injection member 330*c* through the 3rd-3rd supply space 533*c* and the 3rd-3rd supply hole 373*c*. The purge gas supplied to the inside of the 3rd-3rd injection member 330*c* is injected to the right of the third purging area 230 through the injection holes 390.

When purge gas is supplied from the 3rd-2nd external supply line, the purge gas diverges and flows to the 3rd-2nd supply flow path 823*b* and the 3rd-4th supply flow path 823*d* by the 3rd-2nd main inlet hole 853*b* of the connection member 850.

The purge gas flowed to the 3rd-2nd supply flow path 823*b* flows to the 3rd-2nd supply communication hole 813*b*, and flows to the 3rd-2nd vertical supply path 543*b* of the first supply member 510. The purge gas flowed to the 3rd-2nd vertical supply path 543*b* is supplied to the inside of the 3rd-2nd injection member 330*b* through the 3rd-2nd supply space 533*b* and the 3rd-2nd supply hole 373*b*. The purge gas supplied to the inside of the 3rd-2nd injection member 330*b* is injected to the rear left of the third purging area 230 through the injection holes 390.

The purge gas flowed to the 3rd-4th supply flow path 823*d* flows to the 3rd-4th supply communication hole 813*d*, and flows to the 3rd-4th vertical supply path 543*d* of the second supply member 520. The purge gas flowed to the 3rd-4th vertical supply path 543*d* is supplied to the inside of the 3rd-4th injection member 330*d* through the 3rd-4th supply space 533*d* and the 3rd-4th supply hole 373*d*. The purge gas supplied to the inside of the 3rd-4th injection member 330*d* is injected to the rear right of the third purging area 230 through the injection holes 390.

As described above, the container 10 for storing a wafer according to the preferred embodiment of the present invention is configured such that the 1st-1st and 1st-3rd injection members 310*a* and 310*c*, the 1st-2nd and 1st-4th injection members 310*b* and 310*d*, the 2nd-1st and 2nd-3rd injection members 320*a* and 320*c*, the 2nd-2nd and 2nd-4th injection members 320*b* and 320*d*, the 3rd-1st and 3rd-3rd injection members 330a and 330c, and the 3rd-2nd and 3rd-4th injection members 330b and 330d are individually supplied with purge gas by the 1st-1st to 3rd-2nd external supply lines, whereby it is possible to achieve purge gas injection into the first to third purging areas 210, 220, and 230.

Accordingly, by controlling the purge gas supply of the 1st-1st to 3rd-2nd external supply lines, it is possible to selectively inject purge gas into a desired area of the first to third purging areas 210, 220, and 230.

For example, when the robot arm stores wafers W only in supports 600 located in the second purging area 220, purge gas is supplied from the 2nd-1st external supply line and/or the 2nd-2nd external supply line such the purge gas is injected only into the second purging area 220, whereby it is possible to achieve purging of the wafer W located in the second purging area 220. Accordingly, unlike the conventional art, unnecessary waste of purge gas can be reduced.

Further, it is possible to ensure uniform purging of the wafer W accommodated in the storage chamber 200.

For example, in the case where each of the 1st-1st to 3rd-2nd external supply lines is provided with a mass flow controller (MFC), when the pressure of the purge gas supplied to the 3rd-1st and 3rd-2nd external supply lines is increased by using the MFC, the pressure of the purge gas injected from the inside of the 3rd-1st to 3rd-4th injection members 330a to 330d into the third purging area 230 through the injection holes 390 is also increased. Accordingly, unlike the conventional art, a sufficient amount of purge gas can be injected into the third purging area 230 disposed at the upper portion within the storage chamber 200, and in this way, it is possible to achieve uniform purging of the wafer W accommodated in the storage chamber 200 by differently setting supply pressures of purge gas supplied from the 1st-1st to 3rd-2nd external supply lines.

Exhaust Flow of Purge Gas, Fumes, and External Gas of Container 10 for Storing Wafer Hereinbelow, description will be made to the exhaust flow of the purge gas, the fumes of the wafer W, and the external gas of the container 10 for storing a wafer according to the preferred embodiment of the present invention.

As shown in FIG. 34, the exhaust flow of the purge gas, the fumes of the wafer W, and the external gas of the container 10 for storing a wafer according to the preferred embodiment of the present invention is performed by the external exhaust line (not shown) connected to the main exhaust hole 857.

The exhaust member 400 functions to exhaust the purge gas injected into the first to third purging areas 210, 220, and 230 by the 1st-1st to 3rd-2nd injection members 310a to 330d, and the fumes of the wafer W; and the first and second front exhaust members 710 and 750 function to exhaust the external gas outside the container 10 for storing a wafer.

Hereinbelow, reference will be made in detail to the exhaust flows of the exhaust member 400 and the first and second front exhaust members 710 and 750.

Exhaust Flow of Purge Gas and Fumes by Exhaust Member 400

Hereinbelow, description will be made to the exhaust flow of the purge gas of the first to third purging areas 210, 220, and 230 and the fumes of the wafer W performed by the exhaust member 400, with reference to FIGS. 9, 14, 16, 32, and 34.

When a suction force is generated in the external exhaust line by a suction fan or the like, the purge gas and the fumes of the wafer W in the first purging area 210 are flowed to the first exhaust space 410 through the exhaust holes 490. The purge gas and the fumes of the wafer W flowed to the first exhaust space 410 are flowed to the first exhaust communication hole 815a through the first vertical exhaust path 411, and are flowed to the integrated exhaust path 855 via the first rear discharge hole 825, and the second rear discharge hole 835. The purge gas and the fumes of the wafer W flowed to the integrated exhaust path 855 are flowed to the main exhaust hole 857, and then are exhausted outside the container 10 for storing a wafer through the external exhaust line.

When a suction force is generated in the external exhaust line by a suction fan or the like, the purge gas and the fumes of the wafer W in the second purging area 220 are flowed to the second exhaust space 420 through the exhaust holes 490. The purge gas and the fumes of the wafer W flowed to the second exhaust space 420 are flowed to the second exhaust communication hole 815b through the second vertical exhaust path 421, and are flowed to the integrated exhaust path 855 via the first rear discharge hole 825, and the second rear discharge hole 835. The purge gas and the fumes of the wafer W flowed to the integrated exhaust path 855 are flowed to the main exhaust hole 857, and then are exhausted outside the container 10 for storing a wafer through the external exhaust line.

When a suction force is generated in the external exhaust line by a suction fan or the like, the purge gas and the fumes of the wafer W in the third purging area 230 are flowed to the third exhaust space 430 through the exhaust holes 490. The purge gas and the fumes of the wafer W flowed to the third exhaust space 430 are flowed to the second exhaust communication hole 815c through the third vertical exhaust path 431, and are flowed to the integrated exhaust path 855 via the first rear discharge hole 825, and the second rear discharge hole 835. The purge gas and the fumes of the wafer W flowed to the integrated exhaust path 855 are flowed to the main exhaust hole 857, and then are exhausted outside the container 10 for storing a wafer through the external exhaust line.

As described above, the purge gas and the fumes of the wafer W exhausted through the exhaust member 400 are exhausted through respective exhaust paths, that is, three exhaust paths, and are collected into one at the first rear discharge holes 825 of the second bottom plate 820 and exhausted.

This is to easily exhaust the purge gas and the fumes of the wafer W through the suction force of one external exhaust line. Accordingly, to selectively exhaust the purge gas and the fumes of the wafer W of the first to third purging areas 210, 220, and 230, it is preferable that the first to third vertical exhaust paths 411, 42, and 431 are provided with valves.

In other words, each of the first to third vertical exhaust paths 411, 42, and 431 may be provided with a valve such as a solenoid valve, and by controlling the solenoid valve, it is possible to easily achieve selective exhaust of the purge gas and the fumes of the wafer W of the first to third purging areas 210, 220, and 230. Accordingly, when purge gas is selectively injected from the 1st-1st to 3rd-2nd injection members 310a to 330d into the first to third purging areas 210, 220, and 230, at only the purging area where the purge gas is injected of the first to third purging areas 210, 220, and 230, the purge gas and the fumes of the wafer W can be exhausted.

As such, as purge gas injection into the first to third purging areas 210, 220, and 230, and exhaust of purge gas and fumes are controlled to be selectively performed, it is possible to further ensure uniform purging of the wafer W, and is also possible to considerably reduce unnecessary waste of purge gas.

Further, unlike the above described embodiment, the exhaust member 400 may function to inject purge gas by being connected to the external supply line, and in this case, it is possible to selectively inject purge gas into each rear of the first to third purging areas 210, 220, and 230.

Exhaust Flow of External Gas by First Front Exhaust Members 710 and 750

Hereinbelow, description will be made to the exhaust flow of external gas exhausted by the first and second front exhaust members 710 and 750, with reference to FIGS. 9, 14, 16, 32, and 34.

When a suction force is generated in the external exhaust line by a suction fan or the like, external gas outside the front left side of the container 10 for storing a wafer is flowed to the fourth to sixth exhaust spaces 721a, 721b, and 721c through the first exhaust slit 720 of the first front exhaust member 710.

The external gas flowed to the fourth exhaust space 721a is flowed to the fourth exhaust communication hole 816a through the fourth vertical exhaust path 731a, and is flowed to the integrated exhaust path 855 via the fourth exhaust flow path 826a and the fourth discharge hole 836a. The external gas flowed to the integrated exhaust path 855 is flowed to the main exhaust hole 857, and then is exhausted outside the container 10 for storing a wafer through the external exhaust line.

The external gas flowed to the fifth exhaust space 721b is flowed to the fifth exhaust communication hole 816b through the fifth vertical exhaust path 731b, and is flowed to the integrated exhaust path 855 via the fifth exhaust flow path 826b and the fifth discharge hole 836b. The external gas flowed to the integrated exhaust path 855 is flowed to the main exhaust hole 857, and then is exhausted outside the container 10 for storing a wafer through the external exhaust line.

The external gas flowed to the sixth exhaust space 721c is flowed to the sixth exhaust communication hole 816c through the sixth vertical exhaust path 731c, and is flowed to the integrated exhaust path 855 via the fifth exhaust flow path 826c and the fifth discharge hole 836c. The external gas flowed to the integrated exhaust path 855 is flowed to the main exhaust hole 857, and then is exhausted outside the container 10 for storing a wafer through the external exhaust line.

When a suction force is generated in the external exhaust line by a suction fan or the like, external gas outside the front right side of the container 10 for storing a wafer is flowed to the seventh to ninth exhaust spaces 761a, 761b, and 761c through the second exhaust slit 760 of the second front exhaust member 750.

The external gas flowed to the seventh exhaust space 761a is flowed to the seventh exhaust communication hole 817a through the seventh vertical exhaust path 771, and is flowed to the integrated exhaust path 855 via the seventh exhaust flow path 827a and the seventh discharge hole 837a. The external gas flowed to the integrated exhaust path 855 is flowed to the main exhaust hole 857, and then is exhausted outside the container 10 for storing a wafer through the external exhaust line.

The external gas flowed to the eighth exhaust space 761b is flowed to the eighth exhaust communication hole 817b through the eighth vertical exhaust path 771b, and is flowed to the integrated exhaust path 855 via the eighth exhaust flow path 827b and the eighth discharge hole 837b. The external gas flowed to the integrated exhaust path 855 is flowed to the main exhaust hole 857, and then is exhausted outside the container 10 for storing a wafer through the external exhaust line.

The external gas flowed to the ninth exhaust space 761c is flowed to the ninth exhaust communication hole 817c through the ninth vertical exhaust path 771c, and is flowed to the integrated exhaust path 855 via the ninth exhaust flow path 827c and the ninth discharge hole 837c. The external gas flowed to the integrated exhaust path 855 is flowed to the main exhaust hole 857, and then is exhausted outside the container 10 for storing a wafer through the external exhaust line.

As such, as the first and second front exhaust members 710 and 750 exhaust external gas outside the front left and right sides of the container 10 for storing a wafer, respectively, it is possible to prevent external gas from entering the storage chamber 200 through the front opening 251, and thus, it is possible to prevent purging of the wafer W in the first to third purging areas 210, 220, and 230 from being hindered.

As described above, the external gas exhausted through the first and second front exhaust members 710 and 750 is exhausted through respective exhaust paths, that is, six exhaust paths, and are collected into one at the integrated exhaust path 855 of the connection member 850 and exhausted.

This is to easily exhaust the external gas through the suction force of one external exhaust line. Accordingly, to selectively exhaust external gas at heights corresponding to the first to third purging areas 210, 220, and 230, it is preferable that the fourth to ninth exhaust flow paths 826a, 826b, 826c, 827a, 827b, and 827c are provided with valves.

In other words, each of the fourth to ninth exhaust flow paths 826a, 826b, 826c, 827a, 827b, and 827c may be provided with a valve such as a solenoid valve, and by controlling the solenoid valve, it is possible to easily achieve selective exhaust of external gas at heights corresponding to the first to third purging areas 210, 220, and 230.

Accordingly, as described above, when purge gas is selectively injected into and exhausted from one of the first to third purging areas 210, 220, and 230, it is possible to selectively exhaust external gas corresponding to the height of the selected purging area, whereby it is possible to block external gas from entering the purging area, where the purging is performed, in advance.

Further, unlike the above described embodiment, the first and second front exhaust members 710 and 750 may function to inject purge gas by being connected to the external supply line, and in this case, it is possible to inject purge gas into the outside of the front left and right sides of the container 10 for storing a wafer.

The reason why purge gas is injected through the first and second front exhaust members 710 and 750 is to prevent fumes from remaining in other semiconductor processing equipment located outside the container 10 for storing a wafer and to prevent the contaminated external gas from entering the storage chamber 200 by injecting purge gas when the contamination of the external gas is severe outside the container 10 for storing a wafer (for example, the fumes remain outside the container 10 for storing a wafer).

Although a preferred embodiment of the present invention has been described for illustrative purposes, those skilled in the art will appreciate that various modifications, additions and substitutions are possible, without departing from the scope and spirit of the invention as disclosed in the accompanying claims.

DESCRIPTION OF REFERENCE CHARACTERS
OF IMPORTANT PARTS

10: container for storing a wafer
111~118: first to eighth horizontal members
121~126: first to sixth vertical members
200: storage chamber, 210: first purging area
220: second purging area, 230: third purging area
251: front opening
310: first injection member, 310a~310d: 1st-1st to 1st-4th injection members
320: second injection member, 320a~320d: 2nd-1st to 2nd-4th injection members
330: third injection member, 330a~330d: 3rd-1st to 3rd-4th injection members
340: first injection member inner wall surface,
345: first support coupling part
350: second injection member inner wall surface,
355: second support coupling part
361: first injection member outer wall surface,
362: second injection member outer wall surface
371a~371d: 1st-1st to 1st-4th supply holes
372a~372d: 2nd-1st to 2nd-4th supply holes
373a~373d: 3rd-1st to 3rd-4th supply holes
390: injection hole
400: exhaust member, 410: first exhaust space
411: first vertical exhaust path, 420: second exhaust space
421: second vertical exhaust path, 430: third exhaust space
431: third vertical exhaust path, 440: exhaust member inner wall surface
490: exhaust hole
510: first supply member, 520: second supply member
531a~531d: 1st-1st to 1st-4th supply spaces
532a~532d: 2nd-1st to 2nd-4th supply spaces
533a~533d: 3rd-1st to 3rd-4th supply spaces
541a~541d: 1st-1st to 1st-4th vertical supply paths
542a~542d: 2nd-1st to 2nd-4th vertical supply paths
543a~543d: 3rd-1st to 3rd-4th vertical supply paths
600: support, 610: rear support part
611: rear arc portion, 612: rear protrusion
620: left support part, 621: left arc portion
622: left protrusion, 630: right support part
631: right arc portion, 632: right protrusion
640: left inclined portion, 650: right inclined portion
660: left concave portion, 670: right concave portion
710: first front exhaust member, 720: first exhaust slit
721a~721c: fourth to sixth exhaust spaces
731a~731c: fourth to sixth vertical exhaust paths
750: second front exhaust member, 760: second exhaust slit
761a~761c: seventh to ninth exhaust spaces
771a~771c: seventh to ninth vertical exhaust paths
800: bottom plate, 810: first bottom plate
811a~811d: 1st-1st to 1st-4th supply communication holes
812a~812d: 2nd-1st to 2nd-4th supply communication holes
813a~813d: 3rd-1st to 3rd-4th supply communication holes
815a~815c: first to third exhaust communication holes
816a~816c: fourth to sixth exhaust communication holes
817a~817c: seventh to ninth exhaust communication holes
820: second bottom plate
821a~821d: 1st-1st to 1st-4th supply flow paths
822a~822d: 2nd-1st to 2nd-4th supply flow paths
823a~823d: 3rd-1st to 3rd-4th supply flow paths
825: first rear discharge hole
826a~826c: fourth to sixth exhaust flow paths
827a~827c: seventh to ninth exhaust flow paths
830: third bottom plate
831a~831d: 1st-1st to 1st-4th inlet holes
832a~832d: 2nd-1st to 2nd-4th inlet holes
833a~833d: 3rd-1st to 3rd-4th inlet holes
835: second rear discharge hole
836a~836c: fourth to sixth discharge holes
837a~837c: seventh to ninth discharge holes
850: connection member, 851a: 1st-1st main inlet hole
851b: 1st-2nd main inlet hole, 852a: 2nd-1st main inlet hole
852b: 2nd-2nd main inlet hole, 853a: 3rd-1st main inlet hole
853b: 3rd-2nd main inlet hole, 855: integrated exhaust path
857: main exhaust hole, 860: stand member
900: top plate, W: wafer

The invention claimed is:
1. A container for storing a wafer, the container comprising:
a storage chamber configured such that a wafer is stored therein through a front opening, the storage chamber being divisible into a plurality of purging areas in a vertical direction, the plurality of purging areas being formed to communicate with each other in the storage chamber;
a plurality of injection members configured to inject purge gas into the storage chamber;
an exhaust member configured to exhaust the purge gas and fumes of the storage chamber;
an injection member inner wall surface provided with each of the plurality of injection members in contact with the storage chamber, the injection member inner wall surface being formed with a plurality of injection holes to allow the purge gas to be injected into the storage chamber; and
a supply member provided with a plurality of supply spaces, the plurality of supply spaces being configured to communicate with the plurality of injection members to supply the purge gas to the plurality of injection members, respectively,
wherein the injection members are individually supplied with the purge gas through the plurality of supply spaces, respectively,
wherein the injection members inject the purge gas into the purging areas, respectively,
wherein the exhaust member is provided with an exhaust member inner wall surface in contact with the storage chamber,
wherein the exhaust member inner wall surface is formed with a plurality of exhaust holes to allow the purge gas and the fumes of the storage chamber to be exhausted to the exhaust member,
wherein the exhaust member is provided with a plurality of exhaust spaces communicating with the plurality of exhaust holes and a plurality of vertical exhaust paths communicating with the plurality of exhaust spaces, respectively, and
wherein the plurality of exhaust spaces are arranged on top of another in the vertical direction within the exhaust member to correspond to the plurality of purging areas divided vertically.

2. The container of claim 1, wherein the plurality of injection members is arranged on top of another in the vertical direction to correspond to the plurality of purging areas divided vertically.

3. The container of claim 2, wherein the supply member is provided with a plurality of vertical supply paths extending in vertical directions, and the plurality of vertical supply paths communicates with the plurality of injection members, respectively.

* * * * *